United States Patent
Campos et al.

(10) Patent No.: US 11,120,365 B2
(45) Date of Patent: Sep. 14, 2021

(54) FOR HIERARCHICAL DECOMPOSITION DEEP REINFORCEMENT LEARNING FOR AN ARTIFICIAL INTELLIGENCE MODEL

(71) Applicant: Microsoft Technology Licensing, LLC, Redmond, WA (US)

(72) Inventors: Marcos Campos, Carlsbad, CA (US); Aditya Gudimella, Dublin, CA (US); Ross Story, Berkeley, CA (US); Matineh Shaker, Berkeley, CA (US); Ruofan Kong, El Cerrito, CA (US); Matthew Brown, Berkeley, CA (US); Victor Shnayder, Berkeley, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 525 days.

(21) Appl. No.: 16/009,039

(22) Filed: Jun. 14, 2018

(65) Prior Publication Data

US 2018/0293498 A1    Oct. 11, 2018

Related U.S. Application Data

(63) Continuation-in-part of application No. 15/417,086, filed on Jan. 26, 2017, now Pat. No. 10,803,401.

(Continued)

(51) Int. Cl.
*G06N 20/00* (2019.01)
*G06F 16/951* (2019.01)
(Continued)

(52) U.S. Cl.
CPC .......... *G06N 20/00* (2019.01); *G06F 3/0482* (2013.01); *G06F 8/31* (2013.01); *G06F 8/311* (2013.01);
(Continued)

(58) Field of Classification Search
None
See application file for complete search history.

(56) References Cited

U.S. PATENT DOCUMENTS

| 5,619,618 A | 4/1997 | Bigus |
| 6,449,603 B1 | 9/2002 | Hunter |

(Continued)

FOREIGN PATENT DOCUMENTS

| CN | 101645083 A | 2/2010 |
| CN | 102141991 A | 8/2011 |

(Continued)

OTHER PUBLICATIONS

"Build, Ship, Run Any App, Anywhere", Retrieved From: https://web.archive.org/web/20170120165452/https://www.docker.com/, Retrieved on: Jan. 20, 2017, 7 Pages.

(Continued)

*Primary Examiner* — Kate H Luo
(74) *Attorney, Agent, or Firm* — Alleman Hall Creasman & Tuttle LLP

(57) ABSTRACT

Methods and apparatuses that apply a hierarchical-decomposition reinforcement learning technique to train one or more AI objects as concept nodes composed in a hierarchical graph incorporated into an AI model. The individual sub-tasks of a decomposed task may correspond to its own concept node in the hierarchical graph and are initially trained on how to complete their individual sub-task and then trained on how the all of the individual sub-tasks need to interact with each other in the complex task in order to deliver an end solution to the complex task. Next, during the training, using reward functions focused for solving each individual sub-task and then a separate one or more reward functions focused for solving the end solution of the complex task. In addition, where reasonably possible, conducting the training of the AI objects corresponding to the (Continued)

individual sub-tasks in the complex task, in parallel at the same time.

20 Claims, 22 Drawing Sheets

Related U.S. Application Data

(60) Provisional application No. 62/287,861, filed on Jan. 27, 2016, provisional application No. 62/547,339, filed on Aug. 18, 2017, provisional application No. 62/524,381, filed on Jun. 23, 2017.

(51) Int. Cl.
| | | |
|---|---|---|
| *G06F 16/22* | (2019.01) | |
| *G06F 8/38* | (2018.01) | |
| *G06Q 10/00* | (2012.01) | |
| *G06N 3/10* | (2006.01) | |
| *G06F 30/20* | (2020.01) | |
| *G06F 8/30* | (2018.01) | |
| *G06N 3/08* | (2006.01) | |
| *G06N 3/04* | (2006.01) | |
| *H04L 29/06* | (2006.01) | |
| *G06F 9/451* | (2018.01) | |
| *G06F 3/0482* | (2013.01) | |
| *G06N 3/00* | (2006.01) | |
| *G06N 5/04* | (2006.01) | |
| *G06F 9/48* | (2006.01) | |
| *G06F 15/80* | (2006.01) | |
| *G06K 9/62* | (2006.01) | |
| *G06F 30/333* | (2020.01) | |
| *G06F 40/166* | (2020.01) | |
| *G06F 3/0354* | (2013.01) | |

(52) U.S. Cl.
CPC ............... *G06F 8/38* (2013.01); *G06F 9/451* (2018.02); *G06F 9/4881* (2013.01); *G06F 15/80* (2013.01); *G06F 16/2228* (2019.01); *G06F 16/951* (2019.01); *G06F 30/20* (2020.01); *G06K 9/6257* (2013.01); *G06N 3/008* (2013.01); *G06N 3/04* (2013.01); *G06N 3/0454* (2013.01); *G06N 3/08* (2013.01); *G06N 3/105* (2013.01); *G06N 5/04* (2013.01); *G06Q 10/00* (2013.01); *H04L 67/42* (2013.01); *G06F 3/03543* (2013.01); *G06F 30/333* (2020.01); *G06F 40/166* (2020.01)

(56) References Cited

U.S. PATENT DOCUMENTS

| | | | | |
|---|---|---|---|---|
| 7,386,522 | B1 * | 6/2008 | Bigus | .................... G06N 5/043 |
| | | | | 706/15 |
| 8,442,839 | B2 | 5/2013 | Yen et al. | |
| 8,521,664 | B1 | 8/2013 | Lin et al. | |
| 9,443,192 | B1 | 9/2016 | Cosic | |
| 9,460,088 | B1 | 10/2016 | Sak et al. | |
| 9,524,461 | B1 * | 12/2016 | Huynh | .................... G06N 3/008 |
| 9,558,454 | B2 | 1/2017 | Strassner | |
| 10,586,173 | B2 | 3/2020 | Hammond et al. | |
| 10,800,040 | B1 | 10/2020 | Beckman et al. | |
| 10,990,894 | B2 | 4/2021 | Shaashua et al. | |
| 2003/0004672 | A1 | 1/2003 | Thurman | |
| 2003/0204311 | A1 * | 10/2003 | Bush | ........................ G01V 3/38 |
| | | | | 702/13 |
| 2004/0122788 | A1 * | 6/2004 | Griffith | .................. G06N 5/022 |
| | | | | 706/61 |
| 2004/0255291 | A1 | 12/2004 | Sierer et al. | |
| 2005/0034109 | A1 | 2/2005 | Hamilton et al. | |
| 2005/0114280 | A1 | 5/2005 | Rising, III | |
| 2005/0132032 | A1 | 6/2005 | Bertrand | |
| 2005/0197991 | A1 | 9/2005 | Wray et al. | |
| 2006/0166174 | A1 | 7/2006 | Rowe et al. | |
| 2006/0218107 | A1 | 9/2006 | Young | |
| 2009/0106165 | A1 | 4/2009 | Solomon | |
| 2009/0106178 | A1 | 4/2009 | Chu | |
| 2009/0119587 | A1 * | 5/2009 | Allen | ...................... G09B 5/00 |
| | | | | 715/705 |
| 2009/0204563 | A1 | 8/2009 | Gerber et al. | |
| 2010/0088258 | A1 | 4/2010 | Oaten et al. | |
| 2010/0094790 | A1 | 4/2010 | Gnojewski | |
| 2010/0106714 | A1 | 4/2010 | Lim et al. | |
| 2012/0159090 | A1 | 6/2012 | Andrews et al. | |
| 2012/0209794 | A1 | 8/2012 | Jones, III | |
| 2012/0239598 | A1 | 9/2012 | Cascaval et al. | |
| 2015/0066929 | A1 | 3/2015 | Satzke et al. | |
| 2015/0339570 | A1 * | 11/2015 | Scheffler | .................. G06N 3/04 |
| | | | | 706/16 |
| 2016/0034809 | A1 * | 2/2016 | Trenholm | ................. G06F 8/35 |
| | | | | 706/20 |
| 2016/0283202 | A1 | 9/2016 | Sellers-blais | |
| 2016/0358098 | A1 | 12/2016 | Duesterwald et al. | |
| 2017/0061283 | A1 * | 3/2017 | Rasmussen | ............... G06N 3/10 |
| 2017/0091670 | A1 | 3/2017 | Gulin et al. | |
| 2017/0193361 | A1 * | 7/2017 | Chilimbi | ................ G06N 3/084 |
| 2017/0213126 | A1 | 7/2017 | Hammond et al. | |
| 2017/0213128 | A1 | 7/2017 | Hammond et al. | |
| 2017/0213131 | A1 | 7/2017 | Hammond et al. | |
| 2017/0213132 | A1 | 7/2017 | Hammond et al. | |
| 2017/0213154 | A1 | 7/2017 | Hammond et al. | |
| 2017/0213155 | A1 | 7/2017 | Hammond et al. | |
| 2017/0213156 | A1 | 7/2017 | Hammond et al. | |
| 2017/0262769 | A1 | 9/2017 | Mcshane et al. | |
| 2017/0308800 | A1 | 10/2017 | Cichon et al. | |
| 2018/0060759 | A1 | 3/2018 | Chu et al. | |
| 2018/0191867 | A1 | 7/2018 | Siebel et al. | |
| 2018/0240062 | A1 | 8/2018 | Crabtree et al. | |
| 2018/0293463 | A1 | 10/2018 | Brown | |
| 2018/0293493 | A1 * | 10/2018 | Kalamkar | .................. G06T 1/20 |
| 2018/0293517 | A1 | 10/2018 | Browne et al. | |
| 2018/0307945 | A1 | 10/2018 | Haigh et al. | |
| 2018/0357047 | A1 | 12/2018 | Brown et al. | |
| 2018/0357152 | A1 | 12/2018 | Browne et al. | |
| 2018/0357543 | A1 | 12/2018 | Brown et al. | |
| 2018/0357552 | A1 | 12/2018 | Campos et al. | |
| 2020/0250583 | A1 | 8/2020 | Hammond et al. | |

FOREIGN PATENT DOCUMENTS

| | | |
|---|---|---|
| CN | 102222005 A | 10/2011 |
| CN | 102591654 A | 7/2012 |
| CN | 102707982 A | 10/2012 |
| CN | 104106276 A | 10/2014 |
| CN | 105068661 A | 11/2015 |
| WO | 2015017706 A2 | 2/2015 |

OTHER PUBLICATIONS

"Services Overview", Published by Bonsai AI, Inc, 3 Pages.
"What's the Difference Between an Application, Process, and Services?", Retrieved From: https://superuser.com/questions/209654/whats-the-difference-between-an-application-process-and-services, Retrieved on: Jan. 20, 2017, 1 Page.
Chung, Kiuk, "Generating Recommendations at Amazon Scale With Apache Spark and Amazon DSSTNE", Retrieved From: https://aws.amazon.com/blogs/big-data/generating-recommendations-at-amazon-scale-with-apache-spark-and-amazon-dsstne/, Jul. 9, 2016, 8 Pages.
Dunn, Jeffrey, "Introducing FBLearner Flow: Facebook's AI Backbone", Retrieved From: https://web.archive.org/web/20180717150507/https://code.fb.com/core-data/introducing-fblearner-flow-facebook-s-ai-backbone/, May 9, 2016, 9 Pages.
Gray, Kathryn E.., "Toward Customizable Pedagogic Programming Languages", A dissertation submitted to the faculty of the University of Utah in partial fulfillment of the requirements for the degree

(56) References Cited

OTHER PUBLICATIONS of Doctor of Philosophy in Computer Science, Aug. 2006, 156 Pages.
Hammond, et al., "AI for Everyone: An Introduction to Bonsai Brain and Inkling", In Bonsai AI, Inc. Whitepaper, Jan. 2016, 16 Pages.
He, Jinru, "Auto Scaling Pinterest", Retrieved From: https://web.archive.org/web/20161114182239/https://engineering.pinterest.com/blog/auto-scaling-pinterest, Sep. 16, 2016, 8 Pages.
Ma, Kevin, "Applying Deep Learning to Related Pins", Retrieved From: https://web.archive.org/web/20170214195127/https://engineering.pinterest.com/blog/applying-deep-learning-related-pins, Jan. 12, 2017, 6 Pages.
"International Search Report and Written Opinion Issued in PCT Application No. PCT/US2017/015446", dated Apr. 10, 2017, 6 Pages.
"International Search Report and Written Opinion Issued in PCT Application No. PCT/US2017/015460", dated May 5, 2017, 11 Pages.
"International Search Report and Written Opinion Issued in PCT Application No. PCT/US2017/015470", dated Apr. 21, 2017, 11 Pages.
Raschka, Sebastian, "Fitting a Model via Closed-Form Equations Vs. Gradient Descent Vs Stochastic Gradient Descent Vs Mini-Batch Learning. What Is the Difference?", Retrieved From: https://sebastianraschka.com/faq/docs/closed-form-vs-gd.html, Retrieved From: Jan. 17, 2017, 6 Pages.
Tessler, et al., "A Deep Hierarchical Approach to Lifelong Learning in Minecraft", Retrieved From: https://arxiv.org/pdf/1604.07255.pdf, Nov. 30, 2016, 10 Pages.
"Final Office Action Issued in U.S. Appl. No. 15/416,970", dated Mar. 3, 2020, 7 Pages.
"Final Office Action Issued in U.S. Appl. No. 15/417,086", dated Feb. 25, 2020, 18 Pages.
Campos, et al., "Concept Network Reinforcement Learning for Flexible Dexterous Manipulation", Retrieved From: https://medium.com/@BonsaiAI/concept-network-reinforcement-learning-for-flexible-dexterous-manipulation-47bf459b19b9, Sep. 19, 2017, 11 Pages.
Gudimella, et al., "Deep Reinforcement Learning for Dexterous Manipulation With Concept Networks", Retrieved From: https://arxiv.org/pdf/1709.06977.pdf, Sep. 20, 2017, 16 Pages.
Hengst, Bernhard, "Safe State Abstraction and Reusable Continuing Subtasks in Hierarchical Reinforcement Learning", in Proceedings of 20th Joint Conference on Artificial Intelligence, Dec. 2, 2007, 11 pages.
"International Search Report & Written Opinion Issued in PCT Application No. PCT/US2018/037650", dated Aug. 31, 2018, 10 Pages.
"Non-Final Office Action Issued in U.S. Appl. No. 15/416,970", dated Aug. 4, 2020, 7 Pages.
"Office Action Issued in European Patent Application No. 17745016.0", dated Jul. 13, 2020, 9 Pages.
Lirov, Yuval., "Computer Aided Neural Network Engineering", In the Journal of Neural Networks, vol. 5, Issue 4, Jul. 1992, pp. 711-719.
Perera, et al., "ANNEbot: An Evolutionary Artificial Neural Network Framework", In the Proceedings of 4th International Conference on Intelligent and Advanced Systems, Jun. 12, 2012, pp. 40-45.
"Non Final Office Action Issued in U.S. Appl. No. 15/416,904", dated Aug. 14, 2019, 11 Pages.
"Notice of Allowance Issued in U.S. Appl. No. 15/417,075", dated Aug. 14, 2019, 9 Pages.
"Extended Search Report Issued in European Patent Application No. 17745025.1", dated Aug. 23, 2019, 9 Pages.
"Extended Search Report Issued in European Patent Application No. 17745016.0", dated Aug. 20, 2019, 8 Pages.
"Extended Search Report Issued in European Patent Application No. 17745030.1", dated Sep. 2, 2019, 7 Pages.
"Non Final Office Action Issued in U.S. Appl. No. 15/416,970", dated Nov. 21, 2019, 12 Pages.
"Non Final Office Action Issued in U.S. Appl. No. 15/417,033", dated Nov. 26, 2019, 13 Pages.
"Non Final Office Action Issued in U.S. Appl. No. 15/416,988", dated Oct. 3, 2019, 11 Pages.
"Non Final Office Action Issued in U.S. Appl. No. 15/417,056", dated Oct. 17, 2019, 10 Pages.
"Non Final Office Action Issued in U.S. Appl. No. 15/417,086", dated Nov. 7, 2019, 13 Pages.
Beale, et al., "Neural Network Toolbox 7 User's Guide", Retrieved from http://citeseerx.ist.psu.edu/viewdoc/download?doi=10.1.1.220.1640&rep=rep1&type=pdf, 2010, 951 Pages.
"Summons to Attend Oral Proceedings Issued in European Patent Application No. 17745016.0.", dated Oct. 23, 2020, 7 Pages.
Ciancio, et al., "Heuristic Techniques to Optimize Neural Network Architecture in Manufacturing Applications", In Journal of Neural Computing and Applications, vol. 27, Issue 7, Jul. 31, 2015, pp. 2001-2015.
"Non Final Office Action Issued in U.S. Appl. No. 16/008,751", dated Dec. 1, 2020, 26 Pages.
Luchian, et al., "Automation of the Infrastructure and Services for an OpenStack Deployment using Chef Tool", In IEEE 15th RoEduNet Conference: Networking in Education and Research, Sep. 7, 2016, 5 Pages.
"Notice of Allowance Issued in U.S. Appl. No. 16/009,153", dated Jul. 1, 2021, 11 Pages.
"First Office Action and Search Report Issued in Chinese Patent Application No. 201780020322.4", dated Apr. 2, 2021, 12 Pages.
Arendt, et al., "A Tool Environment for Quality Assurance based on the Eclipse Modeling Framework", In Journal of Automated Software Engineering, vol. 20, Issue 2, Dec. 11, 2012, pp. 141-184.
Yang, et al., "Intelligent Search Engine Based on Knowledge Library", In Journal of Computer and Information Technology, vol. 18, Issue 2, Apr. 30, 2010, pp. 41-44.
"First Office Action and Search Report Issued in Chinese Patent Application No. 201780020323.9", dated May 24, 2021, 21 Pages.

\* cited by examiner

```
                              ┌─ Start ─┐
                                   │
                                   ▼
┌──────────────────────────────────────────────────────────────────────────┐
│ The AI engine applies a hierarchical-decomposition reinforcement learning technique │
│ to train one or more AI objects as concept nodes composed in a hierarchical graph   │
│ incorporated into the AI model.                                               2     │
└──────────────────────────────────────────────────────────────────────────┘
                                   │
                                   ▼
┌──────────────────────────────────────────────────────────────────────────┐
│ The AI engine uses the hierarchical-decomposition reinforcement learning technique to │
│ hierarchically decompose a complex task into multiple smaller, individual sub-tasks   │
│ making up the complex task. One or more of the individual sub-tasks, each             │
│ corresponds to its own concept node in the hierarchical graph. The AI engine initially│
│ trains the AI objects on the individual sub-tasks and then trains on how the individual│
│ sub-tasks need to interact with each other in the complex task in order to deliver an │
│ end solution to the complex task.                                              4     │
└──────────────────────────────────────────────────────────────────────────┘
                                   │
                                   ▼
┌──────────────────────────────────────────────────────────────────────────┐
│ The AI engine uses the hierarchical-decomposition reinforcement learning technique to │
│ hierarchically decompose a complex task into multiple smaller, individual sub-tasks   │
│ making up the complex task. One or more of the individual sub-tasks, each             │
│ corresponds to its own concept node in the hierarchical graph. The AI engine initially│
│ trains the AI objects on the individual sub-tasks and then trains on how the individual│
│ sub-tasks need to interact with each other in the complex task in order to deliver an │
│ end solution to the complex task.                                              6     │
└──────────────────────────────────────────────────────────────────────────┘
                                   │
                                   ▼
┌──────────────────────────────────────────────────────────────────────────┐
│ The AI engine uses information supplied from a user interface to apply the hierarchical-│
│ decomposition reinforcement learning technique to train one or more AI objects.  8    │
└──────────────────────────────────────────────────────────────────────────┘
                                   │
                                   ▼
┌──────────────────────────────────────────────────────────────────────────┐
│ The AI engine automatically partitions the individual sub-tasks into the concept nodes │
│ in the AI model to be trained on in a number of ways, where the ways of conveying the │
│ partitioning of the individual sub-tasks into the concept nodes are selected from a   │
│ group consisting of i) how to partition the individual sub-tasks is explicitly defined in│
│ scripted code from the user, ii) how to partition the individual sub-tasks is hinted at by│
│ giving general guidance in the scripted code from the user, iii) how to partition the │
│ individual sub-tasks is interpreted from guidance based on responses from the user to │
│ a presented list of questions, and iv) any combination of these three, and then the   │
│ architect module proposes a hierarchical structure for the graph of AI objects making │
│ up the AI model.                                                              10      │
└──────────────────────────────────────────────────────────────────────────┘
                                   │
                                   ▼
                              ┌─ Cont. ─┐
```

FIG. 12A

```
                    ( Cont. )
                        │
                        ▼
```
The AI engine instantiates the AI objects corresponding to the concepts of the complex task into the graph of i) a first concept node corresponding to an integrator node and ii) one or more levels of concepts corresponding to the individual sub-tasks that hierarchically stem forth from the integrator node in the graph of the AI model. The AI engine then trains each integrator and its set of child nodes. 12

The AI engine cooperates with one or more data sources to obtain data for training and to conduct the training of the two or more AI objects corresponding to concept nodes in the hierarchical graph, in parallel at the same time. 14

The AI engine causes the AI engine to i) initially train each individual AI object to solve its individual sub-task and its corresponding one or more reward functions focused for solving that sub-task; and then, ii) next using an integrator node to train the set of individual sub-tasks in the complex task to combine the concepts of the individual sub-tasks to cooperate and work with each other to achieve the complex task. The integrator node then has a reward function focused for the end solution to the complex task. 16

An integrator is configured to select a first set of concept nodes from two or more sets in the graph of the complex task to be trained on and computed. 18

The integrator is configured to observe a state of a first data source generator to supply data to train the AI model and then based on any of i) the state of the first data source ii) all of the concept nodes in the first set using similar supplied data to train on, and iii) any combination of both, select the first set of concept nodes from the two or more sets in the graph to receive its input data from the first data source generator. 20

Each integrator node in the graph of nodes is configured to evaluate in turn, based on data from the simulator, which of the nodes in the graph are currently appropriate to solving its sub task, and merely those nodes so chosen will be further provided with data from the simulator and evaluated, which saves an amount of computing power and cycles compared to computing all of the nodes making up the AI model each evaluation cycle. 22

The AI engine trains the AI objects of the AI model include a blend of at least a first set and second set of AI objects being trained by the first module via reinforcement learning and a third set of AI objects that are configured to operate in two ways: 1) as control nodes where one or more actions are produced by the code this node and/or 2) this node just implements a data transformation step, where the first module of the AI engine is configured to manage multiple simulations from the data sources in parallel at the same time to train the first and second sets of AI objects with the reinforcement learning. Also, the first module of the AI engine is configured to manage multiple simulations from the data sources in parallel at the same time to train the first and second sets of AI objects with the reinforcement learning. 24

The AI engine decomposing the complex task allows each concept making up the complex task in the graph to use a most appropriate training approach for that individual sub-task, whether that be a classical motion controller, a pre-existing learned model, or a neural network that needs to be trained rather than the whole AI model being trained with one of these training approaches. 26

The AI engine uses a conductor service to handle scaling of running multiple training sessions for the two or more AI objects in parallel at the same time by dynamically calling in additional computing devices to load on and run additional instances of processes for the first module for each training session occurring in parallel. 28

The AI engine decomposing the complex task allows replacing one or more concepts making up the complex task without retraining each concept in the graph making up that AI model. 30

A combination of parallel training of concepts and the use of reward functions focused for solving each individual sub-task speeds up an overall training duration for the complex task on one or more computing platforms, and subsequent deployment of a resulting AI model that is trained, compared to an end-to-end training with a single algorithm for all of the AI objects incorporated into the AI model. 32

↓
                              ┌─ End ─┐

FIG. 12C

FOR HIERARCHICAL DECOMPOSITION DEEP REINFORCEMENT LEARNING FOR AN ARTIFICIAL INTELLIGENCE MODEL

CROSS-REFERENCE

This application is continuation-in-part of U.S. patent application Ser. No. 15/417,086 titled "An artificial intelligence engine having multiple independent processes on a cloud-based platform configured to scale," filed Jan. 26, 2017, which claims the benefit of U.S. Provisional Application No. 62/287,861, filed Jan. 27, 2016, titled "Bonsai platform, language, and tooling," each of which is incorporated herein by reference in its entirety. This application also claims the benefit under 35 USC 119 of U.S. Provisional Application No. 62/524,381, titled "Systems and methods for extending functionality of trained machine-learning models, filed Jun. 23, 2017, and U.S. Provisional Application No. 62/547,339, titled "An artificial intelligence engine having multiple improvements," filed Aug. 18, 2017, which is also incorporated herein by reference in its entirety.

NOTICE OF COPYRIGHT

A portion of the disclosure of this patent application contains material that is subject to copyright protection. The copyright owner has no objection to the facsimile reproduction by anyone of the material subject to copyright protection as it appears in the United States Patent & Trademark Office's records for this application, but otherwise reserves all copyright rights whatsoever.

FIELD

Embodiments of the design provided herein generally relate to an Artificial Intelligence ("AI") engine using a hierarchical-decomposition deep reinforcement technique to train and assemble an AI model.

BACKGROUND

Deep reinforcement learning yields great results for a large array of problems, but AI models are generally retrained anew for each new problem to be solved. Prior learning and knowledge are difficult to incorporate when training new AI models, requiring increasingly longer training as problems become more complex. This is especially problematic for problems with sparse rewards.

Learning goal-directed skills is a major challenge in reinforcement learning when the environment's feedback is sparse. The difficulty arises from insufficient exploration of the state space by an agent, and results in the agent not learning a robust policy or value function. The problem is further exacerbated in high-dimensional tasks, such as in robotics. Although the integration of non-linear function approximators, such as deep neural networks, with reinforcement learning has made it possible to learn patterns and abstractions over high dimensional spaces (see Silver, D., Huang, A., Maddison, C. J., Guez, A., Sifre, L., Van Den Driessche, G., Schrittwieser, J., Antonoglou, I., Panneershelvam, V., Lanctot, M., et al., 2016. Mastering the game of go with deep neural networks and tree search. Nature 529, 484-489.; as well as Mnih, V., Kavukcuoglu, K., Silver, D., Rusu, A. A., Veness, J., Bellemare, M. G., Graves, A., Riedmiller, M., Fidjeland, A. K., Ostrovski, G., et al., 2015. Human-level control through deep reinforcement learning. Nature 518, 529-533), the problem of exploration in the sparse reward regime is still a significant challenge. Rarely occurring sparse reward signals are difficult for neural networks to model, since the action sequences leading to high reward must be discovered in a much larger pool of low-reward sequences. In addition to the above difficulties, robotics tasks that involve dexterous manipulation of objects have the additional challenge of a trade-off between robustness and flexibility.

In such settings, one natural solution is for the agent to learn, plan, and represent knowledge at different levels of temporal abstractions, so that solving intermediate tasks at the right times helps in achieving the final goal. Sutton et al. [1999] provided a mathematical framework for extending the notion of "actions" in reinforcement learning to "options", which are policies taking a certain action over a period of time, (Sutton, R. S., Precup, D., Singh, S., 1999. Between mdps and semi-mdps: A framework for temporal abstraction in reinforcement learning. Artificial Intelligence 112, 181-211).

Another problem is the total amount of time it takes to train an AI model on a task just to experiment to see if learning that task up to an acceptable level is even possible.

Some approaches have a person scripting code to train an AI model verses a module. Likewise, some approaches have a person scripting code to instantiate AI objects for an AI model.

SUMMARY

In general, methods and apparatuses apply a hierarchical-decomposition reinforcement learning technique to train one or more AI objects as concept nodes composed in a hierarchical graph incorporated into an AI model.

In an embodiment, an AI engine has multiple independent modules to work on one or more computing platforms. The multiple independent modules are configured to have their instructions executed by one or more processors in the one or more computing platforms and any software instructions they may use can be stored in one or more memories of the computing platforms. The AI engine has a user interface presented on a display screen for use by one or more users. The user interface is configured to cooperate with a first module to send information for the first module, which the first module then uses the information to apply the hierarchical-decomposition reinforcement learning technique to train one or more AI object.

The first module applies a hierarchical-decomposition reinforcement learning technique to train one or more AI objects as concept nodes composed in a hierarchical graph incorporated into an AI model. The first module, such as an instructor module, uses the hierarchical-decomposition reinforcement learning technique to hierarchically decompose a complex task into multiple smaller, individual sub-tasks making up the complex task. One or more of the individual sub-tasks corresponds to its own concept node in the hierarchical graph. The AI engine may initially train the AI objects on the individual sub-tasks and then train the AI objects on how the individual sub-tasks need to interact with each other in the complex task in order to deliver an end solution to the complex task.

A first module, such as a learner module, is configured to cooperate with one or more data sources to obtain data for training and to conduct the training of one or more AI objects corresponding to concept nodes in parallel at the same time.

The AI engine decomposing the complex task allows for both i) the first module to use reward functions focused for solving each individual sub-task, and then one or more reward functions focused for the end solution of the complex task, as well as ii) the first module to conduct the training of the AI objects corresponding to the individual sub-tasks in the complex task, in parallel at the same time. The combined parallel training and the use of reward functions focused for solving each individual sub-task speed up an overall training duration for the complex task on the one or more computing platforms, and subsequent deployment of a resulting AI model that is trained, compared to an end-to-end training with a single algorithm for all of the AI objects incorporated into the AI model.

These and other features of the design provided herein can be better understood with reference to the drawings, description, and claims, all of which form the disclosure of this patent application.

DRAWINGS

The drawings refer to an embodiment of the design provided herein in which:

FIG. 1A provides a block diagram illustrating an AI system and its cloud-based computing platforms infrastructure in accordance with an embodiment.

FIG. 1B provides a block diagram illustrating an AI system and its on-premises based computing platforms infrastructure in accordance with an embodiment.

FIGS. 2A and 2B provide block diagrams illustrating an embodiment of AI system with an AI engine that has multiple independent modules that use a hierarchical-decomposition deep reinforcement technique for training an AI model.

FIG. 3A illustrates a block diagram of an embodiment of a concept in a mental model that receives input data from a data source, computes its function, and generates output data.

FIG. 3B also illustrates a block diagram of an embodiment of a concept in a mental model that receives input data from a data source, computes its function, and generates output data.

Figure 1A:
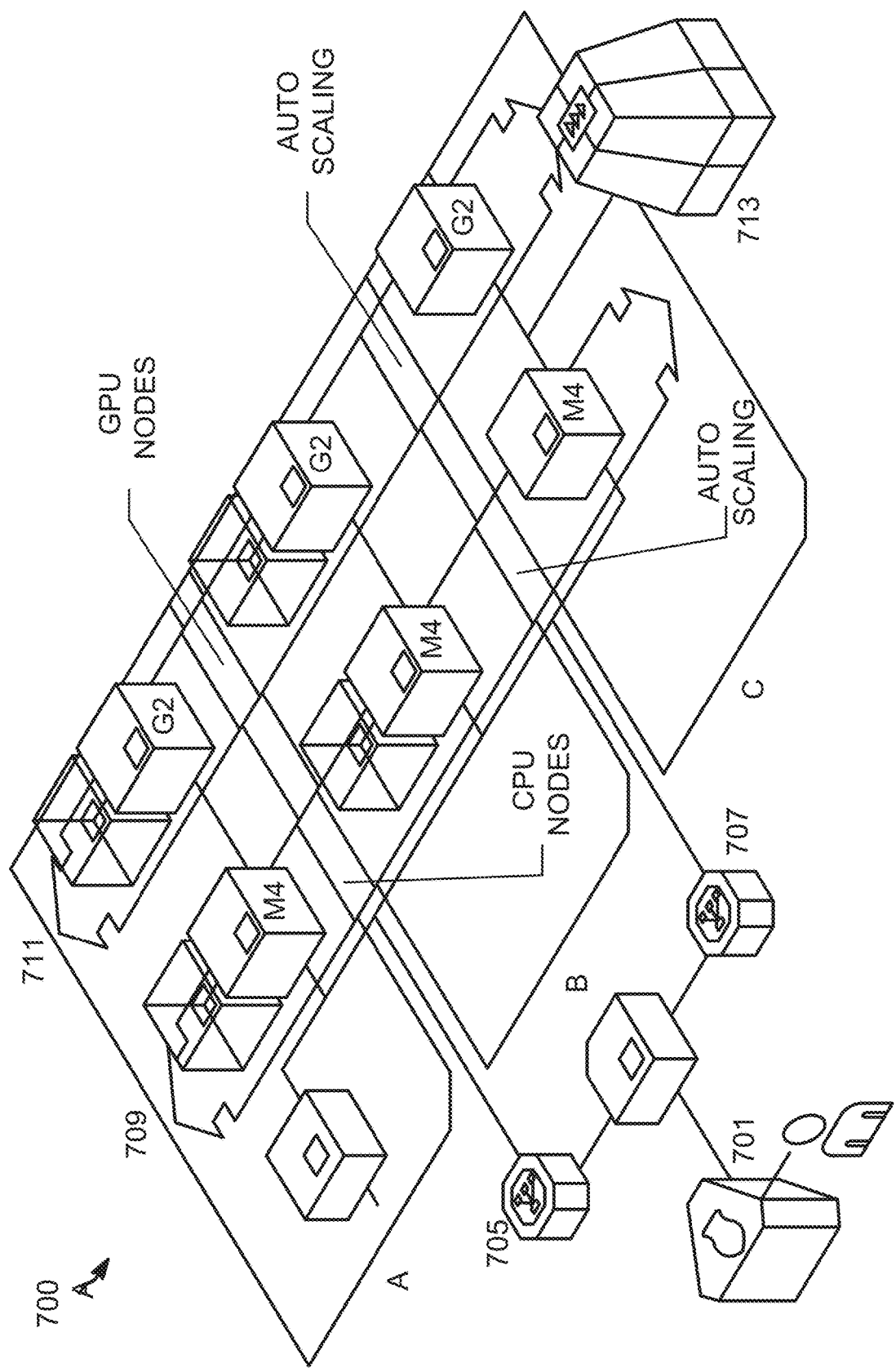

FIGS. 12A through 12C provide flow diagrams illustrating a method for a hierarchical-decomposition deep reinforcement learning for an AI model in accordance with an embodiment.

While the design is subject to various modifications, equivalents, and alternative forms, specific embodiments thereof have been shown by way of example in the drawings and will now be described in detail. It should be understood that the design is not limited to the particular embodiments disclosed, but—on the contrary—the intention is to cover all modifications, equivalents, and alternative forms using the specific embodiments.

DESCRIPTION

In the following description, numerous specific details are set forth, such as examples of specific data signals, named components, memory in a device, etc., in order to provide a thorough understanding of the present design. It will be apparent, however, to one of ordinary skill in the art that the present design can be practiced without these specific details. In other instances, well known components or methods have not been described in detail, but rather in a block diagram in order to avoid unnecessarily obscuring the present design. Further, specific numeric references such as a first database, can be made. However, the specific numeric reference should not be interpreted as a literal sequential order, but rather interpreted that the first database is different than a second database. Thus, the specific details set forth are merely exemplary. Also, the features implemented in one embodiment may be implemented in another embodiment where logically possible. The specific details can be varied from and still be contemplated to be within the spirit and scope of the present design. The term "coupled" is defined as meaning connected either directly to the component or indirectly to the component through another component.

Training AI models can take days, weeks, or even longer. Provided herein are time-saving training aids and methods thereof for the training of the AI models. In general, an AI engine is configured to apply a hierarchical-decomposition reinforcement learning technique to train one or more AI objects as concept nodes composed in a hierarchical graph incorporated into an AI model. The individual sub-tasks of a decomposed task may correspond to its own concept node in the hierarchical graph and are initially trained on how to complete their individual sub-task, and then trained on how all of the individual sub-tasks need to interact with each other in the complex task in order to deliver an end solution to the complex task. Next, during the training, using reward functions focused for solving each individual sub-task and then a separate one or more reward functions focused for solving the end solution of the complex task. In addition, where reasonably possible, conducting the training of the AI objects corresponding to the individual sub-tasks in the complex task, in parallel at the same time. The combined parallel training and simpler reward functions speed up the overall training duration for the complex task on the one or more computing platforms, and subsequent deployment of a resulting AI model that is trained, compared to an end-to-end training with a single algorithm for all of the AI objects incorporated into the AI model. The AI engine makes more efficient use of the existing computing platforms by scaling the computing platforms to train the different concepts in parallel.

In addition, an integrator component can be configured to check to see what is a lowest level of dependency in the first set of concept nodes in the graph that needs to be calculated for its computations including its output. A module is configured to supply the data from the data source to merely the first set of concept nodes that need to make their individual computations instead of all the concept nodes in the graph. The integrator checks to see that the computations for all of the nodes merely in the first set of nodes occur, which saves an amount of computing power and cycles compared to computing all of the nodes making up the AI model in each training cycle.

FIGS. 1A-2B and FIGS. 10-11 illustrate example computing infrastructure, e.g., AI Engines, that may be implemented with the hierarchical-decomposition deep reinforcement learning for an AI model. FIGS. 3A through 9 and FIGS. 12A-12C illustrate example details about the hierarchical-decomposition deep reinforcement learning for an AI model. All of the Figures discuss example details of the design discussed herein.

Brief Discussion of Components in the AI Engine

Figure 2A:
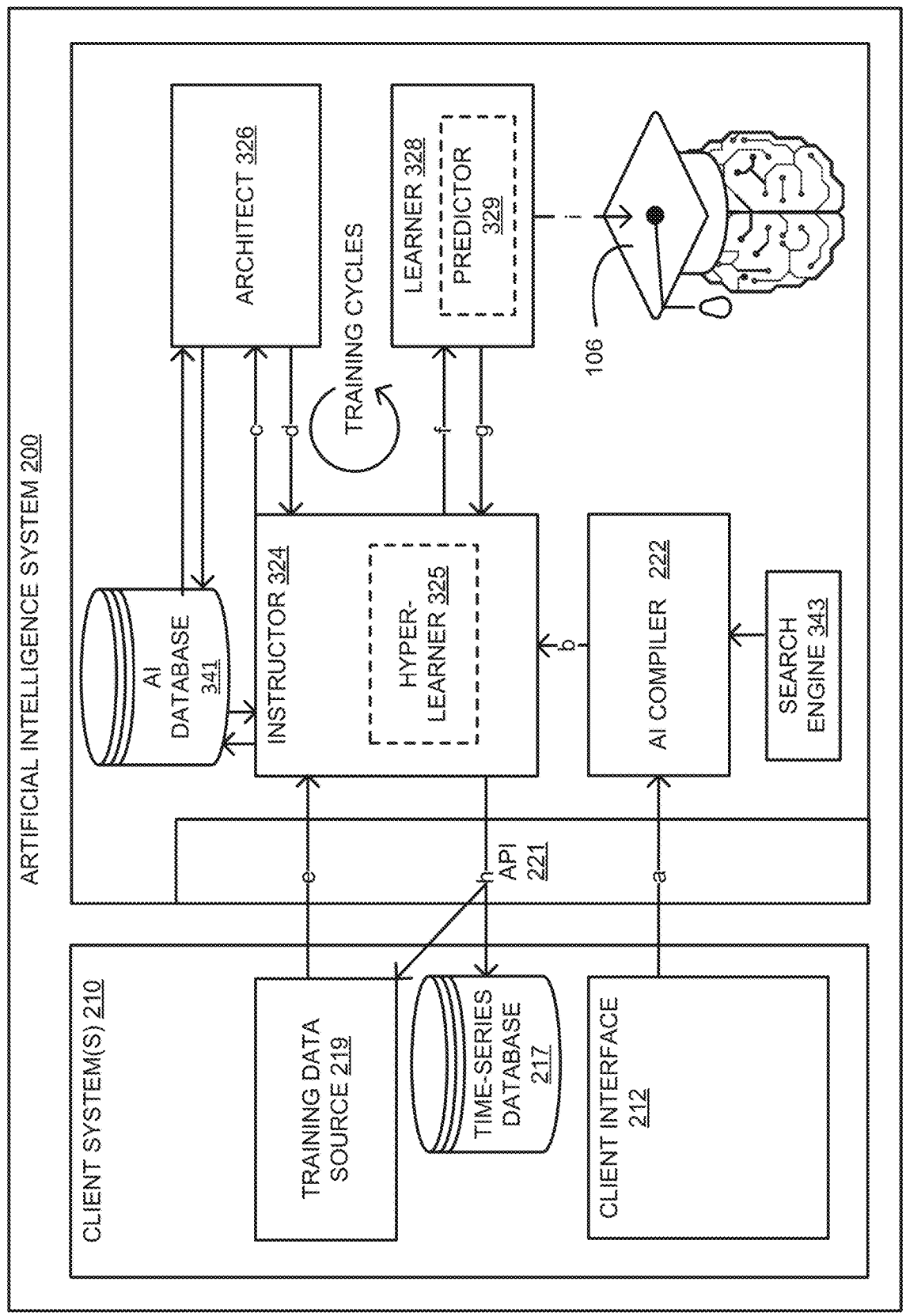
Figure 2B:
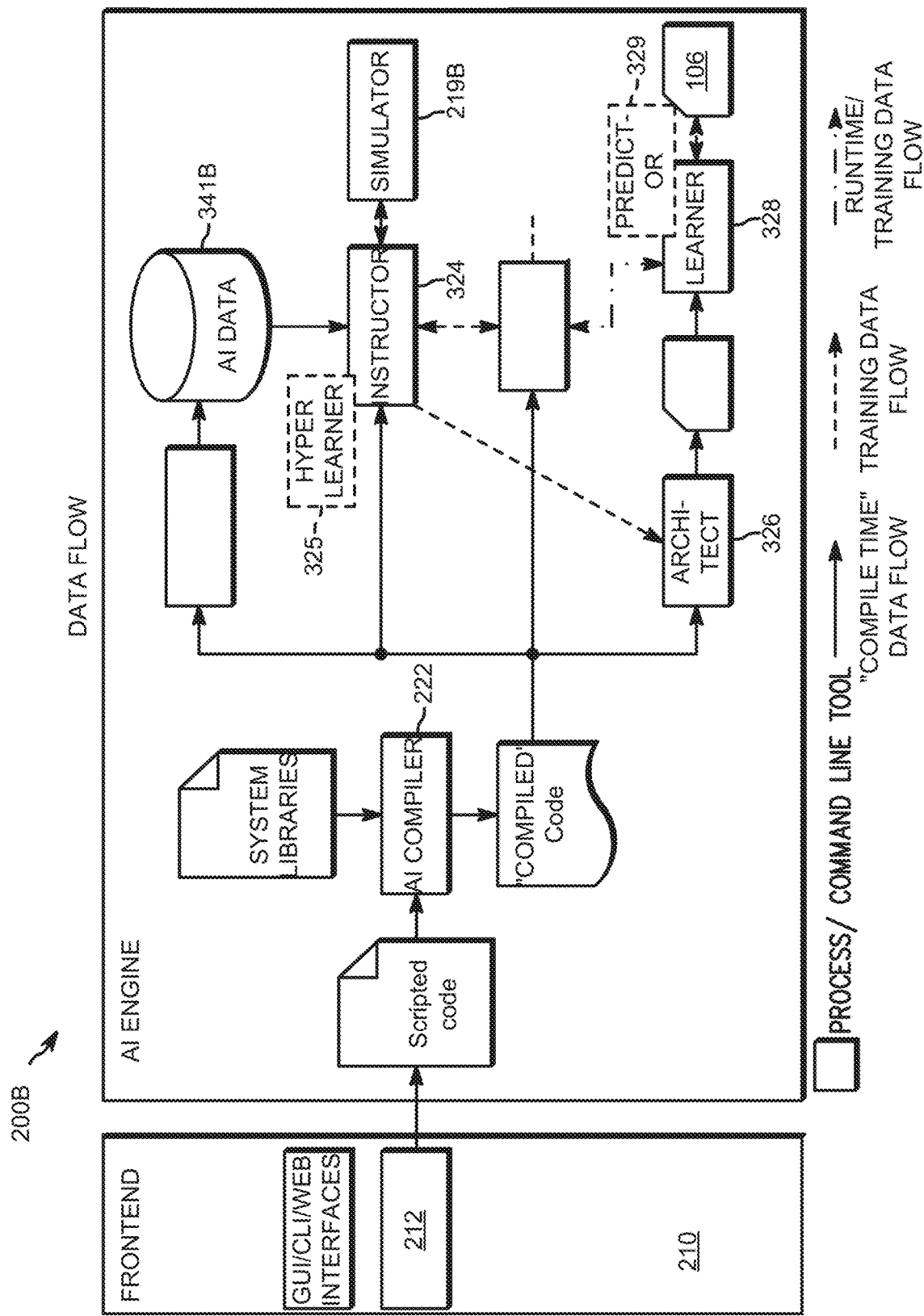

FIGS. 2A and 2B provide block diagrams illustrating an embodiment of AI system with an AI engine that has multiple independent modules that use a hierarchical-decomposition deep reinforcement technique for training an AI model.

The AI engine for generating a trained AI model 106 can include one or more AI-generator modules selected from at least an instructor module 324, an architect module 326, and a learner module 328 as shown. The instructor module 324 can optionally include a hyperlearner module 325, and which can be configured to select one or more hyper parameters for any one or more of a neural network configuration, a learning algorithm, and the like. The hyperlearner module 325 can optionally be contained in a different AI-generator module such as the architect module 326 or the learner module 328, or the hyperlearner module 325 can be an AI-generator module itself. The learner module 328 can optionally include a predictor module 329, which can provide one or more predictions for a trained AI model. The predictor module 329 can optionally be contained in a different AI-generator module such as the instructor module 324 or the architect module 326, or the predictor module 329 can be an AI-generator module itself. The AI engine including the foregoing one or more AI-generator modules can be configured to generate the trained AI model, such as trained AI model 106, from compiled scripted software code written in a pedagogical software programming language via one or more training cycles with the AI engine.

One or more clients 210 can make a submission to create a trained AI model. Once a Mental Model (see FIGS. 3A and 3B) and curricula have been coded in the pedagogical software programming language, then the code through the user interface 212 can be compiled and sent to the three main modules, the learner module 328, the instructor module 324, and the architect module 326 of the AI engine for training. One or more user interfaces 212, such a web interface, a graphical user interface, and/or command line interface, will handle assembling the scripted code written in the pedagogical software programming language, as well as other ancillary steps like registering the line segments with the AI engine, together with a single command. However, each module—the AI compiler module 222, the web enabled interface 221 to the AI engine, the learner module 328, etc., can be used in a standalone manner, so if the author prefers to manually invoke the AI compiler module, manually perform the API call to upload the compiled pedagogical software programming language to the modules of the AI engine, etc., they have the flexibility and freedom to do so.

Thus, one or more clients 210 can send scripted code from the coder 212 or another user interface to the AI compiler 222. The AI compiler 222 compiles the scripted software code written in a pedagogical software programming language. The AI compiler 222 can send the compiled scripted code, similar to an assembly code, to the instructor module 324, which, in turn, can send the code to the architect module 326. Alternatively, the AI compiler 222 can send the compiled scripted code in parallel to all of the modules needing to perform a sub-task on the compiled scripted code. The architect module 326 can propose a vast array of machine learning algorithms, such as various neural network layouts, as well as optimize the topology of a network of intelligent processing nodes making up an AI object. The architect module 326 can map between concepts and layers of the network of nodes and send one or more instantiated AI objects to the learner module 328. Once the architect module 326 creates the topological graph of concept nodes, hierarchy of sub-concepts feeding parameters into that complex task (if a hierarchy exists in this layout), and learning algorithm for each of the complex task and sub-concepts, then training by the learner module 328 and instructor module 324 may begin.

The instructor module 324 can request training data from the training data source 219. Training can be initiated with an explicit start command in the pedagogical software programming language from the user to begin training. In order for training to proceed, the user needs to have already submitted compiled pedagogical software programming language code and registered all of their external data sources such as simulators (if any are to be used) via the user interfaces with the learner and instructor modules 324, 326 of the AI engine.

The training data source 219 can send the training data to the instructor module 324 upon the request. The instructor module 324 can subsequently instruct the learner module 328 on training the AI object with pedagogical software programming language based curricula for training the concepts into the AI objects. Training an AI model can take place in one or more training cycles to yield a trained state of the AI model 106. The instructor module 324 can decide what pedagogical software programming language based concepts and streams should be actively trained in a mental model. The instructor module 324 can know what are the terminating conditions for training the concepts based on user criteria and/or known best practices. The learner module 328 or the predictor 329 can elicit a prediction from the trained AI model 106 and send the prediction to the instructor module 324. The instructor module 324, in turn, can send the prediction to the training data source 219 for updated training data based upon the prediction and, optionally, instruct the learner module 328 in additional training cycles. When one or more training cycles are complete, the learner module 328 can save the trained state of the network of processing nodes in the trained AI model 106. (Note a more detailed discussion of different embodiments of the components making up the AI engine occurs later.)

The AI engine has multiple independent modules 222, 324, 325, 326, 328, and 329 on one or more computing platforms. The multiple independent modules 222, 324, 325, 326, 328, and 329 have their instructions executed by one or more processors in the one or more computing platforms. The multiple independent modules 222, 324, 325, 326, 328, and 329 may be loaded into one or more memories of the one or more computing platforms.

The instructor module 324 may apply a hierarchical-decomposition deep reinforcement technique to train one or more AI objects corresponding to concept nodes in an AI model 106. The instructor module 324 may use the hierarchical-decomposition deep reinforcement technique to solve a wide variety of a set of complex tasks in a modular way, through hierarchically decomposing a complex task into multiple smaller, individual sub-tasks making up the complex task. One or more of the individual sub-tasks, correspond to its own concept node in the graph. The AI engine 200 may initially train the AI objects on the individual sub-tasks in parallel at the same time and then train on how the individual sub-tasks need to interact with each other in the complex task in order to deliver an end solution to the complex task.

The instructor module 324 decomposing the complex task allows the AI engine 200 to use simpler reward functions focused for solving each individual sub-task and then much simpler reward functions focused for the end solution of the complex task. The AI engine 200 decomposing the complex task also allows conducting the training of two or more different concepts corresponding to the individual sub-tasks in the complex task, in parallel. The parallel training and simpler reward functions speed up an overall training duration for the complex task and resulting AI model on the one or more computing platforms. The parallel training and simpler reward functions speed up an overall training duration for the complex task compared to an end-to-end training with a single algorithm for all of the AI objects incorporated into the AI model.

Reward functions can be more easily defined by decomposing the complex task. Instead of specifying a complex reward function for solving the whole task, the system designer can define rewards that are specific to each sub-task. These are usually simpler to define. Once the sub-tasks are ready, the designer can specify a simpler and potentially sparse reward function for selector nodes. This greatly simplifies solving complex problems with reinforcement learning.

Also, decomposing the complex task allows reusing all or just portions of one or more pre-trained models for solving a new larger complex task.

Also, decomposing the complex task allows each concept making up the complex task in the graph to use the most appropriate training approach for that individual sub-task, whether that be a classical motion controller, a pre-existing learned model, or a neural network that needs to be trained rather than the whole AI model being trained with one of these training approaches.

Also, decomposing the complex task allows replacing one or more concepts making up the complex task without retraining each concept making up that system. For example, in FIG. 4B, the AI model may switch between using different versions of the concepts of a Grasp and/or Stack. The different versions of the concepts of a Grasp and/or Stack can be adapted without having to change or retrain the Reach, Move, or overall integrator concepts.

The AI system may implement a form of deep reinforcement learning with hierarchical decomposition of the complex task into concepts of individual sub-tasks in contrast to a standard notion of running a single end-to-end algorithm training.

The AI engine 200 has a user interface 212 presented on a display screen for use by one or more users in a user's organization. The user interface 212 is configured to set the modules in the AI engine to train two or more concept nodes in parallel at the same time. The learner module 324, including a conductor service, may cooperate with one or more data sources to obtain data for training and conduct the training of one or more AI objects corresponding to concept nodes in parallel at the same time.

An "AI model" as used herein includes, but is not limited to, neural networks such as recurrent neural networks, recursive neural networks, feed-forward neural networks, convolutional neural networks, deep belief networks, and convolutional deep belief networks; multi-layer perceptions; decision trees; self-organizing maps; deep Boltzmann machines; and Stacked de-noising auto-encoders. The modules of the AI engine are configured to utilize many different machine learning algorithms to generate and/or training a resulting AI model.

An "artificial neural network" or simply a "neural network" as used herein can include a highly interconnected network of processing elements, each optionally associated with a local memory. The processing elements can be referred to herein as "artificial neural units," "artificial neurons," "neural units," "neurons," "nodes," and the like, while connections between the processing elements can be referred to herein as "synapses," "weights," and the like. A neuron can receive data from an input or one or more other neurons respectively through one or more weighted synapses, process the data, and send processed data to an output or yet one or more other neurons respectively through one or more other weighted synapses. The neural network or one or more neurons thereof can be generated in either hardware, software, or a combination of hardware and software, and the neural network can be subsequently trained.

A module may consist of one or more processes including one or more services, one or more electronic circuits, or a combination of one or more software processes cooperating with the electronic circuits.

Note, each trained AI model itself can be a collection of trained AI objects corresponding to a complex task, that is attempted to be analyzed and solved by the AI model. Where, a set of concepts in a hierarchical structure feed parameters into the complex task. The AI database 341 can index AI objects corresponding to the complex task and the set of concepts making up a given trained AI model so that reuse, recomposition, and reconfiguration of all or part of a trained AI model is possible.

A software process may be an instance of an executable file configured to perform a task in a finite amount of time (i.e., a job). Thus, each process is configured to operate for a finite amount of time to achieve its configured goal and then shut down until invoked again when needed in the future. Several instances of a same process each wrapped in its own container may run simultaneously on one or more computing devices. A service may be a process, which runs in the background. Each independent process is configured to be aware of the existence of the other processes and knows whom to call and what data and types of inputs that other processes looking for. Also, functionality performed by one software process may be combined into another software process or migrated in part to another software process. For example, in an embodiment, the 'instructor' and 'learner' processes are merged into a single, combined process running within a single container named the 'scholar.' Thus, the 'instructor' and 'learner' may be implemented as independent processes. Each independent processes running in its own container. However, for performance reasons these 'instructor' and 'learner' processes may be merged into a single, combined process running within a single container named the 'scholar'. The functionality in the 'instructor' and 'learner' is still present as before, just not in independent processes.

Each of the independent process can be running its own computing device (e.g., see FIGS. 1A & 1B 709A-711A), and then use a subnet to communicate communications between the other independent processes. As capacity exists, some independent processes may share a computing device. Also, using the subnets is much faster than, for example trying to conduct communications through the Internet via the Gateway, which would have a longer round-trip delay time or lag time.

Individual processes programmed to achieve and perform different functions within the AI engine are broken up into an individual process, each in its own software container. For example, 1) the architect process can be configured to create, instantiate, and figure out the topology of an AI model corresponding to a concept being trained for AI, 2) an instructor process can be configured to guide the training and how to do the training, and 3) a learner process to carrying out an actual execution of the training, as well as 4) a predictor process, during an AI models deployment, to make use of a trained AI model. Breaking these up into individual processes/modules that are aware of each other and know which process and/or service to call and how to call that process and also know which inputs and outputs to send to each other, allows the training to be broken up into these multiple discrete individual services.

Each process is configured as an independent process wrapped in its own container so that multiple instances of the same processes, (e.g.) learner and instructor, may be running simultaneously to scale to handle multiple users running training sessions, deploying AI modules, and creating AI models, all at the same time. Thus, the cloud or on-premises platform for the AI engine exists with servers, processes, and databases, that allows many users to connect over a wide area network, such as the Internet, from multiple computing devices and then the backend of the cloud platform is configured to handle the scaling, efficiency, etc., by dynamically calling in additional computing hardware machines to load on and run the independent processes of, for example, an instance of the learner and/or instance of the instructor, as needed.

The multiple independent processes carry out four or more separate tasks by interaction with and cooperation between the multiple independent processes. A first task can be creating a shell of an AI model, such as creating an AI model. A second task can be loading in a file of scripted code in a programming language to help define 1) a topology of processing nodes in the AI model, 2) a layout of the concepts making up the AI model, and 3) a selection of an appropriate learning algorithm for the AI model. The file created in pedagogical software programming language, such as Inkling™, helps the architect module to create the topology of processing nodes in the AI model, the layout of the concepts making up the AI model, etc., derived from the programming code. The third task is starting to train the AI model with a data source, such as a simulator. The fourth task is then deploying and using a trained AI model to do, for example, predictions on data from the data source.

Each independent process, such as 1) the instructor module, 2) the learner module, and 3) the architect module as part of an AI-model service can be configured to be able to operate on either of a CPU computing device or a GPU computing device or both.

In an embodiment, other independent processes cooperate together and contain functionality from the instructor module, the learner module, etc. For example, a scholar process is coded to handle both the training for a given concept (lesson management) and training a lesson. The scholar will also select parameters for the concept. The scholar will also select the algorithms and the topology of the graphs for the concept (e.g. does some of the job of the architect module). The scholar process trains a given concept (e.g. does the job of instructor and learner in an alternative architecture). When the AI engine trains the same concept or multiple different concepts in parallel then the AI engine will have multiple scholars running in parallel. A director module manages the training of a concept graph by calling for the instantiation of one scholar process for each concept being trained. A conductor process merely manages resource allocation required for training an AI model. The director module determines how the resources are used to train the graph of nodes in parallel. The director may also instantiate the graph of nodes itself. Each concept is trained by a scholar process and in the case of multiple concepts being trained in parallel multiple scholar processes are run simultaneously. This is all managed by the director module.

Concepts and Mental Models

Figure 3A:
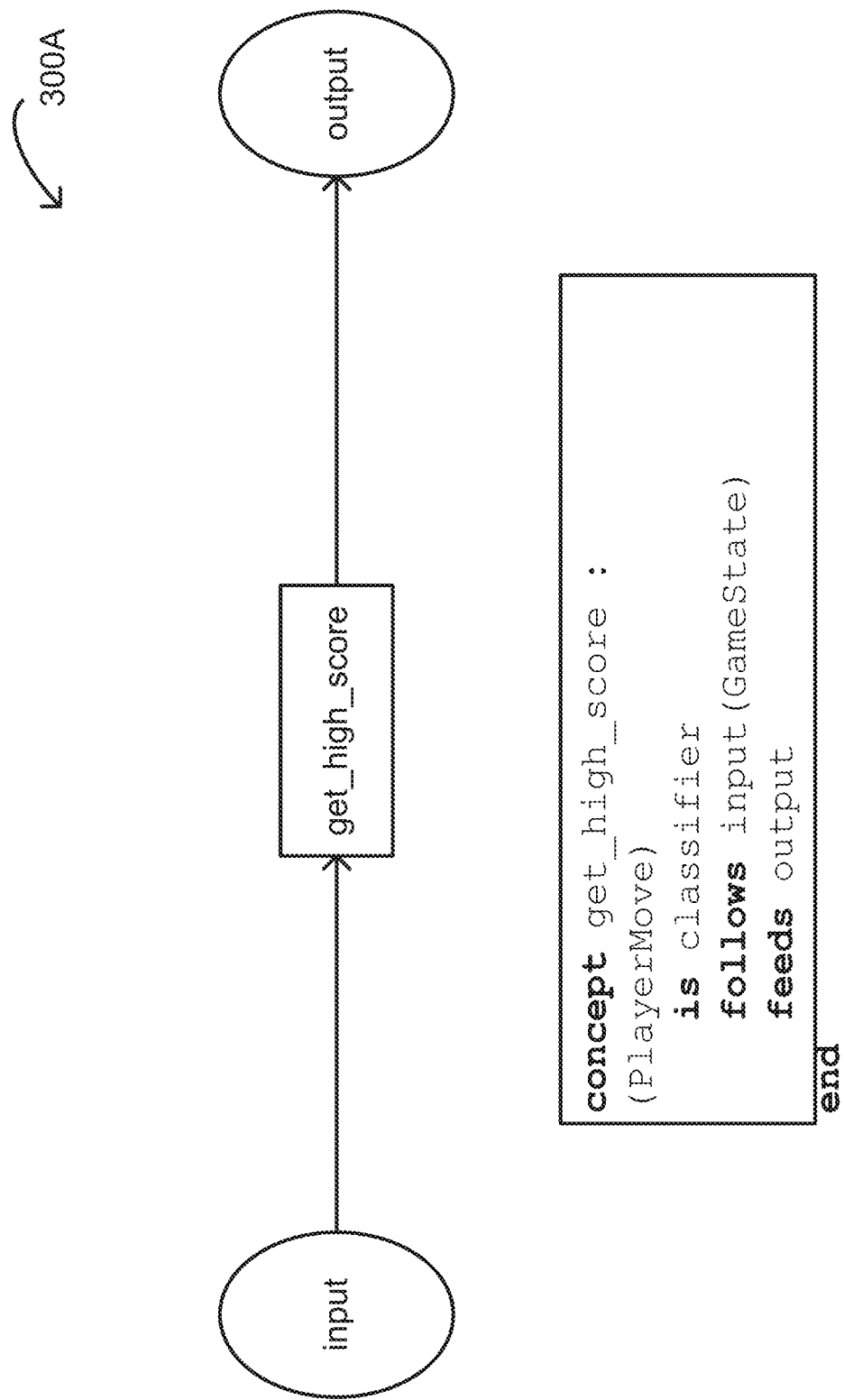
Figure 3B:
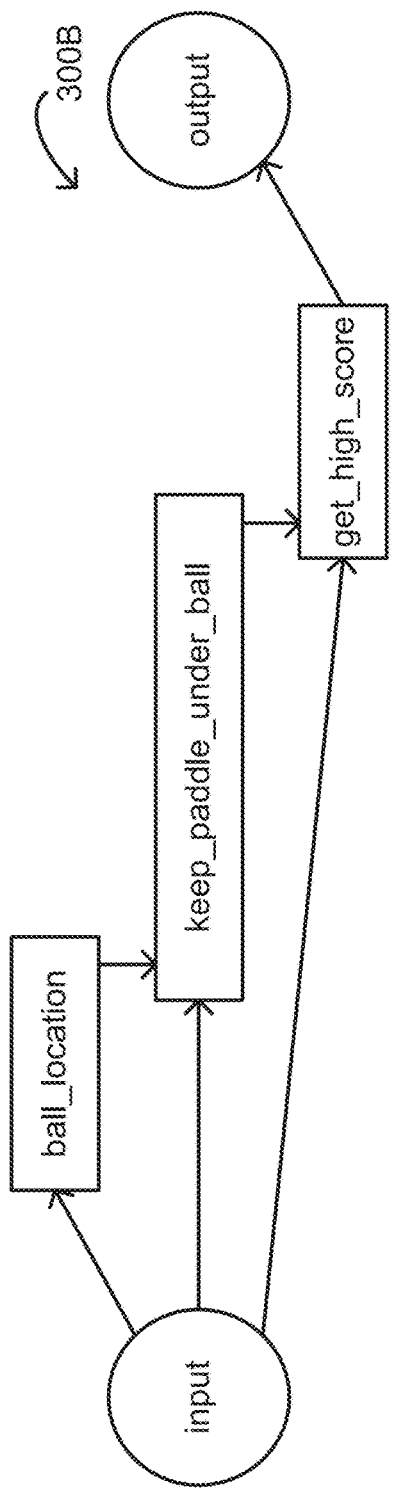

FIGS. 3A and 3B provide block diagrams of an embodiment of a concept in a mental model 300A, 300B that receives input data from a data source, computes its function, and generates output data.

Pedagogical programming focuses on codifying two main pillars: 1) What are the concepts associated with the problem domain (and mentally how do they relate to each other)? and 2) How would one go about teaching those concepts?

A concept is something that can be learned. Once learned, its corresponding AI object can provide an intelligent output. An AI object may learn and be trained on a particular concept. An AI object corresponding to a particular concept can receive input data from other AI objects/concepts and simulators, and send output data to other AI objects/concepts or as an AI object corresponding to a complex task produce a final result/output. A concept can be used in isolation, but it is typically more useful to construct some structured relationship of connectivity, such as a hierarchy, between the related concepts, beginning with the relatively simple concepts and then building into more complex concepts. For example, "ball location" is a relatively simple concept; whereas, "get high score" with the ball is a more complex task. In another example, a mental model of flying a plane may have a complex task of "flying a plane" and numerous concepts such as "how to navigate and move a plane from point A to point B," "how to avoid crashing into objects," "how to take off into flight", "how to land from flight," etc. Each of the concepts feeds one or more outputs either directly or indirectly into the complex task of "flying a plane" when undergoing training on the complex task. The architect module 326 creates the structured relationship of connectivity between these concepts based on user supplied guidance in the pedagogical programming language code.

Thus, concepts are distinct aspects of a complex task that can be trained separately, and then combined using an integrator concept. This approach drastically reduces the overall complexity, since the simpler problems can be trained with focused and easier-to-specify reward functions. In addition, the selected concept can be quickly learned using a simple reward function. Each discrete AI object making up an AI model may be encoded or containerized into its own new concept node and that set of concept nodes is put into a graph of concept nodes. The graph of nodes may be intermixed with concept nodes that are new and extend the functionality of the initial machine-learning model. (See example FIGS. 4A-4F.)

A concept in a pedagogical programming language may be something that an AI object can be trained on and learn. In an embodiment, a concept can describe things such as an object, a ball, a character, an enemy, a light, a person, or the like. The state data can be whether the one or more things are on or off, hot or cold, a number or a letter, or the like. Other example concepts can reflect a method or a behavior such as "avoid ghosts," "keep the paddle under the ball," "don't run into walls," "turn lights off," "get high score," or the like. Both FIGS. 3A and 3B show mental models including the strategy-type concept "get high score."

A mental model in a pedagogical programming language is also something that an AI model can be trained on and learn. A mental model can include one or more concepts structured in terms of the one or more concepts, and the mental model can further include one or more data transformation streams. As shown in FIG. 3A, a single-concept mental model can include, for example, a strategy-type concept such as "get high score." As shown in FIG. 3B, a multi-concept mental model can include a hierarchical structure including, for example, strategy-type concepts such as "keep paddle under ball" and "get high score" and fact-type concepts such as "ball location." The concepts of "keep paddle under ball" and "ball location" feed parameters directly or indirectly into the complex task of "get high score" with the ball. Each AI object in a multi-concept mental model can receive input from other AI objects corresponding to other concepts in the mental model, send output to other concepts in the mental model, provide a final output or result output, or a combination thereof. Addition of more concepts to a mental model can decrease training time for an AI object, as well as enable a trained AI object to give smarter, more accurate predictions. Each trained concept may be AI object. Given this choice of mental model frames, the system would then codify the underlying concepts and their relationships in a corresponding network of AI objects.

Figure 4A:
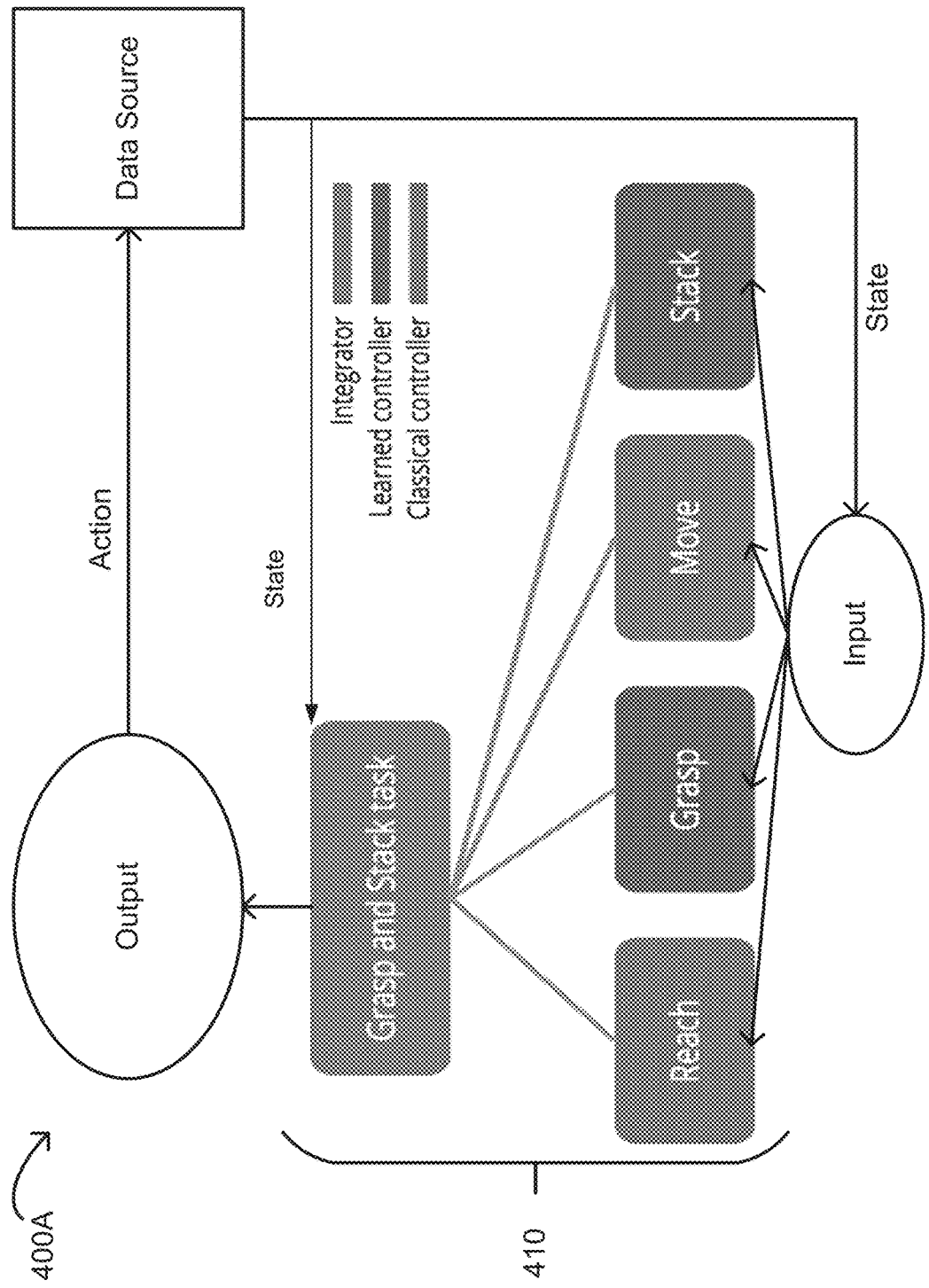
FIG. 4A illustrates a block diagram of an embodiment of a complex task with multiple smaller, individual sub-tasks making up the complex task, and the individual sub-tasks correspond to its own AI object in the concept network.

FIG. 4A illustrates a block diagram of an embodiment of a complex task with multiple smaller, individual sub-tasks making up the complex task, and the individual sub-tasks correspond to its own AI object in the concept network.

The modules of the AI engines decompose complex tasks into smaller, individual sub-tasks 410. The complex task; and thus, complex learning problem can be broken down into concepts, each concept learned independently, then reassembled into a complete solution to the complex task.

The modules of the AI engine can initially break an example overall task of Grasp-n-Stack down into four concepts: 1) Reach the object, 2) Grasp the object, 3) Move, and 4) Stack the object in a Stack. In this example robotic control demonstration, the complex task was decomposed by the modules into a concept network of five concepts:—Reach for the object, Grasp the object, Move the object, Stack the object, and the integrated Grasp-n-Stack task. (See FIG. 4E for an example illustration) Each concept has its own corresponding AI object being trained.

The concept network reinforcement learning approach has many benefits, as well as some limitations. Perhaps the greatest benefit is the ability to truly decompose reinforcement learning problems into independent parts. Developers can hierarchically decompose complex tasks into smaller increments. This is crucial for applying reinforcement learning to real industrial problems, allowing teams to divide and conquer: i) different groups can independently work on different aspects of a learning problem, ii) quickly assemble them into a full solution for the complex task, and iii) later upgrade individual components later without needing to retrain the entire set of concepts making up the complex task. The concept network reinforcement learning framework enables true problem decomposition for reinforcement learning problems. A complex learning problem can be broken down into concepts, each concept learned independently, then reassembled into a complete solution. Decomposing problems in this way can greatly reduce the amount of training needed to achieve a useful result.

In general, Reinforcement Learning (RL) can be about an AI concept interacting with the environment over time, learning an optimal policy, by trial and error with evaluated feedback, for sequential decision making problems. A deep neural network can be combined with reinforcement learning for the deep reinforcement learning. The AI model learns by way of, for example, a dataset, a cost/loss function, and an optimization procedure. A machine learning algorithm can be designed to make gaps between training errors and testing error small. An AI model, such as a neural network, can include input and output layers. At each layer except the initial input layer, the system can compute the input to each unit, as a weighted sum of units from the previous layer. A map of a set of input values to output values can be generated. The system may implement a form of deep reinforcement learning in contrast to a standard notion of running a single end-to-end algorithm training, which saves computing duration to train the AI model compared to the single end-to-end algorithm training. In the deep reinforcement learning, the AI concept interacts with an environment over time. In an embodiment, at each time step (e.g., iteration of learning), the AI concept receives a state in a state space, selects a sub-task from an action space, follows a policy, which controls the AI concept's behavior, i.e., a mapping from a state to sub-tasks, then receives a scalar reward, and then transitions to the next state, according to the environment dynamics, or model, for the reward function. (See FIG. 6 for example.) The AI concept also receives feedback from its selected sub-tasks and performance and then evaluates the feedback to alter its training. Each concept can have different state+ action spaces.

In an embodiment, automatic partitioning operates on state space, not action space. The module identifies regions of state space that correspond to separable, individually solvable subtasks and creates distinct policies for each so identified region of state space.

Referring to FIG. 2A, the architect module 326 may instantiate the AI objects corresponding to the concepts of the complex/main task into the graph of i) a concept node corresponding to an integrator and ii) one or more levels of concepts corresponding to the individual sub-tasks that hierarchically stem forth from the integrator in the graph of the AI model. (See FIG. 4A, for example.) The integrator concept node integrates an interaction between the individual sub-tasks to achieve the end solution of the complex task. (See FIG. 4C, for example.)

The architect module 326 may be configured to automatically partition the individual sub-tasks into the concept nodes in the AI model to be trained on in a number of ways. The ways of conveying the partitioning of the individual sub-tasks into the concept nodes include but are not limited to: i) how to partition the individual sub-tasks is explicitly defined in scripted code by the user, ii) how to partition the individual sub-tasks is hinted at by giving general guidance in the scripted code by the user, iii) how to partition the individual sub-tasks is interpreted from guidance based on responses from the user to a presented list of questions, and iv) any combination of these three. Also, the user may also explicitly define or just give hints on how many levels of nodes in the graph should be. The architect module 326 then proposes a hierarchical structure for the graph of AI objects making up the AI model. The architect module 326 partitions the individual sub-tasks to separately train within that AI model where it makes sense to efficiently train in parallel with each other.

In one case, the AI engine figures out how where to partition, by looking at the state inputs and separating by distinctly discreet sets of state inputs. The architect module 326 analyzes an anticipated output for each sub-task and when the state input is roughly generating the same reward function, then the system says okay, do not partition individual sub-tasks into their own concept anymore. The architect module 326 can use artificial intelligence to script i) how to construct and ii) know when concepts need to be divided out and treated as separate concepts. For example, when each sub-task uses a similar reward and is getting the same set of data from the data source, such as a simulator, data generator, database, etc., then those sub-tasks can actually be combined into a single concept node.

The user can supply the reward function for each concept or the system, can use auto scripting to recognize problems and supply what the reward should be for each concept, which is distinct from the overall reward for the entire complex task.

The instructor module 324 may cause the AI engine to initially train each individual AI object to solve its individual sub-task and it's corresponding one or more reward functions focused for solving that sub-task. The instructor module 324 may then next use an integrator node to train the set of individual sub-tasks in the complex task to combine the concepts of the individual sub-tasks to cooperate and work with each other to achieve the complex task. The concept node of the integrator may then use a reward function focused for the end solution to the complex task.

Thus, the architect module 326 lays out a deep learning neural network for the AI model. The instructor module 324 will then proceed to execute the best available lesson in the curriculum and will stream data to the set of AI objects being trained. Upon deployment, a data source 219 would be able to stream, for example, an image into the AI model 106 and get predictions out. In an embodiment, the low level AI or machine learning algorithmic details need not be codified by a user but rather these low level details can be generated by the architect module 326 by pulling the topology of a given network processing nodes and a best machine learning algorithmic from reference databases.

During training, the instructor module 324 cooperating with the learner module 328 might find that an example training algorithm, such as the TRPO algorithm, has difficulty training one or more of the concepts. The modules may choose other algorithms for training these actor concepts to its corresponding AI object. For example, three of these concepts—Orienting, Moving, and Stacking—may use TRPO and deep reinforcement learning to train, while the Pinching and Reaching concepts can be handled with inverse kinematics. Each concept can use the most appropriate approach for that task, whether a classical motion controller, a pre-existing learned model, or a neural network that needs to be trained.

Figure 4B:
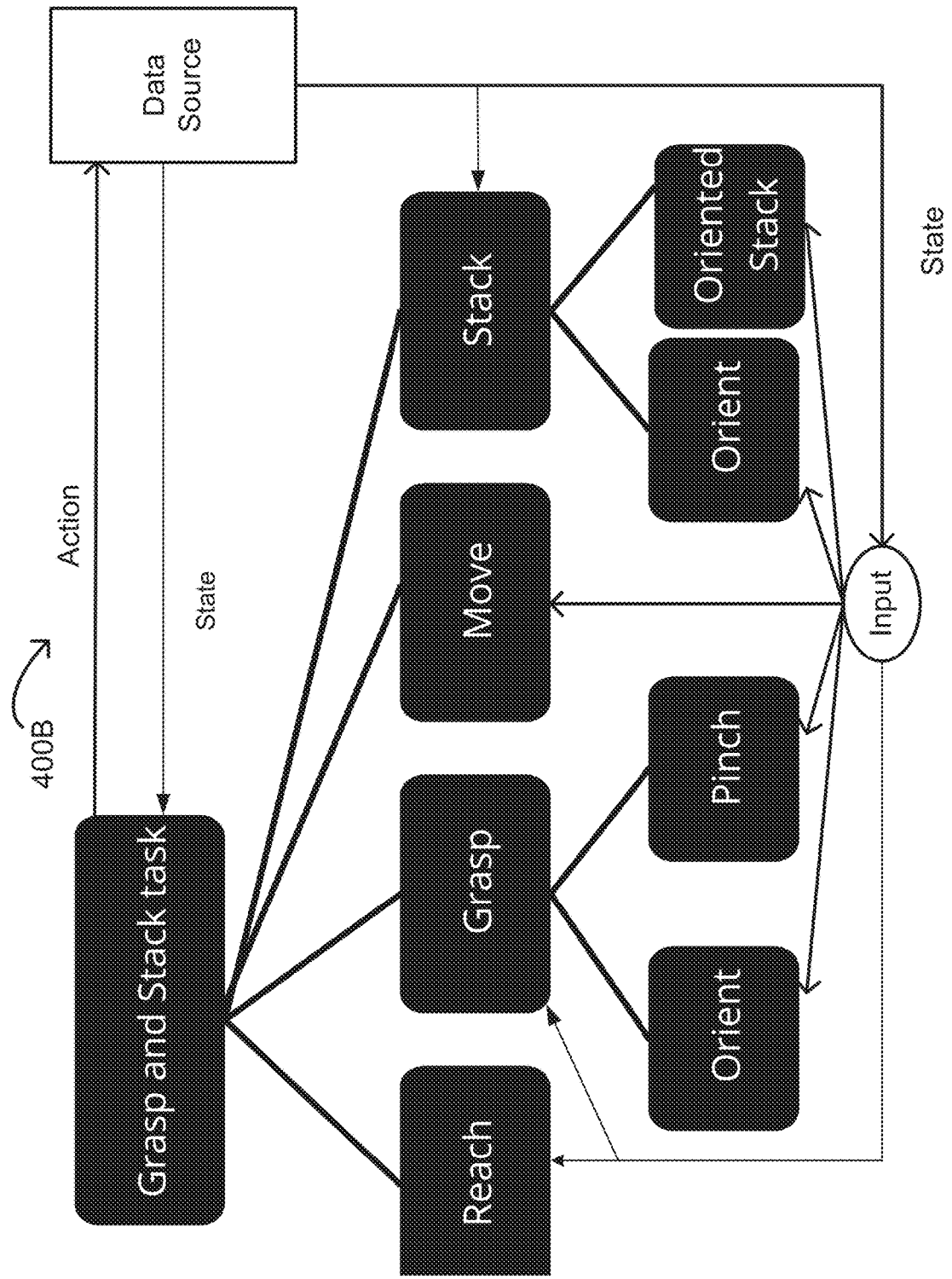
FIG. 4B illustrates a block diagram of an embodiment of a complex task with multiple hierarchical levels of concept nodes.
Figure 4C:
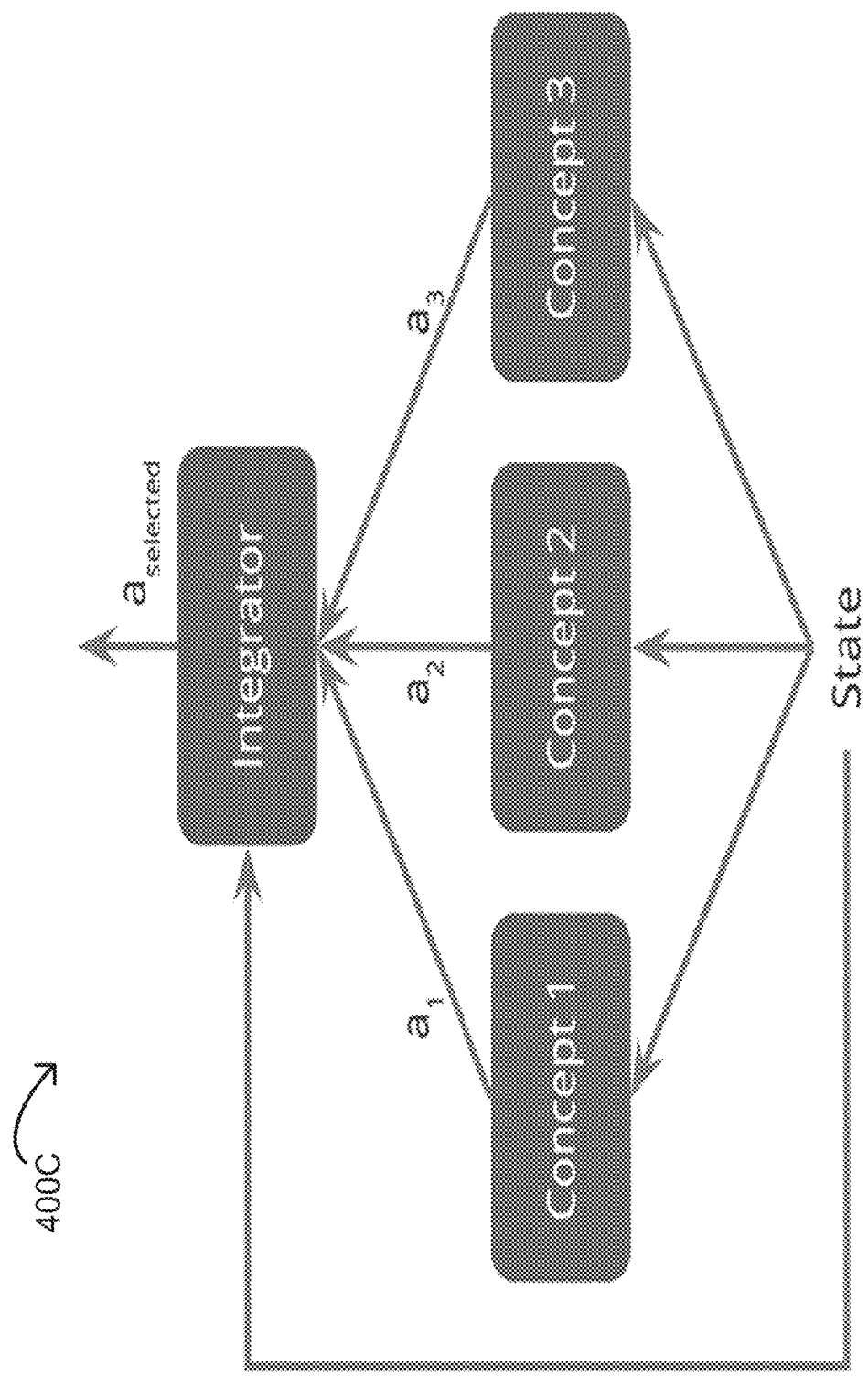
FIG. 4C illustrates a block diagram of an embodiment of a complex main task and its graph of i) a concept node corresponding to an integrator task, and ii) one or more levels of concepts corresponding to the individual sub-tasks that hierarchically stem forth from the integrator task in the graph of the AI model.
Figure 4D:
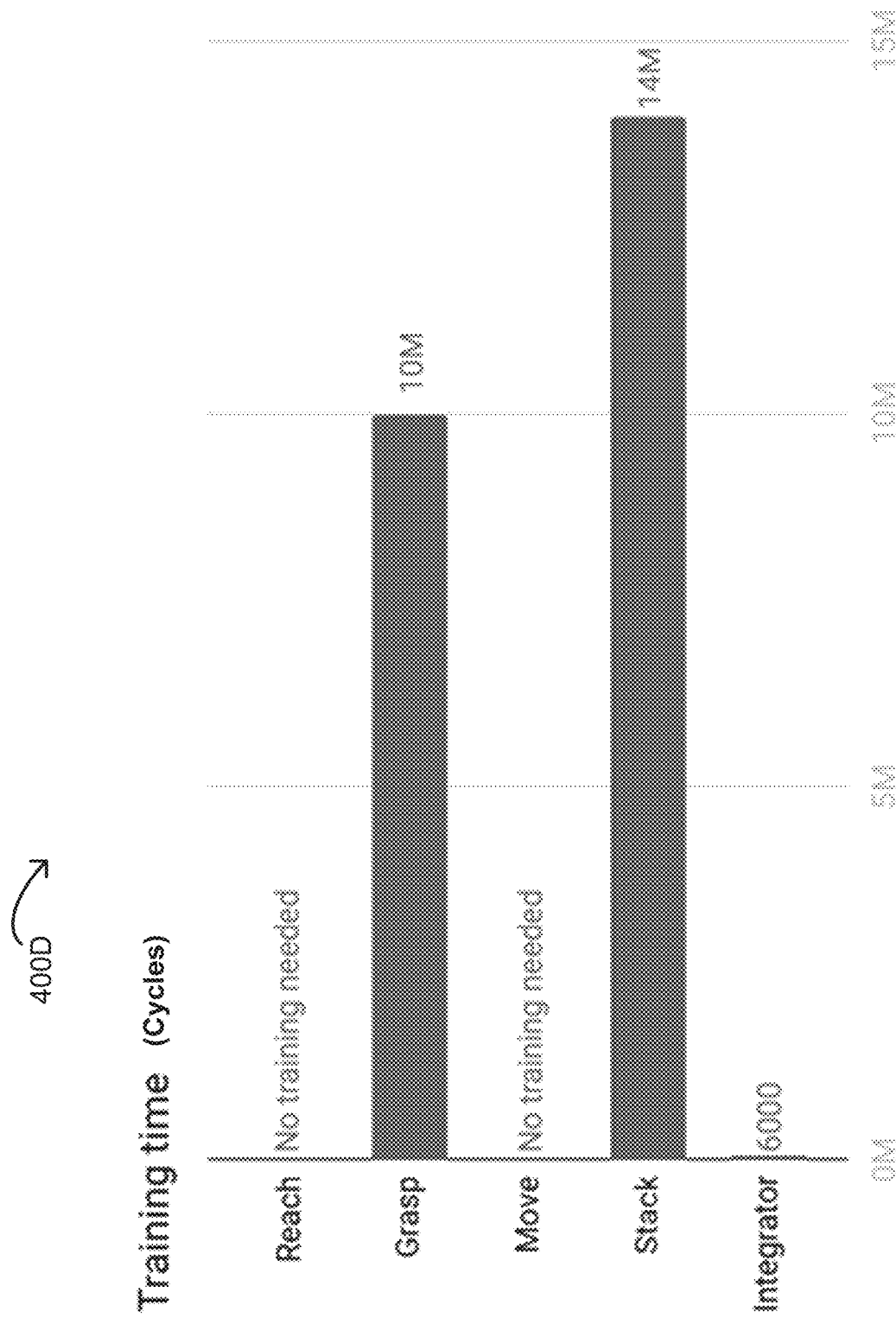
FIG. 4D illustrates a block diagram of an embodiment of a graph of the training of two or more different sub-concepts corresponding to the individual sub-tasks in the complex task, in parallel, which the parallel training and simpler reward functions speed up the overall training duration for the complex task on the one or more computing platforms.
Figure 4E:
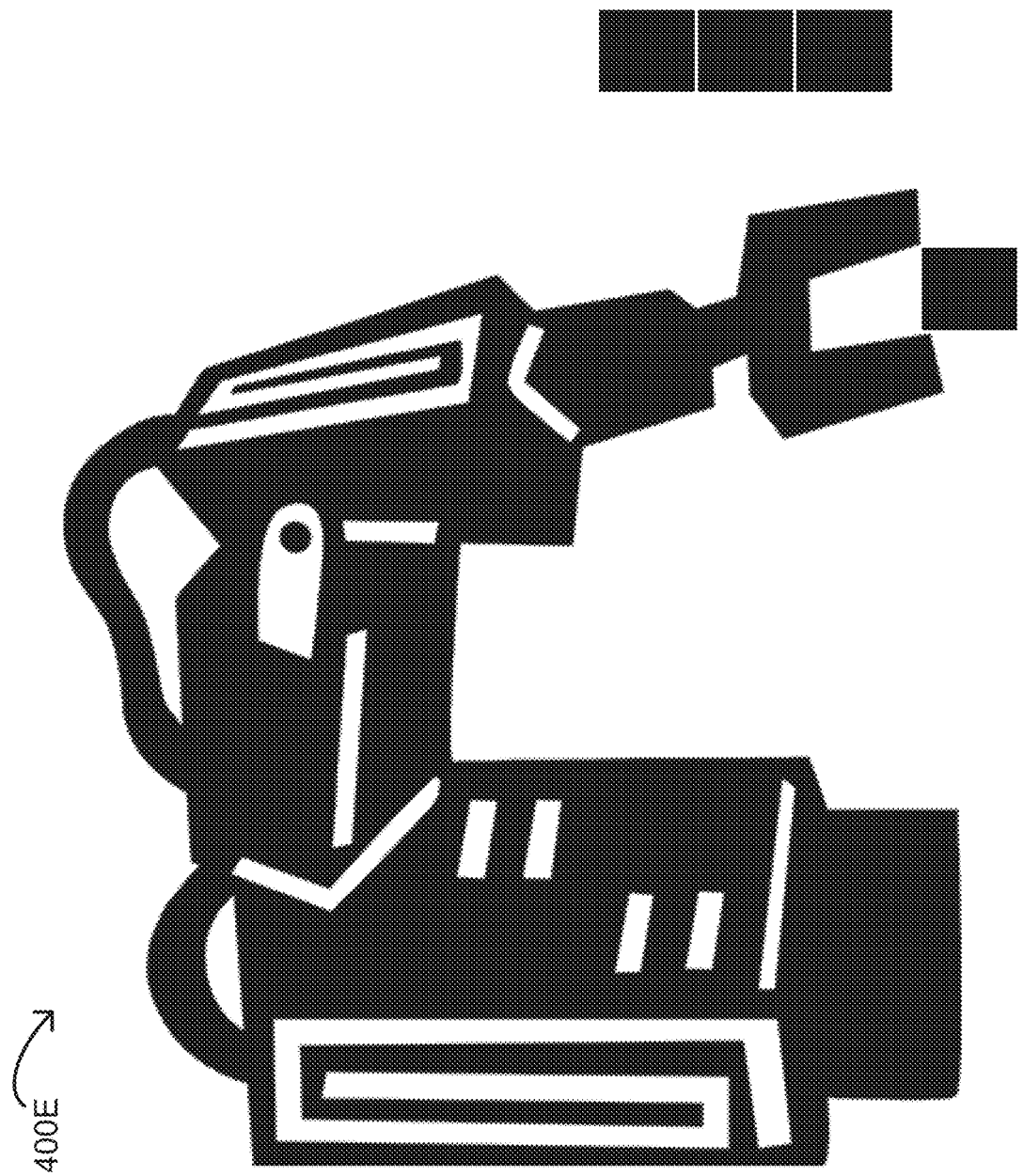
FIG. 4E illustrates a diagram of an embodiment of an example AI model being utilized by a robotic arm to carry out individual sub-tasks in the complex task.

FIG. 4E illustrates a diagram of an embodiment of an example AI model being utilized by a robotic arm 400E to carry out individual sub-tasks in the complex task. Stages of the complex task may include (a) Moving to the object, (b) Reaching for the object, (c) Grasping the object, and (d) Stacking the object on a stack of objects.

Referring back to FIGS. 4A and 4E, the example challenge is Grasp a block and Stack the block on top of another. (See FIG. 4E.) The AI controlled robot must coordinate finger movement as well as differ its block positions and orientations. Dexterity is hard and flexibility to Grasp and Stack in different positions and orientations is a must. The solution is decomposition of the overall task into individual sub-tasks. (See two different example decompositions in FIGS. 4A and 4B.) The AI engine first trained the AI model to learn the concepts of Grasp and Stack using reinforcement learning. These trainings of the different AI objects corresponding to their concepts can be done independently of each other. In addition, multiple simulations may be occurring at the same time for each concept in order to speed up the training on that specific concept. Once the Grasp and Stack concepts are trained, then all four AI concepts are then trained to learn to work with each other. A meta-controller—(e.g., integrator/selector concept)—then learns to combine the newly trained concepts with an existing Move classical controller and a Reach function into a complete Grasp-n-Stack complex task. The integrator quickly learns to select the correct AI concept for that task. The integrator can also very quickly learn, if need be, to slightly adjust the training of each AI concept to have them work together to achieve the main task. The AI engine's method of assembling the concepts successfully solves the entire complex task, and is, for example, multiple times faster than prior techniques in a similar setting.

In parallel to the training of the Stack concept, the instructor module and learner module may cooperate to train the AI object corresponding to the Grasp concept. The instructor module and learner module may cooperate to put in the algorithms and curriculum for the Grasp training. Initially, the AI controlled robot is expected to flail and fail. However, over time, the AI controlled robot learns what to do based on the reward the AI engine gives the AI controlled robot (for success).

In parallel to the training of the Grasp concept, the instructor module and learner module may cooperate to train the AI object corresponding to the Stack concept. The instructor module and learner module may cooperate to put in the algorithms and curriculum for the Stack AI concept to train on.

Note, for designing reward functions within the Grasp and Stack concepts, a concept of orienting the hand for Grasping and/or Stacking the object can be learned. (See difference between FIGS. 4B and 4A.) Thus, referring to FIG. 4B, to further simplify the learning problem, the modules further break the top level concept of Grasp into a lower level of two concepts of: Orienting the hand around object in preparation for Grasping, and Pinching the object. Likewise, the modules further break the top level concept of Stacking into a lower level of two concepts: Orienting the hand around object in preparation for stacking, and Orienting the stack, for a total of eight actor concepts in the concept network.

Moreover, the AI system may explore creating and training with two or more concept node hierarchies in order to improve the speed and/or accuracy of the resulting AI model. For example, the AI engine may explore by creating and training a single integrator node with four children sub nodes (see FIG. 4A), and a multi-level tree with four children sub nodes and two of these with their own integrator and children concept nodes (see FIG. 4B), both in parallel at the same time. In this small set of concepts, there may be little benefit to nesting integrators in this way. However, as the size of the tree of nodes scales, the ability to encapsulate sections of the problem and separately learn the correct circumstances in which to invoke concepts to solve that sub problem will improve training parallelization, help keep large concept trees organized, and bound the complexity of the task any single integrator must learn. Thus, the process may vary where the decomposition and combination occurs within a single AI object corresponding to that concept. See, for example, the different level of decomposition between the Grasp concept in FIGS. 4A and 4B. In FIG. 4A, the modules combine individual sub-tasks making up the concept of Grasp. In FIG. 4B, the modules separate out the individual sub-tasks making up the concept of Grasp.

Using hierarchical decomposition with deep reinforcement learning, the AI engine platform achieves for example, a robotics control benchmark, with an order of magnitude fewer training cycles. Thus, an enterprise could use hierarchical decomposition process of breaking down the overall task into multiple smaller tasks being trained in parallel rather than using a single end-to-end algorithm. Once each AI object corresponding to a given concept is trained on its corresponding individual task, then all of the trained AI objects can be trained to work with each other to achieve the overall task. This process trains multiple AI concepts in parallel and then combines the trained versions of the concepts to achieve a similar desired result to the one end-to-end algorithm but in a faster amount of time and possibly with better accuracy. For example, a simulated robot or CNC machine may successfully train upon the individual sub-tasks of i) Grasping a block and ii) Stacking the block on top of one another, in parallel to each other and apply deep reinforcement learning algorithms to learn these concepts. Training a system using multiple concepts, for example, the concepts of Reach, Grasp, and Stack, can be trained on individually and in parallel to each other, which requires far less training time and computing cycles. Next, those trained concepts can be trained to work with each other to accomplish the end result of what the single end-to-end algorithm would typically accomplish.

In addition, differently trained AI objects can be assembled into the AI model in order to decrease an overall training time. Thus, AI objects of the AI model may include a blend of at least a first set and second set of AI objects being trained by the instructor module via reinforcement learning, such as the Grasp, the Stack, and the Orient concepts, and a third set of AI objects that are configured to operate in two ways: 1) as control nodes where one or more actions are produced by the code this node and/or 2) this node just implements a data transformation step. This all may occur while a conductor service manages multiple simulations from the data sources in parallel at the same time to train the first and second sets of AI objects with the deep reinforcement learning.

Individual concepts in a network can be easily replaced with alternate implementations, allowing easy experimentation and incremental improvement—a hard-coded controller can be replaced with a learned one, or an intractable concept can be further subdivided, all without requiring any change in the rest of the concept network. Additionally, the independence among all children of an integrator typically allows them to be trained in parallel.

In addition, the trained AI objects corresponding to different concepts making up the AI model can be replaced without retraining the overall system. For example, the system could adapt to a Grasp concept with different training and parameters without having to change the AI objects corresponding to the Reach, Move, or overall integrator concepts.

In an embodiment, because an integrator treats its child concepts as black boxes, each can be implemented using the training technique (i.e., algorithm), most appropriate to the problem. In robotics, for example, the complex task requiring dexterous manipulation like Grasping may be implemented with deep reinforcement learning, while well-characterized tasks like Moving between work spaces can be handled by inverse kinematics. For the same reason, entire concept networks are re-usable and composable: a solution to one problem can be used as a component in a larger problem.

In addition, hierarchical decomposition makes the AI model more explainable than monolithic training methods by seeing the concepts activated by each integrator gives a higher-level of insight into the behavior than simply seeing the low-level sub-tasks at each time step.

Hierarchical Deep Reinforcement Learning for Flexible Dexterous Manipulation

In an example use case, the system may use hierarchical decomposition, deep reinforcement learning for flexible dexterous manipulation by a robot (see FIG. 4E). The AI engine machine teaching platform enables subject matter experts to teach an AI concept how to solve complex problems. A key feature of the platform is the ability to decompose complex tasks using concept networks—distinct aspects of the main task that can be trained separately and then combined using an integrator component. This approach may be used to solve a complex robotics task requiring dexterous manipulation, for example, using a simulated robot arm to pick up an object and Stack it on another one. The AI engine applied this decompositional approach, improving training efficiency and flexibility.

Learning is also greatly enhanced from interacting a simulation with feedback from a real world environment. As a result, it is important to understand whether or not a system's operations and interactions with its environment can be simulated, or modeled. A deep reinforcement learning iterative learning process with the AI software can be very effective. Overall, the AI objects corresponding to concepts can learn individual tasks in a simulation/modeling world. Next, the trained AI objects will apply the trained concept in a real world situation. Next, the trained AI objects incorporate learned feedback about working in the real world back into a simulation environment to refine/tune the training of the concept(s). Lastly, the trained AI objects then apply the refined trained concepts in the real world again.

For example, in each iteration, the machine learning software makes a decision about the next set of parameters for friction compensation and the next set of parameters for motion. These decisions are made by the modules of the AI engine. It is anticipated that the many iterations involved will require that the optimization process be capable of running autonomously. To achieve this, a software layer is utilized to enable the AI engine software to configure the control with the next iteration's parameterization for friction compensation and its parameterization of the axis motion. The goal for deep reinforcement learning in this example user's case is to explore the potential of the AI engine to improve upon manual or current automatic calibration. Specifically, to eliminate the human expert and make the AI the expert in selecting parameter values, equal or improve upon the degree of precision, reduce the number of iterations of tests needed, and hence the overall time needed to complete the circularity test. The AI engine is coded to understand machine dynamics and develop initial model of machine's dynamics. Development of a simulation model is included based on initial measurements. The AI engine's ability to set friction and backlash compensation parameters occurs within the simulation model. After the initial model training occurs, then the training of the simulation model of friction and backlash compensation is extended with the advice from any experts in that field. The training of the simulation model moves from the simulation model world, after the deep reinforcement learning is complete, to a real world environment. The training of the concept takes the learning from the real machine and uses it to improve and tune the simulation model.

FIG. 4B illustrates a block diagram of an embodiment of an AI model 400B learning a complex task with multiple hierarchical levels of concept nodes.

As previously discussed, the complex task is composed of several concepts horizontally across its graph, such as Reaching, Moving, Grasping, and Stacking, that are independent of one another. The top level Grasp-n-Stack concept incorporates an integrator concept. The next level down concepts of the Grasping concept and the Stacking concept each incorporate an integrator concept. The graph vertically has levels. For example, the Grasp concept is made up of the concepts of Orient and Pinch. Likewise, the Stack concept is made up of the concepts of Orient the block and the Stack of blocks orientation.

For FIG. 4B, each learned actor concept has its own reward function, independent of the overall problem. Each AI object corresponding to its concept is trained in order once its precursors in the concept graph have been trained. First, the AI engine trains the concepts of orient and pinch independently and then the combined Grasp concept is trained. Likewise, Stack and Reach concepts are trained. Any of these concepts may have been previously pre-trained and just being reused in this task. The trained concepts are combined with the Move classical controller. Once these concepts are trained, the AI engine trains the top level Grasp and Stack concept. Also, the AI engine using the hierarchal decomposition technique allows existing solutions to sub-problems to be composed into an overall solution without requiring significant re-training, regardless of the algorithms and state space definitions used to solve each sub-problem.

As discussed earlier, this concept network using reinforcement learning facilitates an industrially applicable approach to solving complex tasks through problem decomposition, simplified reward function design, parallel training quickly and robustly, and producing a policy that can be executed safely and reliably when deployed.

Again FIG. 4B shows three integrator nodes, three control concepts, and three classical controllers. The Grasp-n-Stack AI object, the Grasp AI object, and the Stack AI object, each incorporates an integrator node. Both Orient the hand concepts are learned concepts as well as the Orient the stack of blocks concept. The Reach, Move and Pinch concepts may be implemented as classical controllers. Each node also implicitly takes the state as input, and can be paired with input and output transformations.

FIG. 4C illustrates a block diagram of an embodiment of a complex main task and its graph 400C of i) a concept node corresponding to an integrator task, and ii) one or more levels of concepts corresponding to the individual sub-tasks that hierarchically stem forth from the integrator task in the graph of the AI model.

The integrator/selector/meta controller is configured to select from different sets of concept nodes, such as concept 1, concept 2, and concept 3, to compute one or more sets of concept nodes that need to be computed based on the data and state from the data source. The AI engine solves each concept, as an individual sub-task, separately; and, the meta-controller/selector/integrator component/concept may then also be used to combine them, concept 1, concept 2, and concept 3, into a complete solution for the complex task.

There can be three or more types of concepts including: 1) actor concepts, which define sub-tasks to take in certain situations, 2) integrator concepts, which choose which one of their concepts will act next, and 3) perceptor concepts, which, transform low-level state input into higher level perceptual features that are more useful for subsequent concepts. The overall concept network is a directed acyclic graph, with the overall system state coming in, perceptor, actor, and integrator concepts in the middle, producing the final action to execute in the environment.

Integrator Concepts

The figure shows an example structure of an integrator concept. The integrator accepts the state from the environment and chooses one of a set of child concepts, which can be either other integrators or concepts. The chosen child concept's policy then interacts with the environment, receives data and states, and then generates sub-tasks to transition the environment until the child node reaches its terminal condition. Thus, once chosen, a child concept executes until it reaches a terminal condition. At the terminal condition, the integrator again receives the new state, data, and the new value of its own reward function, and makes a new choice. Execution can recursively descend through several integrators in turn before an actor concept is reached. Note, treating skills implemented by child nodes as discrete units for the integrator speeds exploration and avoids unnecessary backtracking (if a new child concept could be selected for each time step, one concept's policy could undo the progress made by another).

The integrator's dependent nodes in the graph can be treated as a policy-implementing black box. This allows the integrator to be nested: simple skills may be grouped together under an integrator to form a more complex skill, which may in turn be selected by its parent.

All non-leaf nodes may be integrator nodes. Training proceeds in the graph of nodes from the bottom-up. First, the leaf nodes are trained. Next, inner nodes going up the graph up to the root node are trained. Each integrator node learns how to select which already trained child node to execute as well as an alternative (hidden) delta concept it has inside. The exception to the above is the case where a non-leaf concept node takes as input from a particular Gear node which is only transforming the data. In this case this inner node is not an integrator. In a more general formalism, all leaf-nodes generally are not integrators and inner nodes may or may not be integrators, and the top root node will be an integrator. These integrator nodes behave as a selector selecting amongst children sub concepts and a potentially if one exists an internally synthesized delta network (hidden concept).

Integrators are trained using a discrete action algorithm. Because the chosen policies are trained separately and treated as a black box that executes a policy to termination, reward functions for integrators can be simple, typically rewarding progress toward an overall goal. If the integrator's task can be solved with a small number of child policy executions, or the right child node to pick is easy to deduce from the state, integrators are also very quick to train.

The concept node of the integrator task can be trained via reinforcement learning to learn to choose a sub-task recommended from the two or more AI objects in the levels stemming from the integrator node in the graph by choosing a particular sub-task that is considered most applicable based on a current state data. This is a discrete reinforcement learning problem, that the AI engine solves with an example learning algorithm, such as the DQN algorithm, using overall task success as the reward. (Note, any discrete reinforcement learning algorithm could be used.) To make this effective, the AI engine may not choose a new concept at each time step but rather train a specific concept until it reaches a termination condition. The integrator may use concepts with a long-running termination condition: each concept can have pre-conditions for when it can be selected, and a run-until condition to meet before switching to another individual sub-task. This gives the designer an easy way to specify constraints like "don't try to Grasp until you're close to the object", and "once you start to move, continue that for at least 100 time steps".

In an example, here is how to specify the above using a coding language such as the Inkling™ language: <code snippet, with syntax highlighting>

Here's what an example scripted code could look like in an example language, Inkling language, for machine teaching:

```
# ... schema and gear declarations ...
# move isn't learned -- it uses a provided controller
external reach is reach_gear
    follows input(State)
end
# Grasp will be learned by our system
concept Grasp is estimator
    predicts (ManipulatorCommand) # the sub-task
    follows input(State) # the input
end
# move isn't learned -- it uses an provided controller
external move is move_gear
    follows input(Command)
end
concept Stack is estimator
    predicts (ManipulatorCommand)
    follows input(State)
end
# This is the integrator, which picks one of the sub-tasks
# from the preceding concepts.
concept pick_and_Stack
    predicts (Command)
    follows Reach, Grasp, Move, Stack
```

```
    feeds output
end
# ... curriculum declarations: how to train each learned concept ...
# ... schema and gear declarations ...
# move isn't learned -- it uses a provided controller
external reach is reach_gear
    follows input(State)
end
# grasp will be learned by our system
concept grasp is estimator
    predicts (ManipulatorCommand) # the action
    follows input(State) # the input
end
# move isn't learned -- it uses on provided controller
external move is move_gear
    follows input(Command)
end
concept stack is estimator
    predicts (ManipulatorCommand)
    follows input(State)
end
# This is the integrator, which picks one of the actions
# from the preceding concepts.
concept pick_and_stack
    predicts (Command)
    follows reach, grasp, move, stack
    feeds output
end
# ... curriculum declarations: how to train each learned concept ...
```

The graph of concept nodes making up the AI Mental Model may be at least two or more levels deep as well as two or more branches horizontally across. (See FIGS. 4A, 4B and 4F for example.) Each integrator node can select a first set of concept nodes from two or more sets in the graph of the complex task to be trained on and computed. The integrator can observe a state of a data source generator, such as a simulator, to supply data to train the AI model and then based on i) the state of the data source, ii) all of the concept nodes in the first set using similar supplied data to train on, or iii) both, and then select the first set of concept nodes from the two or more sets of nodes in the graph to receive its input data from the data source generator. For each, based on the state or supplied data, the integrator node can select merely, for example, the Grasp concept this training iteration to be trained.

A node in the graph takes as inputs the state as well as potentially modified states that come from other concepts producing a transformation of the data. For example, Gears node could provide a transformation. Based on the state and/or modified states being provided, a concept then produces an action. If it is an integrator it then selects between sub-tasks, which one should be executed. The sub-task selected then recursively selects the next from its children sub-tasks.

Each integrator node in the graph of nodes is configured to evaluate in turn, based on data from the simulator, which of the nodes in the graph are currently appropriate to solving its sub task, and merely those nodes so chosen will be further provided with data from the simulator and evaluated, which saves an amount of computing power and cycles compared to computing all of the nodes making up the AI model each evaluation cycle.

Thus in this example in FIG. 4B, merely the set of the Orient concept, the Pinch Concept, the Grasp concept, and the Grasp-n-Stack concept are being trained and computed. The data source will supply the data to the first set of concept nodes that need to make their individual computations as well as to the integrator, which the integrator checks to see that the computations for all of the needed nodes merely in the first set of nodes occur, which saves an amount of computing power and cycles compared to computing the all of the nodes making up the AI model each training cycle. The data source will supply the data to the concept nodes that need to make their individual computations as well as to the integrator, which can make the computations for that combined set of nodes. Computations for that set of nodes in the routing path will be calculated; as opposed to, calculating the computations for all of the nodes in the entire hierarchy of the graph of nodes.

Actor Concepts

An actor concept, such as the Grasp concept, takes state as input and produces an action, which can be single-step or a multi-step policy. Actor concepts can be learned i) using reinforcement learning, ii) can use a manually coded controller, e.g., using inverse kinematics, or iii) can be implemented using a pre-trained neural network based controller, perhaps re-used from another concept network. A policy can even combine learned behavior on part of the action space and hard-coded behavior on the rest: for example, when learning to orient the gripper in an example robotics task, the AI engine may hard code that the gripper fingers should be open, and let the network learn to control the other arm joints.

The black-box nature of concepts allows each one to transform the state space and action spaces as appropriate for the individual sub-task. On input, the state space of the individual sub-task is converted to an appropriate form, e.g., by omitting irrelevant elements or augmenting with derived properties. The learning problem is solved with the transformed input and an appropriate action space, and that action space is then transformed back to the individual sub-task's action space.

Each learned actor concept has its own reward function, independent of the overall problem. Thus, reward shaping considerations are encapsulated within concepts, and must only be defined on the relevant portions of the concept's state and action space. Each learned actor concept can also be trained with the most appropriate learning algorithm for that individual sub-task. This ability to customize the training approach for each sub-problem speeds up an individual sub-task's design and iteration, and can significantly speed up training.

Once an actor concept is run, it continues to execute its policy until it hits one of its execution terminal conditions. Recall that terminal conditions may be based on state, defining a subset of the state space where the policy is defined. If an integrator chooses an actor concept when the state is in one of the terminal regions, the actor returns a no-op action. During training, the integrator learns that concepts chosen outside their working areas do nothing. Thus, the terminal conditions for each concept also serve as constraints on the activation of its policy, ensuring it can only execute its policy in regions of state space it has explored during training and in which its policy has been well characterized and deemed safe. Without such constraints, the undefined behavior of reinforcement learning-based control policies outside the state space they have explored during training can pose a significant safety hazard when deployed into production. The terminal conditions can be configured differently during training and deployment. This can be used to provide an additional margin for error, or further restrict the work space where execution of a given skill is permitted.

Perceptor Concepts

Perceptor concepts transform information about the state into a perception that is used as input for concepts further along in the graph. This is typically used to convert environment state into a simpler or higher level form. Typical perceptor concepts are taking visual input and converting it into an object identification, or converting textual data into a topic vector and a sentiment estimate.

Just like actor concepts, perceptor concepts can be hard-coded, pre-trained, or learned. Typically, a learned perceptor concept would be trained using supervised learning.

The system can treat perceptor concepts as part of the state pre-processing of individual policies. The reason the system distinguishes them as a separate concept type is to allow a single state transformation to be included as input to many other concepts.

FIG. 4D illustrates a block diagram of an embodiment of a graph 400D of the training of two or more different sub concepts corresponding to the individual sub-tasks in the complex task, in parallel, which the parallel training and simpler reward functions speed up an overall training duration for the complex task on the one or more computing platforms.

The AI engine using machine teaching provides the abstraction and tooling for developers, data scientists, and subject matter experts to teach domain specific intelligence to a system. Developers codify the specific concepts they want a system to learn, how to teach them, and the training sources required (e.g., simulations, data), using a pedagogical software programming language, such as Inkling™. The system then teaches each individual AI object on learning its particular skill, on its own, which will go faster than trying to train on that skill while additional variables are being thrown into that training curriculum from other concepts.

Concepts can be broken down into smaller individual sub-tasks and then training occurs specifically for a concept starting at its lowest level of decomposition (i.e., the leaf in a tree structure). For example, looking at the graph 4D and FIG. 4A, the "Grasp the object" concept and the "Stack the object" concept sub-tasks are simple tasks for which the AI system uses deep reinforcement learning. The AI engine trains the Grasp concept and Stack concept with reinforcement learning, using, for example, a TRPO algorithm.

Training the Stack concept, for example, took <14 million simulator training cycles>, which is equivalent to <139 hours> of simulated robot time. The Grasp concept was, for example, slightly <faster>, taking <125 hours> of simulated robot time.

Note, looking at the graph 4D and FIG. 4A, the "Reach toward the object to pick up" concept and "Move toward target block" concept sub-tasks are simple motions for which the AI system uses a classical motion controller. The classical motion controllers are already fully "trained" and need no additional training to perform that function. The AI engine allows users to integrate such classical controllers mixed with other concepts trained with reinforcement learning through, for example "Gears™" functionality. In the graph, then an integrator concept took, for example, 6000 training cycles to integrate the four concepts of i) Grasp, ii) Stack, iii) Reach, and iv) Move to achieve the proper success and reward function of the Grasp-n-Stack concept of the overall complex task.

Looking at the graph, learning the Stack concept dominated training time for the AI system at about 14 Million samples, corresponding to 139 hours of training time. However, the Grasp concept may be trained in parallel by another simulator or data source. The Move and Reach concepts did not require any training, and the integrator trains very quickly—orders of magnitude faster than the guided-retraining approach used in an example prior technique. Thus, the AI engine platform achieves a control benchmark, with an order of magnitude fewer training cycles. By scaling and training on multiple computing platforms, the duration for the training is decreased to substantially the time needed for learning the Stack concept and then integrating the four concepts.

The AI engine splits the problem into simpler sub problems, which allows decomposing a reward function in multiple simpler reward functions; ensures consistency between Grasp orientation and the orientation needed for Stacking and assembles the AI concepts into the AI model.

In this example, a dexterous robotic is trained using hierarchical decomposition, deep Reinforcement Learning that blends reinforcement learning and classical control while running and managing multiple simulations in parallel for the reinforcement learning.

Each concept can have different state+ action spaces. Typically, these state+ action spaces can be smaller than a globally-applicable state/action space, which makes the problem easier and learning faster. Since the sub-concepts are much simpler, their goals can be defined on subsets of state space, significantly constraining the necessary exploration and leading to data-efficient learning even in complex environments. The AI engine can mix neural and classical controllers in the same task. The AI engine can enable hierarchical decomposition—a single concept can itself be an integrator choosing among subcomponents. The AI engine can use this to split Grasp-n-Stack concept into four sub concepts of i) Grasp, ii) Stack, iii) Reach, and iv) Move. Each of these concepts, such as the Grasp and Stack concepts, can be trained in parallel.

Multiple Managed Simulations Occurring at the Same Time to Decrease an Overall Training Time Multiple managed simulations occurring at the same time to train multiple AI concepts, improves the system's capability to extract and optimize knowledge faster from large and complex simulations and data, makes users using the system more productive, and decreases the duration of training to accomplish a complex task. Each concept, such as Grasp, may be trained in a parallel with another concept. In addition, already trained concepts, such as Reach, may be incorporated into the AI model. In addition, multiple versions of a particular concept may be trained in parallel with each other.

The goals of multiple managed simulations with the same AI engine is to:
 Enable multiple managed simulations running in one instance in the cloud (public cloud, virtual private cloud, private cloud (including an on-premises installation of the AI engine)) to train that concept.
 Enable multiple simulations running on one computer (offline) to train that concept.
 Scale the training performance linearly (or nearly linear) with the number of simulators.
 Alternatively, enable multiple managed simulations running in multiple instances in the cloud (public cloud, virtual private cloud, private cloud) or on premises to train that concept.
 Enable multiple simulations running on multiple instances in the cloud (public, VPC, private cloud) to train multiple concepts.

$$\text{Performance} = \frac{\text{Time to train concept with 1 simulation}}{\text{Time to train concept with N amount simulations in parallel}}$$

For AI engine's purposes, the engine will consider performance to be efficient when it's close to or equal number of simulations being used to train the concept.

With that being said, it is important to note that increasing the number of simulations running at the same time doesn't, at all times, increase the performance. There are bound to run into potential cases, where depending on the problem size, the performance, at times, may remain constant or decrease with the increase in number of simulations. In these instances, it's best to stick to the point before the system starts getting diminishing returns.

Problems the AI engine overcomes include but are not limited to:
1) An AI team spends too much of time (~XXX hours) waiting on the training of complex task to complete, especially when they run experiments in the 'exploration branch'.
2) A user can run into problem(s) making it a difficult and slow process to optimize their simulation, at scale, running a single simulation to train on all of the concepts in the complex task at the same time.
3) A user's may not be able to use an optimized, relatively simple simulation and small datasets, focus on that 'singular' task.

The AI system allows:
 i) optimizing multiple control systems at once; and
 ii) supporting users looking to utilize big data sets for simulating multiple tasks and training multiple concepts at once with the big data sets.

The AI engine using hierarchical decomposition, deep Reinforcement Learning may process high volume, high velocity, and high variety information (from data sources such as datasets and simulations) faster to enable enhanced decision making, surface insights, and optimize processes faster by utilizing multiple simulations to train concepts on the following environments:
 Public cloud (e.g., WS, Azure);
 Virtual private cloud (VPC) in a public cloud (e.g., Private clouds in AWS and Azure); and
 Private cloud (including an On-premises installation).

Figure 5:
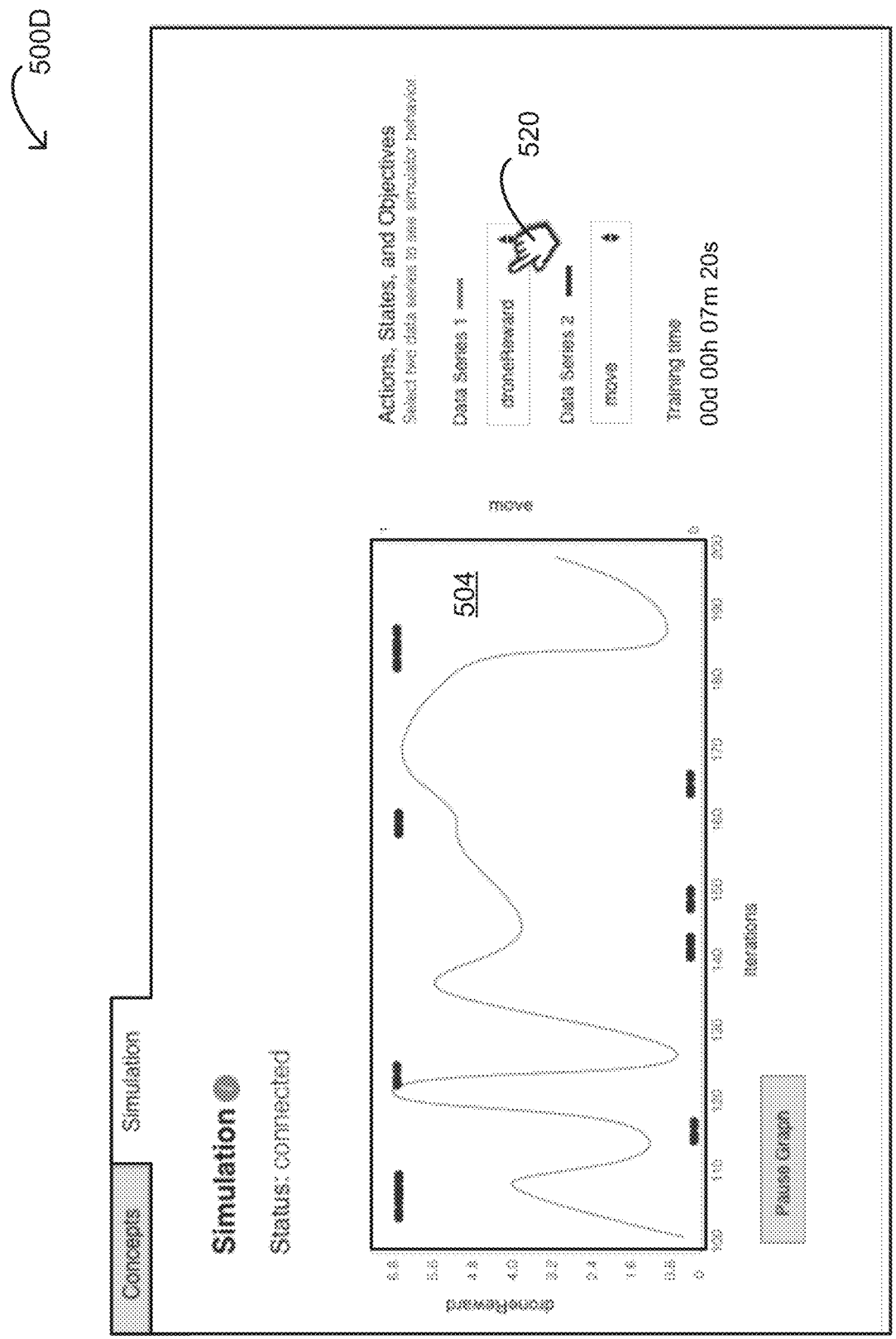
FIG. 5 illustrates a block diagram of an embodiment of a user interface for a simulator training one or more concept nodes using reinforcement learning to learn to choose a sub-task recommended from the two or more AI object in the levels stemming from the integrator.

FIG. 5 illustrates a block diagram of an embodiment of a user interface 520 for a simulator training one or more concept nodes using reinforcement learning to learn to choose a sub-task recommended from the two or more AI object in the levels stemming from the integrator. The system may implement a form of deep reinforcement learning in contrast to a standard notion of running a single end-to-end algorithm training. In the deep learning, the concept nodes of the AI model being trained interact with an environment over time. In an embodiment, at each time step, the concept node receives a state in a state space, and selects an action from an action space, and follows a policy, which controls the concept node's behavior, i.e., a mapping from a state to actions, then receives a scalar reward, and transitions to the next state, according to the environment dynamics, or model, for the reward function. The concept node also receives feedback from its selected actions and performance and then evaluates the feedback to alter its training.

Figure 6:
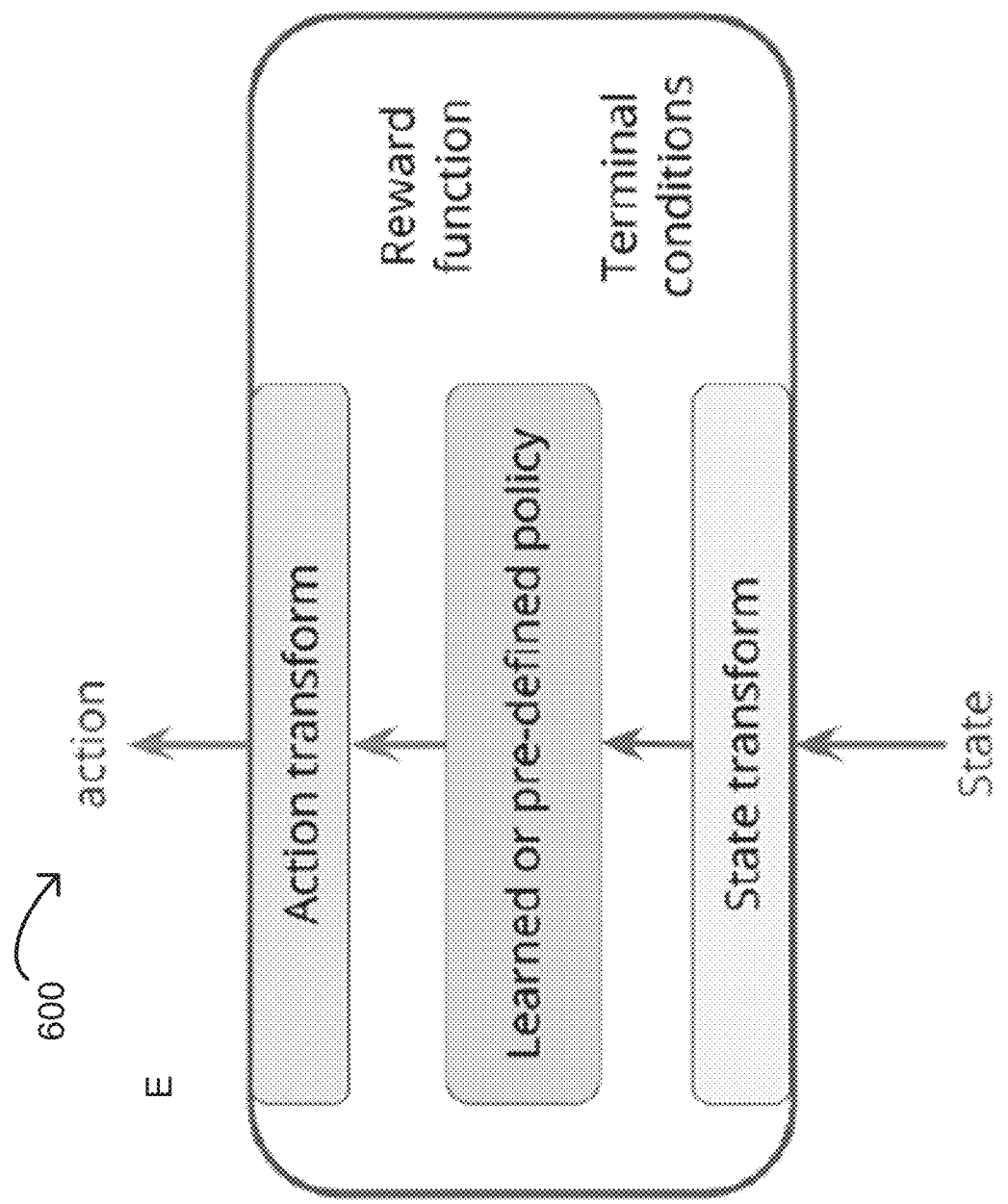
FIG. 6 illustrates a block diagram of an embodiment of the AI engine using simpler reward functions focused for solving each individual sub-task.

FIG. 6 illustrates a block diagram of an embodiment of the AI engine 600 using simpler reward functions focused for solving each individual sub-task.

A concept interacts with reinforcement learning with an environment 'E' in discrete time steps. At each time step in the training, the concept observes a state, performs an action, transitions to a new state, and receives feedback reward from environment 'E', such a robotic arm successfully stacking a prism on a stack.

An example reinforcement learning problem is where a concept 1 interacts with the environment 'E' in discrete time steps. At each time step 't', the agent observes a state 'st 2 Rn', performs an action at '2 Rn', transitions to a new state 'st+1 2 Rn', and receives feedback reward 'rt 2 R' from environment 'E.' The goal of reinforcement learning is to optimize the agent's action-selecting policy such that it achieves maximum expected return of the feedback reward 'rt 2 R' potentially averaged over moving window of 'X' amount of time steps/training cycles.

The AI engine solves complex tasks using reinforcement learning to facilitate problem decomposition, simplify reward function design, train quickly and robustly, and produce a policy that can be executed safely and reliably when the resulting trained AI concept is deployed. The state vector provided to the AI concept can vary from AI concept to AI concept, as may the action space.

In an embodiment, a learned actor concept's reward function could be defined in terms of the concept's transformed state, and may not be not visible to the rest of the concept network. An AI concept can include both state and action transformations. The reward function and terminal conditions for a state can be written in terms of the concept's transformed state, and are independent of the rest of the concept network.

Figure 4F:
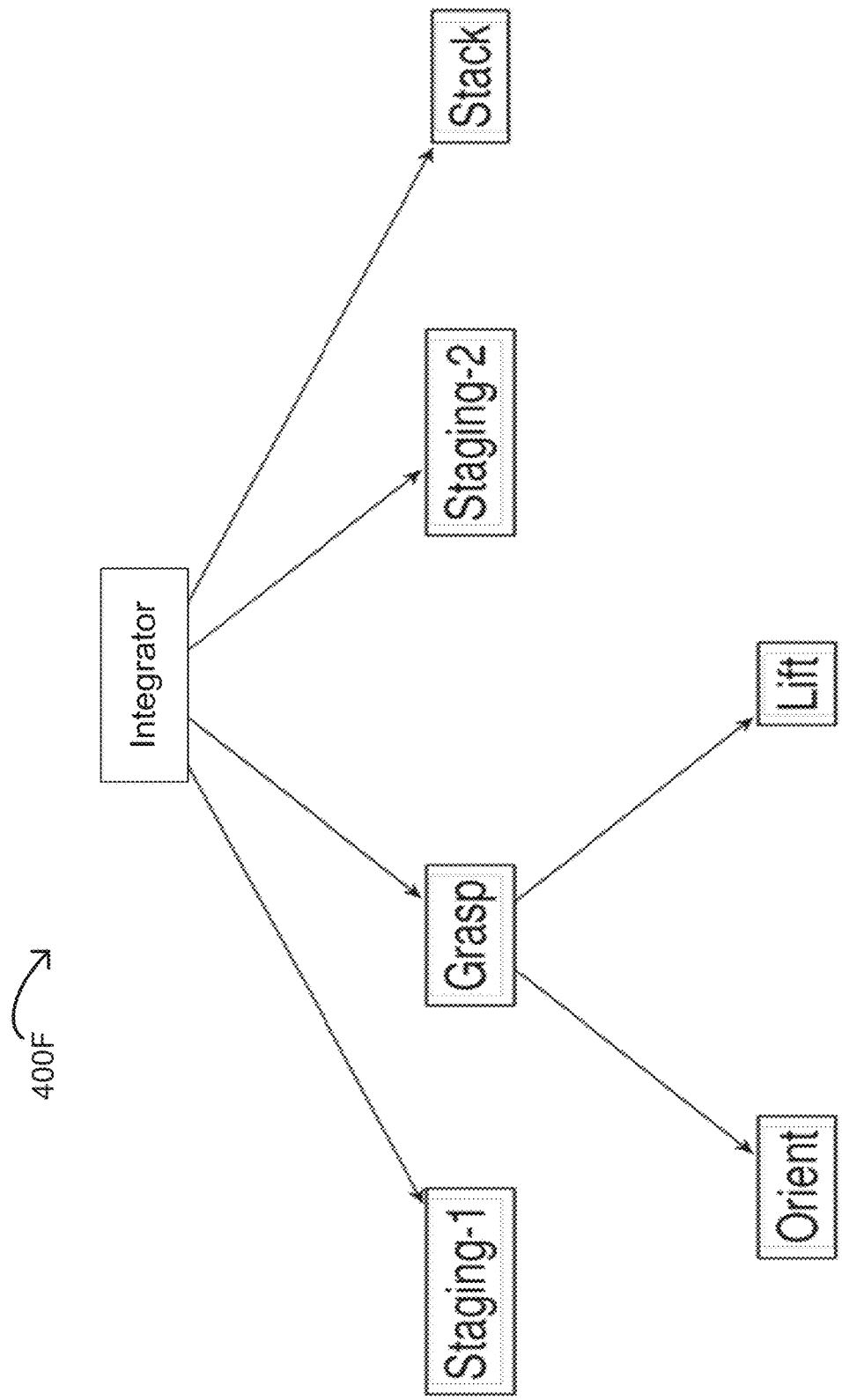
FIG. 4F illustrates a block diagram of an embodiment of the AI engine that solves the example "Grasp and Stack" complex task with concept network reinforcement learning.

FIG. 4F illustrates a block diagram of an embodiment of the AI engine that solves the example "Grasp and Stack" complex task 400F with concept network reinforcement learning. In this example, the AI engine solves the example complex task of Grasping a rectangular prism and precisely Stacking it on top of a cube. The AI engine initially broke the overall task down into four concepts: 1) Reaching the working area (staging 1), 2) Grasping the prism, 3) Moving to the second working area (staging 2), and 4) Stacking the prism on top of the cube. The Grasp concept can further be decomposed into an Orient the hand concept and Lift concept. Thus, to simplify the learning problem by using a single policy for each individual sub-task the concept of Grasp, the AI engine broke the Grasping concept into two more concepts: Orienting the hand around the prism in preparation for grasping, as well as clasping the prism to Lift the prism, for a total of five actor concepts in the concept network. Three of these concepts—Orienting, Lifting, and Stacking used the TRPO algorithm to train, while the Reach concept (Staging-1) and the Moving concept to the working area (Staging-2) were handled with inverse kinematics.

Again, the state vector provided to the AI concept can vary from AI concept to AI concept, as may the action space. In this example complex task, all sub-tasks correspond to target velocities for one of nine associated joints. The example action and state vectors are described in Table 1 and 2, while the rewards and terminals are described in the appendices A and B, respectively.

State Spaces, Action Spaces, and Rewards

TABLE 1

State vectors for each of the three concepts plus selectors.

Orient Concept - State:
For the six joints excluding the fingers:
1. The sine and cosine of the angles of the joints.
2. The angular velocities of the joints.
3. The position and quaternion orientation of the prism.
4. The orientation of the line between two of the opposed fingers in degrees normalized by 90_.
5. The Euclidean distance between the pinch point of the opposed fingers and a point 1:5 cm above the prism.
6. The vector between the same two points above.
Lift Concept - State:
For all nine joints:
1. The sine and cosine of the angles of the joints.
2. The angular velocities of the joints.
3. The Euclidean distance between the pinch point of the opposed fingers and the center of the prism.
4. The vector between the same two points above.
5. The XY vector between the center of the prism and the starting position of the prism.
Stack Concept - State:
For the six joints excluding the fingers:
1. The sine and cosine of the angles of the joints.
2. The angular velocities of the joints.
3. The position and quaternion orientation of the prism.
4. The position and quaternion orientation of the cube.
5. The Euclidean distance between the bottom of the prism and top of the cube.
6. The vector between the same two points above.
Selectors Concept - State
1. The position of the pinch point between the opposed fingers.
2. The Euclidean distance between the pinch point and the prism.
3. The position of the center of mass of the prism.
4. The position of the center of mass of the cube.
5. The Euclidean distance between the bottom of the prism and the top of the cube.

TABLE 2

Action vectors for each of the three concepts.

Concept - Orient: sub-task - Target angular velocities for the 6 joints not including the fingers. Fingers extend maximally.
Concept - Lift: sub-task - Target angular velocities for the upper arm (1st, 2nd, and 3rd joints), and opposed fingers (7th, and 9th joints). Remaining finger receives no command.
Concept - Stack: sub-task - Target angular velocities for the 6 joints not including the fingers. The fingers close with moderate force.

Reward Function

As discussed previously, the full control concept is decomposed into separate "Grasp" and "Stack" concepts (skills), while Grasp itself is decomposed into "Orient" and "Lift". The example shaping reward functions used for the training of each concept are listed below.

Orient-Reward function:

$$r\theta = 1 - (0.5(\min(\theta x, \theta y)/45° + \theta z/90))^\alpha$$

where rθ is the angular component of the shaping reward for Stack and orient, θx, θy, and θz are the angle between the line passing through the two opposed fingers and the x, y, or z axes in the reference frame of the target object, respectively, and $\alpha$ controls the sharpness of the shaping. Since the objects are symmetrical in x and y, we allow any of the four orientations of the fingers that line up with the x or y axes by only looking at the smallest angular distance to either the x or y axis, yielding a distance that ranges from 0 to 45 degrees. The z should uniquely line up with the object, and ranges from 0 to 90. Here, we used an $\alpha$ value of 0.4.

$$rd=1-(d/d\,max)^\alpha,$$

where rd is the shaping reward for the reaching toward the goal location, d is the distance between the pinch point of the opposed fingers and the goal location, dmax is the terminal distance for this task, and $\alpha$ controls the sharpness of the shaping.

$$\gamma t=1-t/t\,max$$

where γt is a time decay factor applied to the reward to encourage fast completion, t is the current time step within the episode, and tmax is the time step limit for an episode, $$Rorient = \begin{cases} YtbOrient, & \text{if } dOrient < \in d \text{ and } \theta Orient < \in \theta \\ Yt(w\theta r\theta + wdrd), & \text{otherwise,} \end{cases}$$

where Rorient is the final reward for the "Orient" concept, bOrient is the bonus awarded on successful completion of the orient task, dOrient is the distance between the pinch point and prism, θOrient is the angle between the line connecting the opposed fingers and one of the axes of the prism, and the $\in$ values for each are their tolerances.

Lift-Reward function:

$$rp=1-(p/p\,max)^\alpha$$

where rp is the pinch shaping reward component for closing the fingers, p is the distance between the two opposed fingers, and pmax is the maximum possible distance between the fingers.

$$rh=(h/h\,max)^\alpha$$

where rh is the height shaping component for lifting the prism, h is the height of the prism off the ground, and hmax is the distance at which we declare the prism lifted and terminate the episode. Here we used an $\alpha$ of 4.

$$R\,\text{lift}=\{\gamma t\,b\,\text{lift, if } h > \in h;\,\gamma t(wp+whrh),\text{ if } p > \in p;\,\gamma t\\ wprp, \text{ otherwise,}$$

where R lift is the final reward for the "Lift" concept, b-lift is the bonus reward assigned for successfully lifting the prism above the threshold height, h is the height of the prism, $\in h$ is the threshold height, and $\in p$ is the threshold distance between the fingers below which they are considered pinched. The bonus rewards for success are greater than the total reward that could have been accumulated had the agent remained in this highest reward state for the remaining time in the episode, to encourage fast completion of the task.

Grasp-Reward function: Here, RGrasp is the final shaping reward for the "Grasp" concept.

$$RGrasp=\{b\text{ lift, if } h > \in h;\,w\theta,\text{ if } dOrient < \in d \text{ and}\\ \theta Orient < \in \theta;\,0,\text{ otherwise,}$$

Stack-Reward function $$RStack=\{\gamma t\,b\text{Stack, if } dStack < \in d \text{ and } \theta Stack < \in \theta;\\ \gamma t(w\theta r\theta+wdrd),\text{ otherwise,}$$

where dStack is the distance between the pinch point and the goal, $\in d$ and $\in \theta$ are the thresholds for success in angular and euclidean distance, wθ and wd are the weights assigned to those reward components, and bStack is the bonus reward assigned for successful completion of the Stack task.

Full complex Grasp-n-Stack Task-Reward function:

$$R\text{full}=w\text{Stack, if }dStack < \in d^\circ\theta Stack < \in \theta w\text{stage2, if}\\ dStack < \in d^\circ\theta Stack < \in \theta w\text{Grasp, if } h > \in h;\\ w\text{stage1, if }d\text{stage1} < \in d;\,0,\text{ otherwise}$$

Independent training of concepts allows each to use a focused reward function, simplifying training. For individual sub-tasks where solutions already exist, such as moving a robotic arm from place to place, they can be seamlessly plugged in among other learned concepts. Similarly, individual trained AI concepts can be reused as components in other tasks, or replaced with improved versions.

Concept network reinforcement learning is suitable for industrial applications, allowing for flexible goal specifications and rapid development of new variants of a problem. Compared with training monolithic networks to solve complete tasks, concept network reinforcement learning greatly accelerates the speed with which new combinations of functionality can be trained and built upon. Concept network reinforcement learning also has deployment-time benefits: the training process for concepts naturally produces policies with well-defined validity regions, so they can be executed safely and reliably. It also provides improved explainability: by tracking which concepts are activated when generating behavior, the system can provide context for why decisions were made.

In the example, the AI engine uses concept network reinforcement learning on a complex robotics task requiring dexterous manipulation—Grasping a prism and precisely Stacking it on a cube. The AI engine successfully solves the task, incorporating several inverse-kinematics-based classical controllers as well as a hierarchically decomposed set of learned concepts. The AI engine assembles sub-concepts into the overall solution extremely fast, taking, for example, 45× fewer samples than a state-of-the-art approach on the same task from Popov, I., Heess, N., Lillicrap, T., Hafner, R., Barth-Maron, G., Vecerik, M., Lampe, T., Tassa, Y., Erez, T., Riedmiller, M., "Data-efficient deep reinforcement learning for dexterous manipulation." arXiv preprint arXiv:1704.03073, [2017].

Terminal Conditions

A goal of a termination condition for a policy can be defined based on the state space. Orient for the orient concept—an episode would end early if the hand moved too far from the prism, if the prism tipped more than 15 degrees, or the goal was achieved by aligning the opposed fingers with the prism while the pinch point was 1.5 cm above the prism.

Lift: For the lift concept—an episode would end early if the prism was moved outside a virtual cylinder centered on the starting position of the prism, if the hand moved more than a certain distance from the prism, or if the goal was achieved by lifting the prism above a target height.

Stack: For the Stack concept—an episode would end early if the prism moved too far from the cube, if the prism touched the ground, or if the goal was achieved by lining the prism up with the cube and bringing them into contact.

Figure 7:
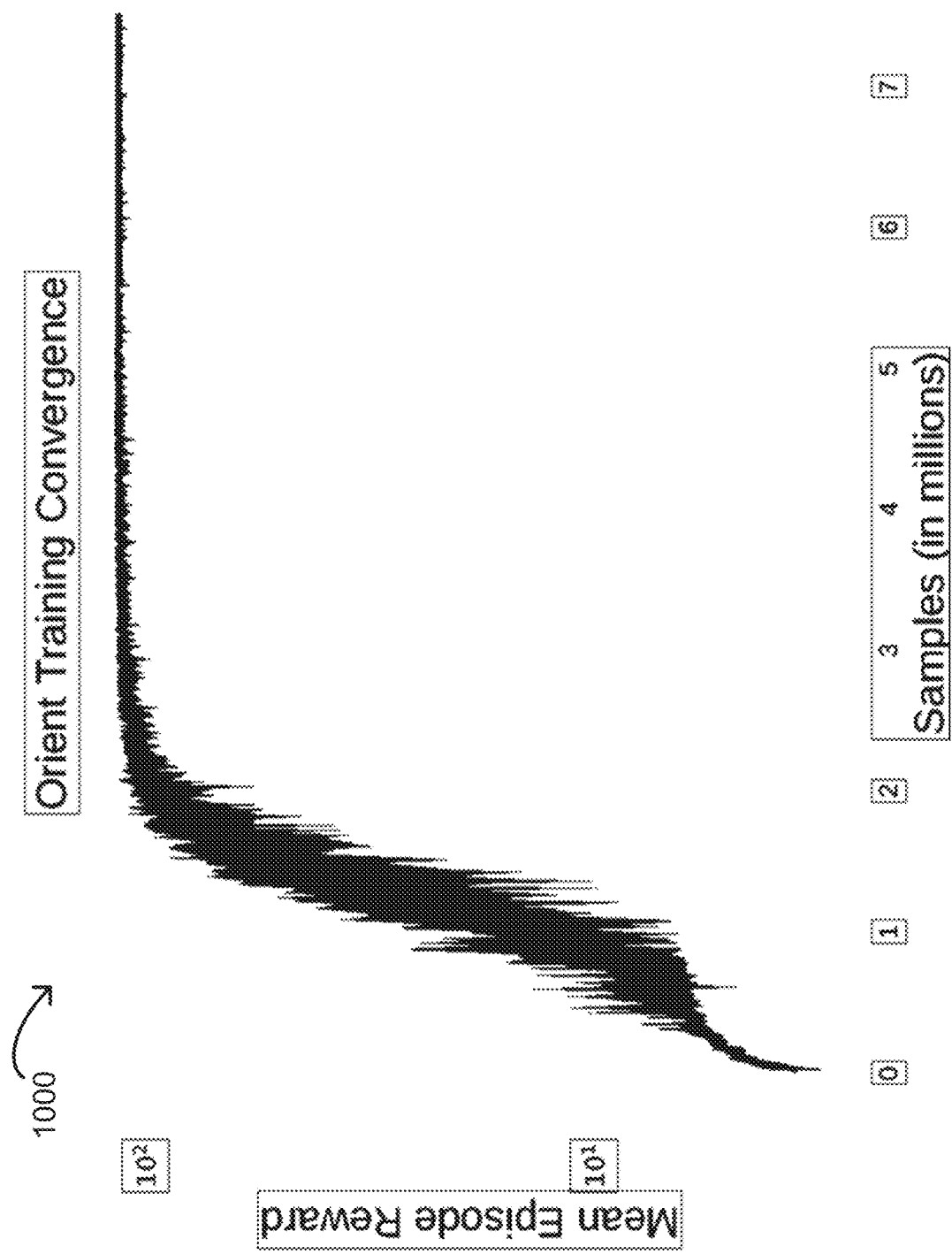
FIG. 7 illustrates a graph of an embodiment of the training of the individual sub-task of the Orient from FIG. 4F and its reward function focused for that sub-task.
Figure 8:
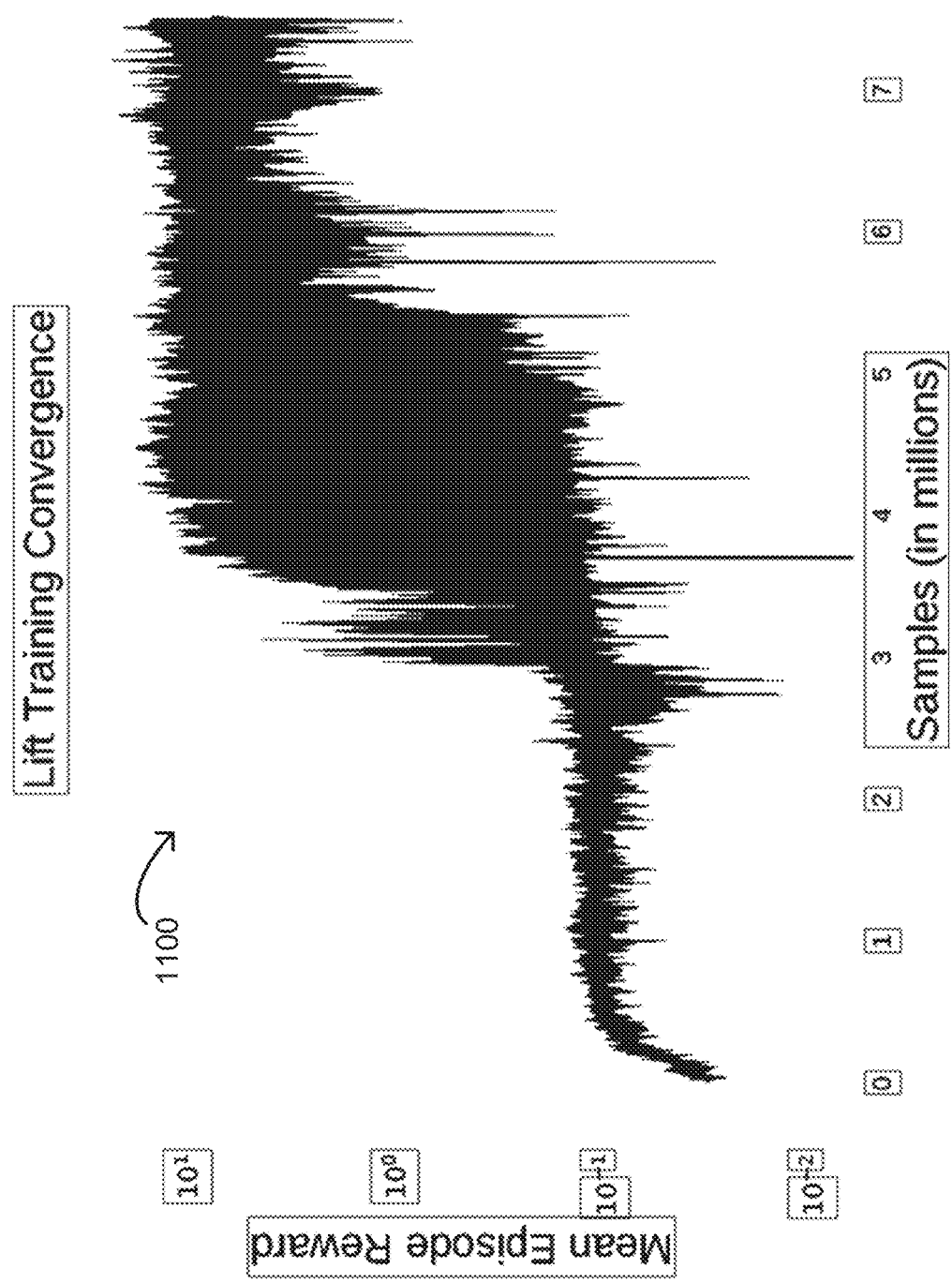
FIG. 8 illustrates a graph of an embodiment of the training of the individual sub-task of Lift from FIG. 4F and its reward function focused for that sub-task.

FIG. 7 illustrates a graph 1000 of an embodiment of the training of the individual sub-task of Orient from FIG. 4F and its reward function focused for that sub-task. FIG. 8 illustrates a graph 1100 of an embodiment of the training of the individual sub-task of Lift from FIG. 4F and its reward function focused for that sub-task.

The graphs show the concept's training convergence, either the Orient concept or the Lift concept, with a mean episode reward plotted against training samples in the millions. The shaded area represents the min to max. The shaded area is a 95% confidence interval for the mean. For the Lift concept, tight terminal conditions are set to encourage precise vertical lift, which makes finding an effective policy more challenging. The Orient and Stack concepts trained in approximately 2-3 million samples using shaping rewards and guiding terminals, without the need for hyper parameter tuning. The training graphs using reinforcement learning with the TRPO concepts are presented in FIGS. 7-9. Note, a very tight terminal constraint on the distance the prism can move from its starting XY coordinates, is designed to encourage a straight vertical lift, and also increased the number of samples required to find a good policy through exploration. Better designed terminal conditions and rewards might speed up training on the concepts.

Figure 9:
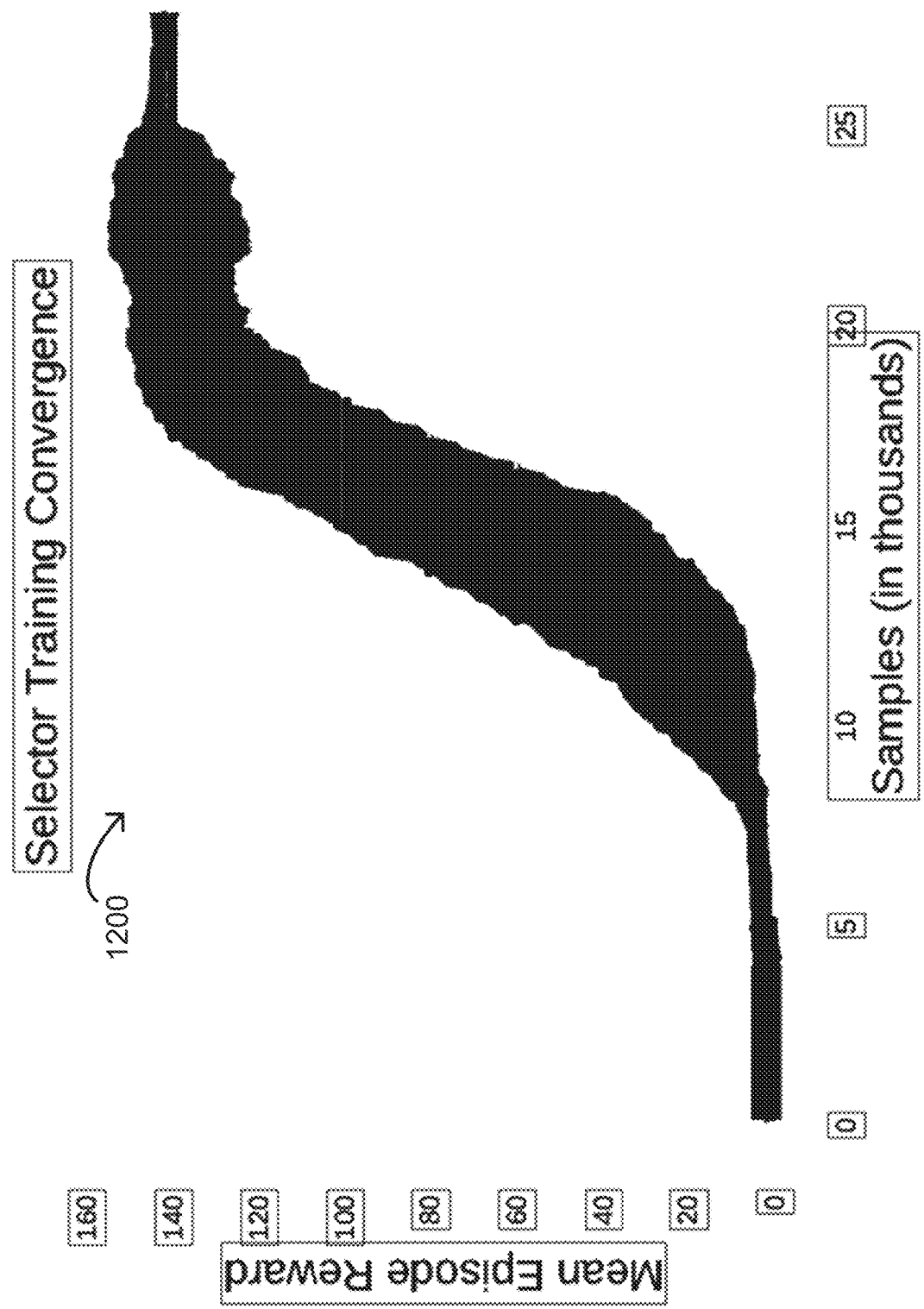
FIG. 9 illustrates a graph of an embodiment of the training of the interactions of the individual sub-tasks to achieve the complex task of Grasp-n-Stack and its reward function focused for that sub-task.

FIG. 9 illustrates a graph 1200 of an embodiment of the training of the interactions of the individual sub-tasks to achieve the complex task of Grasp-n-Stack and its reward function focused for that sub-task.

In an example, the full concept integrator trained in 22,000 samples (FIG. 9), though the integrator itself only saw 6,000 samples as it does not receive state transitions during long running execution of children. When concepts are compatible—i.e., a concept ends within the operating constraints of another—and there exists some chain of compatible concepts that will achieve a goal, the integrator can learn to order these concepts very quickly, without the need to train a monolithic network to subsume the components. Models converged on good solutions between 16000 and 25000 samples. The task of ordering the concepts can be learned nearly two orders of magnitude faster than the individual concepts, or 45× faster than the single policy trained by Popov et al. [2017] using one million samples and previously trained sub-concepts.

Note, training performance for DQN was evaluated with ten testing episodes for every 50 training episodes, with mean performance in each testing pass plotted in the integrator performance graphs shown in FIGS. 7-9. Training performance for TRPO uses the raw training episode returns, which are less representative of true policy performance but served well enough to show when the policy had converged. In plots showing the performance of DQN, the X axis represents transitions sampled so far, and the Y axis represents mean episode reward. Final evaluation of robustness for both DQN and TRPO was done without exploration.

In an embodiment, in 500 episodes we observed no task failures during execution, both with the concepts executed individually in their own environments and the tree with integrators solving the full task. The concept network is able to very reliably Grasp an object and precisely Stack it on another, both with varying position and orientation.

More Architecture Details

Referring back to FIGS. 2A and 2B, the system may further include as follows.

Architect Module

The architect module 326 is the component of the system responsible for proposing and optimizing learning topologies (e.g., neural networks), based on mental models.

The architect module 326 can take the codified mental model and pedagogy and then propose a set of candidate low-level learning algorithms, topologies of a complex tasks and sub-concepts, and configurations thereof the architect module 326 believes will best be able to learn the concepts in the model. This is akin to the work that a data scientist does in the toolkit approach, or that the search system automates in the approach with statistical data analysis tools. Here, it is guided by the pedagogical program instead of being a broad search. The architect module 326 can employ a variety of techniques to identify such models. The architect module 326 can generate a directed graph of nodes. The architect module 326 can break down the problem to be solved into smaller tasks/concepts all factoring into the more complex main problem trying to be solved based on the software code and/or data in the defined fields of the user interface supplied from the user/client device. The architect module 326 can instantiate a complex task and layers of sub-concepts feeding into the complex task. The architect module 326 can generate each concept including the sub-concepts with a tap that stores the output action/decision and the reason why that node reached that resultant output (e.g., what parameters dominated the decision and/or other factors that caused the node to reach that resultant output). This stored output of resultant output and the reasons why the node reached that resultant output can be stored in the trained intelligence model. The tap created in each instantiated node provides explainability on how a trained intelligence model produces its resultant output for a set of data input. The architect module 326 can reference a database of algorithms to use as well as a database of network topologies to utilize. The architect module 326 can reference a table or database of best suggested topology arrangements including how many layers of levels in a topology graph for a given problem, if available. The architect module 326 also has logic to reference similar problems solved by comparing signatures. If the signatures are close enough, the architect module 326 can try the topology used to optimally solve a problem stored in an archive database with a similar signature. The architect module 326 can also instantiate multiple topology arrangements all to be tested and simulated in parallel to see which topology comes away with optimal results. The optimal results can be based on factors such as performance time, accuracy, computing resources needed to complete the training simulations, etc.

In an embodiment, for example, the architect module 326 can be configured to propose a number of neural networks and heuristically pick an appropriate learning algorithm from a number of machine learning algorithms in one or more databases for each of the number of neural networks. Instances of the learner module 328 and the instructor module 324 can be configured to train the number of neural networks in parallel. The number of neural networks can be trained in one or more training cycles with the training data from one or more training data sources. The AI engine can subsequently instantiate a number of trained AI models based on the concepts learned by the number of neural networks in the one or more training cycles, and then identify a best trained AI model (e.g., by means of optimal results based on factors such as performance time, accuracy, etc.), among the number of trained AI models.

The user can assist in building the topology of the nodes by setting dependencies for particular nodes. The architect module 326 can generate and instantiate neural network topologies for all of the concepts needed to solve the problem in a distinct two-step process. The architect module 326 can generate a description of the network concepts. The architect module 326 can also take the description and instantiate one or more topological shapes, layers, or other graphical arrangements to solve the problem description. The architect module 326 can select topology algorithms to use based on factors such as whether the type of output the current problem has either 1) an estimation output or 2) a discrete output and then factors in other parameters such as performance time to complete the algorithm, accuracy, computing resources needed to complete the training simulations, originality, amount of attributes, etc.

Instructor Module

The instructor module 324 is a component of the system responsible for carrying out a training plan codified in the pedagogical programming language. Training can include teaching a network of intelligent processing nodes to get one or more outcomes, for example, on a simulator. To do so, the instructor module 324 can form internal representations about the system's mastery level of each concept, and adapt the execution plan based on actual performance during training. The directed graph of lessons can be utilized by the instructor module 324 to determine an execution plan for training (e.g., which lessons should be taught in which order). The training can involve using a specific set of concepts, a curriculum, and lessons, which can be described in the pedagogical programming language file.

The instructor module 324 can train easier-to-understand tasks earlier than tasks that are more complex. Thus, the instructor module 324 can train sub-concept AI objects and then higher-level AI objects. The instructor module 324 can train sub-concept AI objects that are dependent on other nodes after those other AI objects are trained. However, multiple nodes in a graph may be trained in parallel. The instructor module 324 can run simulations on the AI objects with input data including statistics and feedback on results from the AI object being trained from the learner module 328. The learner module 328 and instructor module 324 can work with a simulator or other data source to iteratively train an AI object with different data inputs. The instructor module 324 can reference a knowledge base of how to train an AI object efficiently by different ways of flowing data to one or more AI objects in the topology graph in parallel, or, if dependencies exist, the instructor module 324 can train serially with some portions of lessons taking place only after earlier dependencies have been satisfied. The instructor module 324 can reference the dependencies in the topology graph, which the dependencies can come from a user specifying the dependencies and/or how the arrangement of AI objects in the topology was instantiated. The instructor module 324 can supply data flows from the data source such as a simulator in parallel to multiple AI objects at the same time where computing resources and a dependency check allows the parallel training.

The instructor module 324 may flow data to train AI objects from many data sources including, but not limited to a simulator, a batch data source, a random-data generator, and historical/guided performance form from past performance. A simulator can give data and get feedback from the instructor module 324 during the simulation that can create an iterative reactive loop from data inputs and data outputs from the AI objects. A batch data source can supply batched data from a database in at least one example. A random-data generator can generate random data based on user-input parameters.

When starting a training operation, the instructor module 324 first generates an execution plan. This is the ordering it intends to use when teaching the concepts, and for each concept which lessons it intends to teach in what order. While the execution plan is executing, the instructor module 324 may jump back and forth between concepts and lessons to optimize the learning rate. By not training each concept fully before starting to train dependent concepts, the system naturally avoids certain systemic machine learning problems such as overfitting. The major techniques used to determine when to switch between lessons and concepts for training are reinforcement learning and adaptive learning. For example, for a first main problem of determining an amount of bankruptcy's in the United States, a first AI object corresponding to a sub concept may be trained in a first lesson on how to determine bankruptcy filings in California. A second lesson may train the first AI object next on how to determine bankruptcy filings in California and York. Successive lessons on an AI object can build upon and augment earlier lessons that the AI object was trained on.

The instructor module 324 looks to reuse similar training flows that have solved similar problems with similar signatures in the past.

Learner Module

The learner module 328 is a component of the system configured to carry out the actual execution of the low-level, underlying AI algorithms. In training mode, the learner module 328 can instantiate a system conforming to what was proposed by the architect module 326, interface with the instructor module 324 to carry out the computation and assess performance, and then execute the learning algorithm itself. The learner module 328 can instantiate and execute an instance of the already trained system. Eventually, the learner module 328 writes out network states for each trained sub-AI object and then a combination of the topological graph of the main node with all of the sub-nodes into a trained AI model. The learner module 328 can also write the stored output of each node and why that node arrived at that output into the trained AI model, which gives explainability as to how and why the AI proposes a solution or arrives at an outcome.

Hyperlearner Module

The hyperlearner module 325 can perform a comparison of a current problem to a previous problem in one or more databases. The hyperlearner module 325 can reference archived, previously built and trained intelligence models to help guide the instructor module 324 to train the current model of nodes. The hyperlearner module 325 can parse an archive database of trained intelligence models, known past similar problems and proposed solutions, and other sources. The hyperlearner module 325 can compare previous solutions similar to the solutions needed in a current problem as well as compare previous problems similar to the current problem to suggest potential optimal neural network topologies and training lessons and training methodologies.

Simulator

When, the curriculum trains using a simulation or procedural generation, then the data for a lesson is not data to be passed to the learning system, but the data is to be passed to the simulator. The simulator can use this data to configure itself, and the simulator can subsequently produce a piece of data for the learning system to use for training. This separation permits a proper separation of concerns. The simulator is the method of instruction, and the lesson provides a way to tune that method of instruction, which makes it more or less difficult depending on the current level of mastery exhibited by the learning system. A simulation can run on a client machine and stream data to the AI engine for training. In such an embodiment, the client machine needs to remain connected to the AI engine while the AI model is training. However, if the client machine is disconnected from the server of the AI engine, it can automatically pick up where it left off when it is reconnected. Note, if the system trains using data, then the data is optionally filtered/augmented in the lessons before being passed to the learning system.

Note, 1) simulations and procedural generation are a good choice versus data in a variety of circumstances; and 2) concepts are a good choice versus streams when you can more easily teach versus calculate.

Training Mode

A machine learning algorithm may have of a target/outcome variable (or dependent variable) which is to be predicted from a given set of predictors (independent variables). Using this set of variables, the AI engine generates a function that maps inputs to desired outputs. The coefficients and weights plugged into the equations in the various learning algorithms are then updated after each epoch/pass of training session until a best set of coefficients and weights are determined for this particular concept. The training process continues until the model achieves a desired level of accuracy on the training data.

When in training mode the architect module 326 of the AI engine is configured to i) instantiate the network of processing nodes in any layers of hierarchy conforming to concepts of the problem being solved proposed by the user and ii) then the learner module 328 and instructor module 324 train the network of processing nodes in that AI model. To effect the foregoing, the AI engine can take compiled pedagogical programming language code and generate an AI-model learning topology, and proceed to follow the curricula to teach the concepts as specified. Depending on the model, training can potentially take substantial amounts of time. Consequently, the AI engine can provide interactive context on the status of training including, for example, showing which nodes are actively being trained, the current belief about each node's mastery of its associated concept, overall and fine-grained accuracy and performance, the current training execution plan, and/or an estimate of completion time. As such, in an embodiment, the AI engine can be configured to provide one or more training status updates on training a neural network selected from i) an estimation of a proportion of a training plan completed for the neural network, ii) an estimation of a completion time for completing the training plan, iii) the one or more concepts upon which the neural network is actively training, iv) mastery of the neural network on learning the one or more concepts, v) fine-grained accuracy and performance of the neural network on learning the one or more concepts, and vi) overall accuracy and performance of the neural network on learning one or more mental models.

Because the process of building pedagogical programs is iterative, the AI engine in training mode can also provide incremental training. That is to say, if the pedagogical programming language code is altered with respect to a concept that comes after other concepts that have already been trained, those antecedent concepts do not need to be retrained.

Additionally, in training mode, the user is able to specify what constitutes satisfactory training should the program itself permit indefinite training.

Algorithm Selection

A first step an AI engine can take is to pick an appropriate learning algorithm to train a mental model. This is a notable step in training AI, and it is a step those without AI expertise cannot perform without expert guidance. The AI engine can have knowledge of many of the available learning algorithms, as well as a set of heuristics for picking an appropriate algorithm including an initial configuration to train from.

The process of picking an appropriate algorithm, etc., can be performed by an AI model that has been trained (and will continue to be trained) by the AI engine, meaning the AI model will get better at building AI models each time a new one is built. A trained AI model, thereby, provides enabling AI for proposing neural networks from assembly code and picking appropriate learning algorithms from a number of machine learning algorithms in one or more databases for training the neural networks. The AI engine can be configured to continuously train the trained AI-engine neural network in providing the enabling AI for proposing the neural networks and picking the appropriate learning algorithms thereby getting better at building AI models.

The architect module 326 can also use heuristics, mental model signatures, statistical distribution inference, and Meta-learning in topology and algorithm selection.

First, the AI engine and the architect module 326 thereof can be configured to heuristically pick an appropriate learning algorithm from a number of machine learning algorithms in one or more databases for training the neural network proposed by the architect module 326. Many heuristics regarding the mental model can be used to inform what types of AI and machine learning algorithms can be used. For example, the data types used have a large influence. For this reason, the pedagogical programming language contains rich native data types in addition to the basic data types. If the architect module 326 sees, for example, that an image is being used, a convolutional deep learning neural network architecture might be appropriate. If the architect module 326 sees data that is temporal in nature (e.g., audio data, sequence data, etc.), then a recursive deep-learning neural network architecture like a long short-term memory ("LSTM") network might be more appropriate. The collection of heuristics can be generated by data science and machine learning/AI experts who work on the architect module 326 codebase, and who attempt to capture the heuristics that they themselves use in practice.

In addition to looking at the mental model, the architect module 326 can also consider the pedagogy provided in the pedagogical programming language code. It can, for example, look at the statistical distribution of any data sets being used; and, in the case of simulators, it can ask the simulator to generate substantial amounts of data so as to determine the statistics of data that will be used during training. These distribution properties can further inform the heuristics used.

Meta-Learning

Meta-learning is an advanced technique used by the architect module 326. It is, as the name implies, learning about learning. What this means is that as the architect module 326 can generate candidate algorithm choices and topologies for training, it can record this data along with the signature for the model and the resultant system performance. This data set can then be used in its own learning system. Thus, the architect module 326, by virtue of proposing, exploring, and optimizing learning models, can observe what works and what does not, and use that to learn what models it should try in the future when it sees similar signatures.

To effect meta-learning, the AI engine can include a meta-learning module configured to keep a record such as a meta-learning record in one or more databases. The record can include i) the source code processed by the AI engine, ii) mental models of the source code and/or signatures thereof, iii) the training data used for training the neural networks, iv) the trained AI models, v) how quickly the trained AI models were trained to a sufficient level of accuracy, and vi) how accurate the trained AI models became in making predictions on the training data.

For advanced users, low-level details of a learning topology can be explicitly specified completely or in part. The architect module 326 can treat any such pinning of parameters as an override on its default behavior. In this way, specific algorithms can be provided, or a generated model can be pinned for manual refinement.

Guiding Training

The first step the AI engine will take is to pick an appropriate learning algorithm to train the Mental Model. This is a critical step in training AI. The AI engine has knowledge of many of the available learning algorithms and has a set of heuristics for picking an appropriate algorithm as well as an initial configuration to train from.

Once an algorithm is chosen, the AI engine will proceed with training the AI model's Mental Model via the Curricula. The AI engine manages all of the data streaming, data storage, efficient allocation of hardware resources, choosing when to train each concept, how much (or little) to train a concept given its relevance within the Mental Model (i.e., dealing with the common problems of overfitting and underfitting), and generally is responsible for producing a trained AI model based on the given Mental Model and Curricula. As is the case with picking an appropriate learning algorithm, guiding training-notably avoiding overfitting and underfitting-to produce an accurate AI solution is a task that requires knowledge and experience in training AIs. The AI engine has an encoded set of heuristics manage this without user involvement. Similarly, the process of guiding training is also a trained AI model that will only get smarter with each trained AI model it trains. The AI engine is thus configured to make determinations regarding i) when to train the AI model on each of the one or more concepts and ii) how extensively to train the AI model on each of the one or more concepts. Such determinations can be based on the relevance of each of one or more concepts in one or more predictions of a trained AI model based upon training data.

The AI engine can also determine when to train each concept, how much (or little) to train each concept based on its relevance, and, ultimately, produce a trained AI model. Furthermore, the AI engine can utilize meta-learning. In meta-learning, the AI engine keeps a record of each program it has seen, the data it used for training, and the generated AIs that it made. It also records how fast those AIs trained and how accurate they became. The AI engine learns over that dataset.

Note, when training of an AI object occurs, the hyper learner module 328 can be configured to save into the AI database 341 two versions of an AI object. A first version of an AI object is a collapsed tensile flow representation of the AI object. A second version of an AI object is the representation left in its nominal non-collapsed state. When the search engine retrieves the AI object in its nominal non-collapsed state, then another programmer desiring to reuse the AI object will be able to obtain outputs from the non-collapsed graph of nodes with all of its rich meta-data rather and then a collapsed concept with a single discrete output. The state of the AI data objects can be in a non-collapsed state so the trained AI object has its full rich data set, which then may be used by the user for reuse, reconfigured, or recomposed into a subsequent trained AI model.

The database management system also indexes and tracks different AI objects with an indication of what version is this AI object. Later versions of an AI object may be better trained for particular task but earlier versions of the AI object maybe more generally trained; and thus, reusable for wider range of related tasks, to then be further trained for that specific task.

The AI database 341 and other components in the AI engine cooperate to allow migrations of learned state to reconfigure a trained AI object. When a system has undergone substantial training achieving a learned state, and a subsequent change to the underlying mental models might necessitate retraining, it could be desirable to migrate the learned state rather than starting training from scratch. The AI engine can be configured to afford transitioning capabilities such that previously learned high dimensional representations can be migrated to appropriate, new, high dimensional representations. This can be achieved in a neural network by, for example, expanding the width of an input layer to account for alterations with zero-weight connections to downstream layers. The system can then artificially diminish the weights on connections from the input that are to be pruned until they hit zero and can then be fully pruned.

Deploy and Use

Once a trained AI model has been sufficiently trained, it can be deployed such that it can be used in a production application. The interface for using a deployed trained AI model is simple: the user submits data (of the same type as the trained AI model was trained with) to a trained AI model-server API and receives the trained AI model's evaluation of that data.

As a practical example of how to use a deployed trained AI model, a trained AI model can first be trained to recognize hand-written digits from the Mixed National Institute of Standards and Technology ("MNIST") dataset. An image can be created containing a handwritten digit, perhaps directly through a touch-based interface or indirectly by scanning a piece of paper with the handwritten digit written on it. The image can then be down sampled to a resolution of 28×28 and converted to grayscale, as this is the input schema used to train the example trained AI model. When submitted to the trained AI model-server through the trained AI model server API, the trained AI model can take the image as input and output a one-dimensional array of length 10 (whereby each array item represents the probability, as judged by the trained AI model, that the image is a digit corresponding to the index). The array could be the value returned to the user from the API, which the user could use as needed.

Though a linear approach to building a trained AI model is presented in an embodiment, an author-train-deploy workflow does not have to be treated as a waterfall process. If the user decides further refinement of a trained AI model is needed, be it through additional training with existing data, additional training with new, supplemental data, or additional training with a modified version of the mental model or curricula used for training, the AI engine is configured to support versioning of AI models so that the user can preserve (and possibly revert to) the current state of an AI model while refining the trained state of the AI model until a new, more satisfactory state is reached.

Command Line Interface ("CLI")

The CLI is a tool configured to enable users to configure the AI engine. The CLI is especially useful for automation and connection to other tools. Some sub-tasks can only be performed using the CLI. Some sub-tasks that can be performed using the CLI include loading a pedagogical programming language file and connecting a simulator.

Web Site

The web site is configured as a browser-based tool for configuring and analyzing AI models stored in the AI engine. The website can be used for sharing, collaborating, and learning. Some information that can be accessed from the web site is a visualization of an AI model's training progress.

Computing Infrastructure

FIG. 1A provides a block diagram illustrating an AI system 700A and its cloud-based computing platforms infrastructure in accordance with an embodiment. A backend cloud platform can exist of various servers, processes, databases, and other components that connect over a network, such as the Internet, to a plurality of computing devices. The backend cloud platform is configured to handle the scaling, efficiency, etc. Such a cloud platform can be a public cloud, Virtual Public Cloud, or a private cloud. Note, a similar computing platform may also implemented on an on-premises computing platform such as FIG. 1B.

In an embodiment, a user, such as a software developer, can interface with the AI system 700A through an online interface 701. However, the user is not limited to the online interface, and the online interface is not limited to that shown in FIG. 1A. An input may be supplied from an online API, such as www.bons.ai, a command line interface, and a graphical user interface such as an Integrated Development Environment ("IDE") such as Mastermind™. With this in mind, the AI system 700A of FIG. 1A can enable a user to make API and web requests through a domain name system ("DNS") 701, which requests can be optionally filtered through a proxy to route the API requests to an API load balancer 705 and the web requests to a web load balancer 707. Alternatively, the proxy service may be part of a service running on a CPU computing device. The API load balancer 705 can be configured to distribute the API requests among multiple processes wrapped in their own containers running in a containerization platform, such as a Docker-type network. The web load balancer 707 can be configured to distribute the web requests among the multiple processes wrapped in their own containers running in this containerization platform. The network can include a cluster of one or more central processing unit ("CPU") computing devices 709 and a cluster of one or more graphics processing unit ("GPU") computing devices 711. One or more services running in the network will scale to more or less CPU computing devices 709 and GPU computing devices 711 as needed. The CPU computing devices 709 can be utilized for most independent processes running on the swarm network. The GPU computing devices 711 can be utilized for the more computationally intensive independent processes such as TensorFlow and the learner process. Various services may run on either the CPU computing device 709 or in the GPU computing device 711, as capacity in that machine is available at the time.

As further shown in FIG. 1A, a logging Stack 713 can be shared among all production clusters for dedicated monitoring and an indexing/logging.

The cloud-based platform with multiple independent processes is configured for the user to define the AI problem to be solved. In an embodiment, all of the individual processes are wrapped into a container program such as a Docker. The software container allows each instance of that independent process to run independently on whatever computing device that instance is running on.

The individual processes in the AI engine utilize a scaling hardware platform, such as Amazon Web Services ("AWS"), so that the individual processes of the AI engine, the amount of Central Processing Units ("CPUs"), Graphics Processing Units ("GPUs"), and RAM may dynamically change overtime and rapidly change to scale to handle multiple users sending multiple AI models to be trained or multiple simulations from a single user to train one or more AI models.

For example, an engineer service can be configured to dynamically change an amount of computing devices 709, 711 overtime running independent processes and to rapidly change the amount to scale to handle multiple users sending multiple AI models to be trained. A conductor service or an engineer service can cause a first instance of an instructor process to be instantiated, loaded onto a CPU computing device, and then run on a first CPU computing device 709.

The AI engine may have multiple independent processes on the cloud-based platform. The multiple independent processes may be configured as an independent process wrapped in its own container so that multiple instances of the same processes, e.g. learner process and instructor process, can run simultaneously to scale to handle one or more users to perform sub-tasks. The sub-tasks can include 1) running multiple training sessions on two or more AI models at the same time, in parallel, 2) creating two or more AI models at the same time, 3) running a training session on one or more AI models while creating one or more AI models at the same time, 4) deploying and using two or more trained AI models to do predictions on data from one or more data sources, and 5) any combination of these four, on the same AI engine. CPU bound services can include, for example, a document database for storing AI objects such as an AI database; a Relational Database Server such as PostgreSQL; a time-series database 217 such as InfluxDB database optimized to capture training data going into and out of a metagraph (e.g., metagraph 400A or FIG. 4A) for at least a 100-episode set of training episodes for training an AI model; an AI-model service including an architect module and AI compiler; an AI-model web service; a conductor service; a watchman service; a CPU Engineer service; an instructor process; a predictor service; and other similar processes. GPU Bound services can include, for example, a GPU Engineer service, a learner process, and other computationally heavy services. For example, a first CPU computing device may load and run an architect module. A second CPU computing device may load and run, for example, an instructor process. A first GPU computing device may load and run, for example, a learner process. A first service such as an engineer service, may then change an amount of computing devices running independent processes by dynamically calling in a third CPU computing device to load and run, for example, a second instance of the instructor process, and calling in a second GPU computing device to load and run, for example, a second instance of the learner process.

Scaling in this system may dynamically change both 1) an amount of independent processes running and 2) an amount of computing devices configured to run those independent processes, where the independent processes are configured to cooperate with each other. The dynamically changing of an amount of computing devices, for example, more GPUs or CPUs in order to run additional instance of the independent processes allows multiple users to utilize the cloud-based system at the same time and to, for example, 1) conduct multiple training sessions for AI models in parallel, 2) deploy AI models for use, and 3) create new AI models, all at the same time. Clusters of hardware of CPU devices and GPU devices can be dynamically scaled in and out on, for example, an hourly basis based on percent load capacity used and an amount of RAM memory left compared to a current or expected need.

Figure 1B:
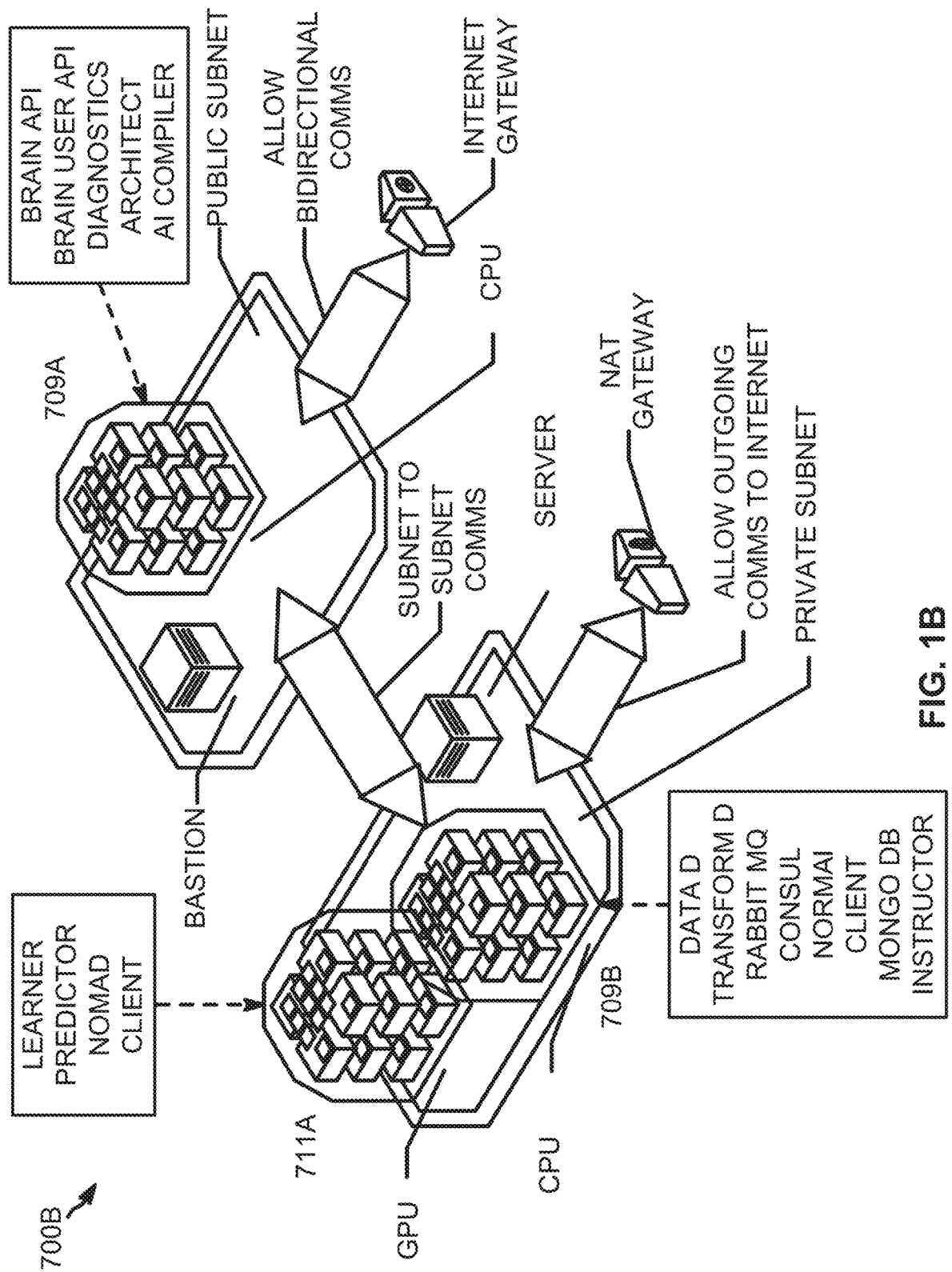

FIG. 1B provides a block diagram illustrating an AI system 700B and its on-premises based computing platforms infrastructure in accordance with an embodiment. Following on the AI system 700A, a bastion host server and one or more CPU computing devices, such as a first CPU computing device 709A and a second computing device 709B, can be on a public subnet for bidirectional communication through an Internet gateway. One or more GPU computing devices, such as a first GPU computing device 711A, can be on a private subnet communicatively coupled with the public subnet by means of a subnet there between. The one or more CPU computing devices on the public subnet can be utilized on a first CPU computing device 709A by the compiler and the architect module/process that are part of an AI-model service. One or more other CPU computing devices on a second CPU computing device 709B on the private subnet can be utilized by the instructor module. The GPU computing devices can be utilized by the learner module/process and the predictor module/process. As further shown in FIG. 1B, the private subnet can be configured to send outgoing communications to the Internet through a network address translation ("NAT") gateway.

The modules of the AI engine installed on on-premises servers can generate AI models. The modules of the AI engine installed on on-premises servers can deploy AI models for prediction. The modules of the AI engine installed on on-premises servers can train AI models.

Network

Figure 10:
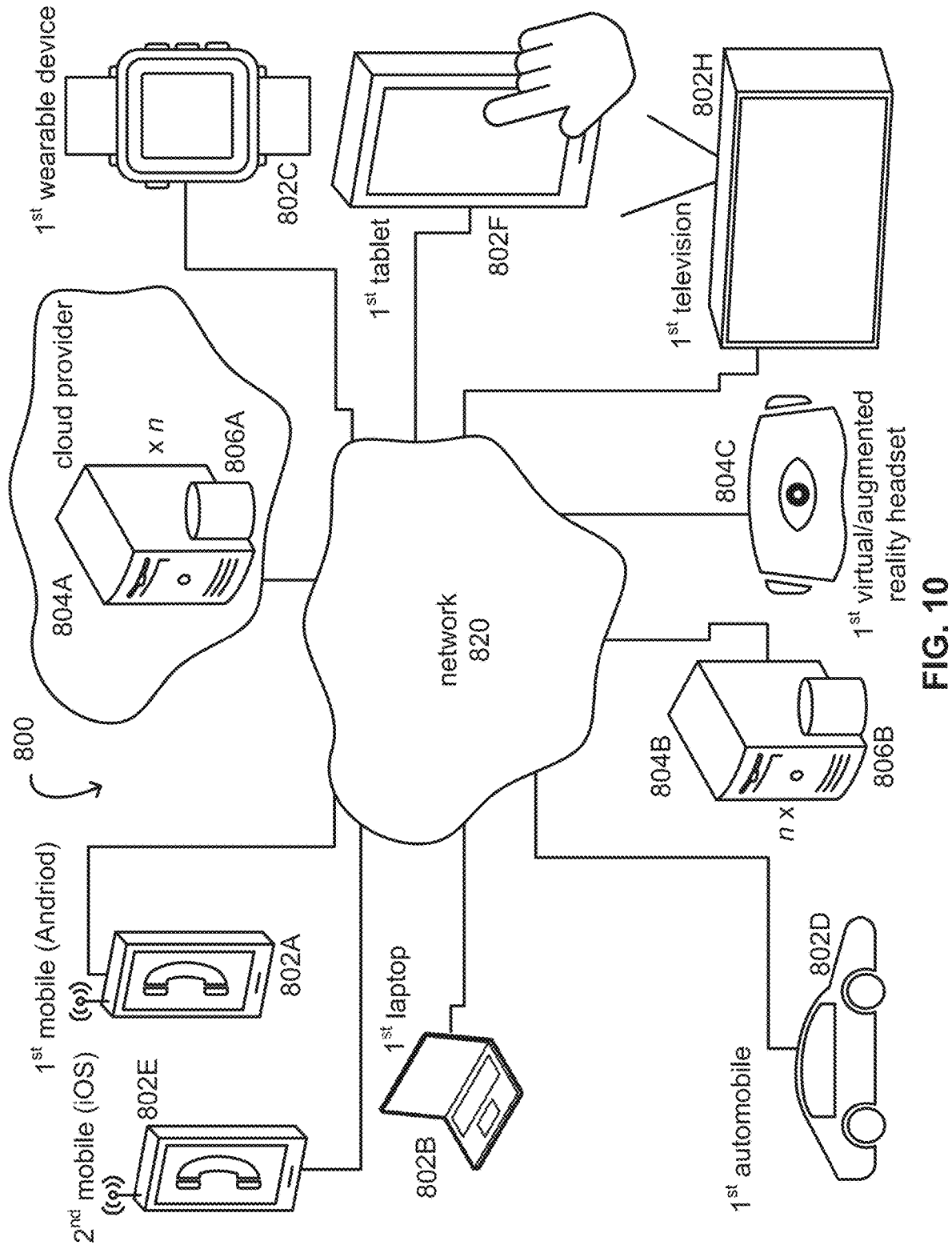
FIG. 10 illustrates a number of electronic systems and devices communicating with each other in a network environment in accordance with an embodiment.

FIG. 10 illustrates a number of electronic systems and devices communicating with each other in a network environment in accordance with an embodiment. The network environment 800 has a communications network 820. The network 820 can include one or more networks selected from an optical network, a cellular network, the Internet, a Local Area Network ("LAN"), a Wide Area Network ("WAN"), a satellite network, a fiber network, a cable network, and combinations thereof. In an embodiment, the communications network 820 is the Internet. As shown, there may be many server computing systems and many client computing systems connected to each other via the communications network 820. However, it should be appreciated that, for example, a single client computing system can also be connected to a single server computing system. As such, FIG. 10 illustrates any combination of server computing systems and client computing systems connected to each other via the communications network 820.

The communications network 820 can connect one or more server computing systems selected from at least a first server computing system 804A and a second server computing system 804B to each other and to at least one or more client computing systems as well. The server computing system 804A can be, for example, the one or more server systems of, for example, FIGS. 1A and 1B. The server computing systems 804A and 804B can each optionally include organized data structures such as databases 806A and 806B. Each of the one or more server computing systems can have one or more virtual server computing systems, and multiple virtual server computing systems can be implemented by design. Each of the one or more server computing systems can have one or more firewalls to protect data integrity.

The at least one or more client computing systems can be selected from a first mobile computing device 802A (e.g., smartphone with an Android-based operating system), a second mobile computing device 802E (e.g., smartphone with an iOS-based operating system), a first wearable electronic device 802C (e.g., a smartwatch), a first portable computer 802B (e.g., laptop computer), a third mobile computing device or second portable computer 802F (e.g., tablet with an Android- or iOS-based operating system), a smart device or system incorporated into a first smart automobile 802D, a smart device or system incorporated into a first smart bicycle 802G, a first smart television 802H, a first virtual reality or augmented reality headset 804C, and the like.

The client computing systems (e.g., 802A-802H, and/or 804C) can include, for example, the software application or the hardware-based system in which the trained AI model can be deployed. Additionally, the server 804B may have a simulator configured to train an AI model with the AI engine of cloud 804A. Each of the one or more client computing systems and/or cloud platforms can have one or more firewalls to protect data integrity.

It should be appreciated that the use of the terms "client computing system" and "server computing system" is intended to indicate the system that generally initiates a communication and the system that generally responds to the communication. For example, a client computing system can generally initiate a communication and a server computing system generally responds to the communication. No hierarchy is implied unless explicitly stated. Both functions can be in a single communicating system or device, in which case, the client-server and server-client relationship can be viewed as peer-to-peer.

Any one or more of the server computing systems can be a cloud provider. A cloud provider can install and operate application software in a cloud (e.g., the network 820 such as the Internet), and cloud users can access the application software from one or more of the client computing systems. Generally, cloud users that have a cloud-based site in the cloud cannot solely manage a cloud infrastructure or platform where the application software runs. Thus, the server computing systems and organized data structures thereof can be shared resources, where each cloud user is given a certain amount of dedicated use of the shared resources. Each cloud user's cloud-based site can be given a virtual amount of dedicated space and bandwidth in the cloud. Cloud applications can be different from other applications in their scalability, which can be achieved by cloning tasks onto multiple virtual machines at run-time to meet changing work demand. Load balancers distribute the work over the set of virtual machines. This process is transparent to the cloud user, who sees only a single access point.

Cloud-based remote access can be coded to utilize a protocol, such as Hypertext Transfer Protocol ("HTTP"), to engage in a request and response cycle with an application on a client computing system such as a web-browser application resident on the client computing system. The cloud-based remote access can be accessed by a smartphone, a desktop computer, a tablet, or any other client computing systems, anytime and/or anywhere. The cloud-based remote access is coded to engage in 1) the request and response cycle from all web browser based applications, 2) the request and response cycle from a dedicated on-line server, 3) the request and response cycle directly between a native application resident on a client device and the cloud-based remote access to another client computing system, and 4) combinations of these.

In an embodiment, the server computing system 804A can include a server engine, a web page management component, a content management component, and a database management component. The server engine can perform basic processing and operating-system level tasks. The web page management component can handle creation and display or routing of web pages or screens associated with receiving and providing digital content and digital advertisements. Users (e.g., cloud users), can access one or more of the server computing systems by means of a Uniform Resource Locator ("URL") associated therewith. The content management component can handle most of the functions in the embodiments described herein. The database management component can include storage and retrieval tasks with respect to the database, queries to the database, and storage of data.

In an embodiment, a server computing system can be configured to display information in a window, a web page, or the like. An application including any program modules, applications, services, processes, and other similar software executable when executed on, for example, the server computing system 804A, can cause the server computing system 804A to display windows and user interface screens in a portion of a display screen space. With respect to a web page, for example, a user via a browser on the client computing system 802B can interact with the web page, and then supply input to the query/fields and/or service presented by the user interface screens. The web page can be served by a web server, for example, the server computing system 804A, on any Hypertext Markup Language ("HTML") or Wireless Access Protocol ("WAP") enabled client computing system (e.g., the client computing system 802B), or any equivalent thereof. The client computing system 802B can host a browser and/or a specific application to interact with the server computing system 804A. Each application has a code scripted to perform the functions that the software component is coded to carry out such as presenting fields to take details of desired information. Algorithms, routines, and engines within, for example, the server computing system 804A can take the information from the presenting fields and put that information into an appropriate storage medium such as a database (e.g., database 806A). A comparison wizard can be scripted to refer to a database and make use of such data. The applications may be hosted on, for example, the server computing system 804A and served to the specific application or browser of, for example, the client computing system 802B. The applications then serve windows or pages that allow entry of details.

Computing Systems

Figure 11:
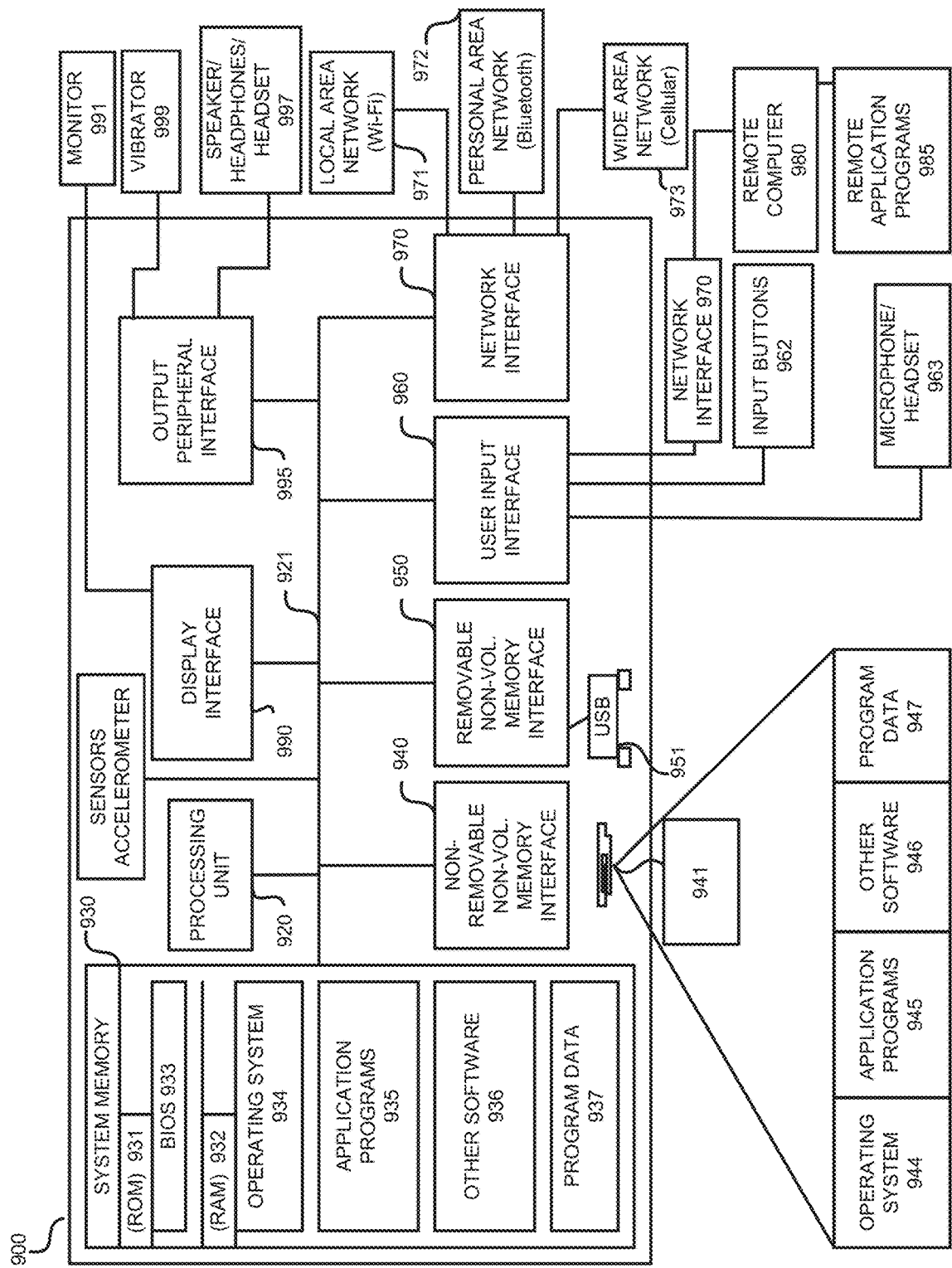
FIG. 11 illustrates a computing system 900 that can be, wholly or partially, part of one or more of the server or client computing devices in accordance with an embodiment.

FIG. 11 illustrates a computing system 900 that can be, wholly or partially, part of one or more of the server or client computing devices in accordance with an embodiment. With reference to FIG. 11, components of the computing system 900 can include, but are not limited to, a processing unit 920 having one or more processing cores, a system memory 930, and a system bus 921 that couples various system components including the system memory 930 to the processing unit 920. The system bus 921 may be any of several types of bus structures selected from a memory bus or memory controller, a peripheral bus, and a local bus using any of a variety of bus architectures.

Computing system 900 typically includes a variety of computing machine-readable media. Computing machine-readable media can be any available media that can be accessed by computing system 900 and includes both volatile and nonvolatile media, and removable and non-removable media. The system memory 930 includes computer storage media in the form of volatile and/or nonvolatile memory such as read only memory (ROM) 931 and random access memory (RAM) 932. By way of example, and not limitation, computing machine-readable media use includes storage of information, such as computer-readable instructions, data structures, other executable software or other data. Computer-storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other tangible medium which can be used to store the desired information and which can be accessed by the computing device 900. Transitory media such as wireless channels are not included in the machine-readable media. Communication media typically embody computer readable instructions, data structures, other executable software, or other transport mechanism and includes any information delivery media. As an example, some client computing systems on the network 920 of FIG. 10 might not have optical or magnetic storage.

A basic input/output system 933 (BIOS) containing the basic routines that help to transfer information between elements within the computing system 900, such as during start-up, is typically stored in ROM 931. RAM 932 typically contains data and/or software that are immediately accessible to and/or presently being operated on by the processing unit 920. The RAM 932 can include a portion of the operating system 934, application programs 935, other executable software 936, and program data 937.

The drives and their associated computer storage media discussed above and illustrated in FIG. 10, provide storage of computer readable instructions, data structures, other executable software and other data for the computing system 900. In FIG. 10, for example, the solid state memory 941 is illustrated for storing operating system 944, application programs 945, other executable software 946, and program data 947. Note that these components can either be the same as or different from operating system 934, application programs 935, other executable software 936, and program data 937. Operating system 944, application programs 945, other executable software 946, and program data 947 are given different numbers here to illustrate that, at a minimum, they are different copies.

A user may enter commands and information into the computing system 900 through input devices such as a keyboard, touchscreen, or software or hardware input buttons 962, a microphone 963, a pointing device and/or scrolling input component, such as a mouse, trackball or touch pad. The microphone 963 can cooperate with speech recognition software. These and other input devices are often connected to the processing unit 920 through a user input interface 960 that is coupled to the system bus 921, but can be connected by other interface and bus structures, such as a parallel port, game port, or a universal serial bus (USB). A display monitor 991 or other type of display screen device is also connected to the system bus 921 via an interface, such as a display interface 990. In addition to the monitor 991, computing devices may also include other peripheral output devices such as speakers 997, a vibrator 999, and other output devices, which may be connected through an output peripheral interface 995.

The computing system 900 can operate in a networked environment using logical connections to one or more remote computers/client devices, such as a remote computing system 980. The remote computing system 980 can a personal computer, a hand-held device, a server, a router, a network PC, a peer device or other common network node, and typically includes many or all of the elements described above relative to the computing system 900. The logical connections depicted in FIG. 9 can include a personal area network ("PAN") 972 (e.g., Bluetooth®), a local area network ("LAN") 971 (e.g., Wi-Fi), and a wide area network ("WAN") 973 (e.g., cellular network), but may also include other networks. Such networking environments are commonplace in offices, enterprise-wide computer networks, intranets and the Internet. A browser application may be resident on the computing device and stored in the memory.

When used in a LAN networking environment, the computing system 900 is connected to the LAN 971 through a network interface or adapter 970, which can be, for example, a Bluetooth® or Wi-Fi adapter. When used in a WAN networking environment (e.g., Internet), the computing system 900 typically includes some means for establishing communications over the WAN 973.

It should be noted that the present design can be carried out on a computing system such as that described with respect to FIG. 9. However, the present design can be carried out on a server, a computing device devoted to message handling, or on a distributed system in which different portions of the present design are carried out on different parts of the distributed computing system.

In an embodiment, software used to facilitate algorithms discussed herein can be embodied onto a non-transitory machine-readable medium. A machine-readable medium includes any mechanism that stores information in a form readable by a machine (e.g., a computer). For example, a non-transitory machine-readable medium can include read only memory (ROM); random access memory (RAM); magnetic disk storage media; optical storage media; flash memory devices; Digital Versatile Disc (DVD's), EPROMs, EEPROMs, FLASH memory, magnetic or optical cards, or any type of media suitable for storing electronic instructions.

Note, an application described herein includes but is not limited to software applications, mobile apps, and programs that are part of an operating system application. Some portions of this description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. These algorithms can be written in a number of different software programming languages such as Python, Java, HTTP, C, C+, or other similar languages. Also, an algorithm can be implemented with lines of code in software, configured logic gates in software, or a combination of both. In an embodiment, the logic consists of electronic circuits that follow the rules of Boolean Logic, software that contain patterns of instructions, or any combination of both.

Many functions performed by electronic hardware components can be duplicated by software emulation. Thus, a software program written to accomplish those same functions can emulate the functionality of the hardware components in input-output circuitry.

FIGS. 12A through 12C provide a flow diagram illustrating a method for a hierarchical decomposition deep reinforcement learning for an Artificial Intelligence model in accordance with an embodiment. As shown, the method includes a number of steps. Note, the following steps may be performed in any order where logically possible, and not all of them need to be performed.

In step 2, the AI engine applies a hierarchical-decomposition reinforcement learning technique to train one or more AI objects as concept nodes composed in a hierarchical graph incorporated into the AI model.

In step 4, the AI engine uses the hierarchical-decomposition reinforcement learning technique to hierarchically decompose a complex task into multiple smaller, individual sub-tasks making up the complex task. One or more of the individual sub-tasks, each corresponds to its own concept node in the hierarchical graph. The AI engine initially trains the AI objects on the individual sub-tasks and then trains on how the individual sub-tasks need to interact with each other in the complex task in order to deliver an end solution to the complex task.

In step 6, the AI engine decomposes the complex task, enabling use of reward functions focused for solving each individual sub-task and then one or more reward functions focused for the end solution of the complex task, as well as enabling conducting the training of the AI objects corresponding to the individual sub-tasks in the complex task, in parallel. The combined parallel training and simpler reward functions speed up an overall training duration for the complex task on one or more computing platforms, and subsequent deployment of a resulting AI model that is trained, compared to an end-to-end training with a single algorithm for all of the AI objects incorporated into the AI model.

In step 8, the AI engine uses information supplied from a user interface to apply the hierarchical-decomposition reinforcement learning technique to train one or more AI objects.

In step 10, the AI engine automatically partitions the individual sub-tasks into the concept nodes in the AI model to be trained on in a number of ways, where the ways of conveying the partitioning of the individual sub-tasks into the concept nodes are selected from a group consisting of i) how to partition the individual sub-tasks is explicitly defined in scripted code from the user, ii) how to partition the individual sub-tasks is hinted at by giving general guidance in the scripted code from the user, iii) how to partition the individual sub-tasks is interpreted from guidance based on responses from the user to a presented list of questions, and iv) any combination of these three, and then the architect module proposes a hierarchical structure for the graph of AI objects making up the AI model. The hinted at guidance in the scripted code from the user on how to automatically partition and ii) where the interpreted guidance from answered questions on how to automatically partition may be based on state space. The architect module based on the guidance, identifies regions of state space that correspond to separable, individually solvable subtasks and creates distinct policies for each so identified region of state space.

In step 12, the AI engine instantiates the AI objects corresponding to the concepts of the complex task into the graph of i) a first concept node corresponding to an integrator node and ii) one or more levels of concepts corresponding to the individual sub-tasks that hierarchically stem forth from the integrator node in the graph of the AI model. The AI engine initially trains each integrator and its set of child nodes feeding that integrator node in the graph of nodes. Note, each child node in the set feeding that integrator node is either 1) an individual AI object or 2) another integrator node that is trained to best satisfy its own reward function for its described individual sub task; and next. The training of integrator nodes and their child nodes use reward functions to best satisfy its described individual sub task continues up the graph of nodes until that process reaches a root integrator node, where a reward function for the root integrator node is focused for best satisfying the end solution to the complex task.

In step 14, the AI engine cooperates with one or more data sources to obtain data for training and to conduct the training of the two or more AI objects corresponding to concept nodes in the hierarchical graph, in parallel at the same time.

In step 16, the AI engine causes the AI engine to i) initially train each individual AI object to solve its individual sub-task and its corresponding one or more reward functions focused for solving that sub-task; and then, ii) next using an integrator node to train the set of individual sub-tasks in the complex task to combine the concepts of the individual sub-tasks to cooperate and work with each other to achieve the complex task. The integrator node then has a reward function focused for the end solution to the complex task.

In step 18, an integrator is configured to select a first set of concept nodes from two or more sets in the graph of the complex task to be trained on and computed.

In step 20, i) where the hinted at guidance in the scripted code from the user on how to automatically partition and ii) where the interpreted guidance from answered questions on how to automatically partition is based on state space, where an architect module based on the guidance identifies regions of state space that correspond to separable, individually solvable subtasks and creates distinct policies for each so identified region of state space.

In step 22, each integrator node in the graph of nodes is configured to evaluate in turn, based on data from the simulator, which of the nodes in the graph are currently appropriate to solving its sub task, and merely those nodes so chosen will be further provided with data from the simulator and evaluated, which saves an amount of computing power and cycles compared to computing all of the nodes making up the AI model each evaluation cycle.

In step 24, the AI engine trains the AI objects of the AI model include a blend of at least a first set and second set of AI objects being trained by the first module via reinforcement learning and a third set of AI objects that are configured to operate in two ways: 1) as control nodes where one or more actions are produced by the code this node and/or 2) this node just implements a data transformation step, where the first module of the AI engine is configured to manage multiple simulations from the data sources in parallel at the same time to train the first and second sets of AI objects with the reinforcement learning. Also, the first module of the AI engine is configured to manage multiple simulations from the data sources in parallel at the same time to train the first and second sets of AI objects with the reinforcement learning.

In step 26, the AI engine decomposing the complex task allows each concept making up the complex task in the graph to use a most appropriate training approach for that individual sub-task, whether that be a classical motion controller, a pre-existing learned model, or a neural network that needs to be trained rather than the whole AI model being trained with one of these training approaches.

In step 28, the AI engine uses a conductor service to handle scaling of running multiple training sessions for the two or more AI objects in parallel at the same time by dynamically calling in additional computing devices to load on and run additional instances of processes for the first module for each training session occurring in parallel.

In step 30, the AI engine decomposing the complex task allows replacing one or more concepts making up the complex task without retraining each concept in the graph making up that AI model.

In step 32, a combination of parallel training of concepts and the use of reward functions focused for solving each individual sub-task speeds up an overall training duration for the complex task on one or more computing platforms, and subsequent deployment of a resulting AI model that is trained, compared to an end-to-end training with a single algorithm for all of the AI objects incorporated into the AI model.

While the foregoing design and embodiments thereof have been provided in considerable detail, it is not the intention of the applicant(s) for the design and embodiments provided herein to be limiting. Additional adaptations and/or modifications are possible, and, in broader aspects, these adaptations and/or modifications are also encompassed. Accordingly, departures may be made from the foregoing design and embodiments without departing from the scope afforded by the following claims, which scope is only limited by the claims when appropriately construed.

What is claimed is:

1. An apparatus, comprising:
an Artificial Intelligence ("AI") engine that has multiple independent modules on one or more computing platforms, the multiple independent modules comprising an instructor module configured to cooperate with a learner module to train a plurality of AI objects, where the multiple independent modules are configured to have their instructions executed by one or more processors in the one or more computing platforms, where the AI engine has a user interface presented on a display screen for use by one or more users;
where the instructor module is configured to apply a hierarchical-decomposition reinforcement learning technique to train each AI object of the plurality of AI objects as concept nodes composed in a hierarchical graph incorporated into an AI model, where the instructor module uses the hierarchical-decomposition reinforcement learning technique to hierarchically decompose a complex task into multiple smaller, individual sub-tasks making up the complex task, where each of the individual sub-tasks corresponds to its own concept node in the hierarchical graph, and where the AI engine is configured to initially train the AI objects corresponding to the individual sub-tasks and then train the AI model on how the individual sub-tasks interact with each other in the complex task in order to deliver an end solution to the complex task;

where the user interface is configured to cooperate with the instructor module to send user input information for the instructor module, where the instructor module uses the user input information to automatically partition the individual sub-tasks into the concept nodes in the AI model and apply the hierarchical-decomposition reinforcement learning technique to train the plurality of AI objects;

where the learner module is configured to cooperate with one or more data sources to obtain data for training and to conduct the training of the AI objects corresponding to the individual sub-tasks in parallel at the same time; and wherein, via decomposing the complex task, the AI engine uses one or more reward functions that are specific to each individual sub-task and then one or more separate reward functions focused for the end solution of the complex task, which the parallel training and the use of reward functions focused for solving each individual sub-task speed up an overall training duration for the complex task on the one or more computing platforms, and resulting AI model, compared to an end-to-end training with a single algorithm for all of the AI objects incorporated into the AI model.

2. The apparatus of claim 1, further comprising:
an architect module is configured to instantiate the AI objects into the hierarchical graph, and wherein the hierarchical graph comprises i) a first concept node corresponding to an integrator node and ii) one or more levels of concept nodes corresponding to the individual sub-tasks that hierarchically stem forth from the integrator node in the hierarchical graph, where the integrator node is trained to choose which of its children nodes to use for solving its sub-task to achieve the end solution of the complex task.

3. The apparatus of claim 1, further comprising:
where the instructor module is further configured to cause the AI engine to i) initially train each integrator and a set of child nodes feeding that integrator node in the hierarchical graph, where each child node in the set feeding that integrator node is either 1) an individual AI object or 2) another integrator node that is trained to satisfy its own reward function for its described individual sub-task; and next, ii) where the training of integrator nodes and their child nodes using reward functions to satisfy its described individual sub-task continues up the hierarchical graph until that process reaches a root integrator node, where a reward function for the root integrator node is focused for satisfying the end solution to the complex task.

4. The apparatus of claim 2, further comprising:
where each concept making up the complex task in the hierarchical graph uses, for each individual sub-task, one or more of a classical motion controller, a pre-existing learned model, or a neural network.

5. The apparatus of claim 1, wherein
the instructor module is configured to automatically partition the individual sub-tasks into the concept nodes in the AI model in a number of ways, where the ways of partitioning the individual sub-tasks into the concept nodes are selected from a group consisting of i) how to partition the individual sub-tasks is explicitly defined in scripted code from the one or more users, ii) how to partition the individual sub-tasks is based on general guidance in the scripted code from the one or more users, iii) how to partition the individual sub-tasks is based on responses from the one or more users to a presented list of questions, iv) how to partition the individual sub-tasks includes using a clustering technique, and v) any combination of these four, and then the instructor module proposes a hierarchical structure for the hierarchical graph of AI objects making up the AI model.

6. The apparatus of claim 1, further comprising:
an integrator that is configured to select a first set of concept nodes from two or more sets in the hierarchical graph of the complex task to be trained on and computed.

7. The apparatus of claim 5, further comprising:
a) where the general guidance in the scripted code from the one or more users on how to automatically partition and b) where how to partition the individual sub-tasks based on the responses to the presented list of questions are based on state space, where the architect module identifies regions of the state space that correspond to separable, individually solvable sub-tasks and creates distinct policies for each identified region of the state space.

8. The apparatus of claim 6, further comprising:
a first data source comprising a simulator; and
where the integrator is configured to identify a lowest level of dependency in the first set of concept nodes in the hierarchical graph, and where the instructor module is configured to supply data from the first data source to the first set of concept nodes as well as to the integrator, and where the integrator determines that computations for all of the concept nodes merely in the first set of concept nodes occur, which saves an amount of computing power and cycles compared to computing all of the concept nodes making up the AI model each training cycle.

9. The apparatus of claim 1, further comprising:
where the AI objects of the AI model include a blend of at least a first set and second set of AI objects being trained by the instructor module via reinforcement learning and a third set of AI objects that are configured to operate 1) as one or more control nodes where one or more actions are produced by code of the one or more control nodes and/or 2) one or more nodes that transform input data from one form to another, where the instructor module is configured to manage multiple simulations from the one or more data sources in parallel at the same time to train the first and second sets of AI objects with the reinforcement learning.

10. The apparatus of claim 1, further comprising a conductor service configured to handle scaling of running multiple training sessions for two or more AI objects in parallel at the same time by dynamically calling in additional computing devices to load and run additional instances of processes for the instructor module for each training session occurring in parallel.

11. A method to apply Reinforcement Learning for an Artificial Intelligence (AI) model for subsequent deployment of that AI model, comprising:
applying a hierarchical-decomposition reinforcement learning technique to train each AI object of a plurality of AI objects as concept nodes composed in a hierarchical graph incorporated into the AI model,
using the hierarchical-decomposition reinforcement learning technique to hierarchically decompose a complex task into multiple smaller, individual sub-tasks making up the complex task, where each of the individual sub-tasks corresponds to its own concept node in the hierarchical graph, and initially train the AI objects corresponding to the individual sub-tasks and then train the AI model on how the individual sub-tasks interact with each other in the complex task in order to deliver an end solution to the complex task;

using information supplied from a user interface to automatically partition the individual sub-tasks into the concept nodes in the AI model and apply the hierarchical-decomposition reinforcement learning technique to train the plurality of AI objects;

cooperating with one or more data sources to obtain data for training and to conduct the training of the AI objects corresponding to the individual sub-tasks in parallel at the same time; and using one or more reward functions that are specific to each individual sub-task and then one or more separate reward functions focused for the end solution of the complex task, where a combined parallel training and the use of reward functions focused for solving each individual sub-task speed up an overall training duration for the complex task on one or more computing platforms, and subsequent deployment of the trained AI model, compared to an end-to-end training with a single algorithm for all of the AI objects incorporated into the AI model.

12. The method of claim 11, further comprising:
instantiating the AI objects into the hierarchical graph, and wherein the hierarchical graph comprises i) a first concept node corresponding to an integrator node and ii) one or more levels of concept nodes corresponding to the individual sub-tasks that hierarchically stem forth from the integrator node in the hierarchical graph, where the integrator node is trained to choose which of its children nodes to use for solving its sub-task to achieve the end solution of the complex task.

13. The method of claim 11, further comprising:
i) initially training each integrator and a set of child nodes feeding that integrator node in the hierarchical graph, where each child node in the set feeding that integrator node is either 1) an individual AI object or 2) another integrator node that is trained to satisfy its own reward function for its described individual sub-task; and next, ii) continuing the training of integrator nodes and their child nodes using reward functions to satisfy its described individual sub-task up the hierarchical graph until that process reaches a root integrator node, where a reward function for the root integrator node is focused for satisfying the end solution to the complex task.

14. The method of claim 12,
where decomposing the complex task allows replacing one or more concepts making up the complex task without retraining each concept in the hierarchical graph.

15. The method of claim 11, wherein
using information supplied from a user interface to automatically partition the individual sub-tasks into the concept nodes in the AI model comprises automatically partitioning the individual sub-tasks into the concept nodes in the AI model in a number of ways, where the ways of partitioning the individual sub-tasks into the concept nodes are selected from a group consisting of i) how to partition the individual sub-tasks is explicitly defined in scripted code from the one or more users, ii) how to partition the individual sub-tasks is based on general guidance in the scripted code from the one or more users, iii) how to partition the individual sub-tasks is based on responses from the one or more users to a presented list of questions, and iv) any combination of these three, and then proposing a hierarchical structure for the hierarchical graph of AI objects making up the AI model.

16. The method of claim 11, further comprising:
where an integrator is configured to select a first set of concept nodes from two or more sets in the hierarchical graph of the complex task to be trained on and computed.

17. The method of claim 15, further comprising:
a) where the general guidance in the scripted code from the one or more users on how to automatically partition and b) where how to partition the individual sub-tasks based on the responses to the presented list of questions are based on state space, where an architect module identifies regions of the state space that correspond to separable, individually solvable sub-tasks and creates distinct policies for each identified region of the state space.

18. The method of claim 16, further comprising:
where a first data source is a simulator, where each integrator node in the hierarchical graph is configured to choose in turn, based on data from the simulator, a subset of the concept nodes in the hierarchical graph for solving its sub-task, and merely those concept nodes so chosen will be further provided with data from the simulator and evaluated, which saves an amount of computing power and cycles compared to computing all of the concept nodes making up the AI model each evaluation cycle.

19. The method of claim 11, further comprising:
where the AI objects of the AI model include a blend of at least a first set and second set of AI objects being trained by an instructor module via reinforcement learning and a third set of AI objects that are configured to operate 1) as one or more control nodes where one or more actions are produced by code of the one or more control nodes and/or 2) one or more nodes that transform input data from one form to another, where the instructor module is configured to manage multiple simulations from the one or more data sources in parallel at the same time to train the first and second sets of AI objects with the reinforcement learning.

20. A computing device, comprising:
two or more modules configured to cooperate with each other in order to apply a hierarchical-decomposition reinforcement learning technique to train each AI object of a plurality of AI objects as concept nodes composed into a hierarchical graph incorporated into an AI model, where each individual sub-task of a decomposed complex task corresponds to its own concept node in the hierarchical graph, where each individual sub-task is initially trained on how to complete its individual sub-task and then an integrator node is trained to choose which of its children nodes to use for solving its individual sub-task at that moment, to deliver an end solution to the complex task, where during training of the individual sub-tasks of the decomposed complex task the AI engine is configured to use i) one or more reward functions that are specific to each individual sub-task and then ii) a separate one or more reward functions that are specific to the end solution of the complex, where the AI engine is configured to conduct the training of a first individual sub-task of the decomposed complex task in parallel at the same time with the training of a second individual sub-task of the decomposed complex; and a user interface configured to supply user input information that is used to automatically partition the individual sub-tasks into the concept nodes in the AI model and apply the hierarchical-decomposition reinforcement learning technique to train the plurality of AI objects.

* * * * *